(12) United States Patent  
Ando

(10) Patent No.: US 8,263,322 B2
(45) Date of Patent: Sep. 11, 2012

(54) METHOD OF FORMING RESIST PATTERN

(75) Inventor: Tomoyuki Ando, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 261 days.

(21) Appl. No.: 12/569,040

(22) Filed: Sep. 29, 2009

(65) Prior Publication Data

US 2010/0167217 A1 Jul. 1, 2010

(30) Foreign Application Priority Data

Oct. 1, 2008 (JP) ................................ P2008-256295

(51) Int. Cl.
G03F 7/26 (2006.01)

(52) U.S. Cl. .................... 430/324; 430/394; 430/330

(58) Field of Classification Search .................. 430/312, 430/394, 311, 322
See application file for complete search history.

(56) References Cited

U.S. PATENT DOCUMENTS

| | | | |
|---|---|---|---|
| 5,945,517 A | 8/1999 | Nitta et al. | |
| 6,074,801 A | 6/2000 | Iwasa et al. | |
| 6,153,733 A | 11/2000 | Yukawa et al. | |
| 7,074,543 B2 | 7/2006 | Iwai et al. | |
| 7,323,287 B2 | 1/2008 | Iwai et al. | |
| 2003/0129543 A1* | 7/2003 | Hwang et al. | 430/311 |
| 2007/0066775 A1 | 3/2007 | Rhodes et al. | |
| 2007/0224520 A1 | 9/2007 | Ogata et al. | |
| 2008/0153300 A1 | 6/2008 | Bok | |
| 2009/0130590 A1* | 5/2009 | Chen et al. | 430/270.1 |
| 2009/0305163 A1 | 12/2009 | Iwashita et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |

(Continued)

OTHER PUBLICATIONS

Ebihara et al., Beyond $k_1=0.25$ lithography : 70nm L/S patterning using KrF scanners, Proceedings of SPIE, vol. 5256, 23rd Annual BACUS Symposium on Photomask Technology, pp. 985 to 994, (2003).

Gil et al., "First Microprocessors with Immersion Lithography," Optical Microlithography XVIII, Proceedings of SPIE (U.S.), vol. 5754, pp. 119-128 (2005).

(Continued)

*Primary Examiner* — Kathleen Duda
*Assistant Examiner* — Caleen Sullivan
(74) *Attorney, Agent, or Firm* — Knobbe Martens Olson & Bear LLP

(57) ABSTRACT

A method of forming a resist pattern that includes: applying a positive chemically amplified resist composition to a support to form a first resist film, exposing a region on a portion of the first resist film, performing a post exposure bake treatment and then performing developing to form a first resist pattern, and applying a negative chemically amplified resist composition to the support having the first resist pattern formed thereon, thereby forming a second resist film, exposing a region of the second resist film that includes the positions in which the first resist pattern has been formed, performing a post exposure bake treatment at a bake temperature that increases the solubility of the first resist film in an alkali developing solution and decreases the solubility of the second resist film in an alkali developing solution, and then performing developing to form a resist pattern.

4 Claims, 5 Drawing Sheets

FOREIGN PATENT DOCUMENTS

| | | |
|---|---|---|
| JP | 2003-241385 | 8/2003 |
| JP | 2005-325325 | 11/2005 |
| JP | 2006-145788 | 6/2006 |
| JP | 2006-163066 | 6/2006 |
| JP | 2006-165328 | 6/2006 |
| JP | 2006-259582 | 9/2006 |
| WO | WO 2004/074242 | 9/2004 |
| WO | WO 2004/076495 | 9/2004 |
| WO | WO 2006/054432 | 5/2006 |
| WO | WO 2006/061975 | 6/2006 |

OTHER PUBLICATIONS

Borodovsky, Yan, "Marching to the beat of Moore's Law," Proceedings of SPIE, vol. 6153, pp. 615301-1 to 615301-19, (2006).

International Search Report issued in International Application No. PCT/JP2007/070442 dated Nov. 20, 2007.

Office Action issued for U.S. Appl. No. 12/438,906, mailed Jan. 5, 2012.

* cited by examiner

METHOD OF FORMING RESIST PATTERN

CROSS-REFERENCE TO RELATED APPLICATION

Priority is claimed on Japanese Patent Application No. 2008-256295, filed Oct. 1, 2008, the content of which is incorporated herein by reference.

BACKGROUND OF THE INVENTION

1. Field of the Invention

The present invention relates to a method of forming a resist pattern using a chemically amplified resist composition, and relates specifically to a method of forming a resist pattern that utilizes a double patterning process in which a first patterning is performed using a first chemically amplified resist composition, and a second chemically amplified resist composition is then applied and subjected to a second patterning.

2. Description of the Related Art

Techniques (pattern-forming techniques) in which a fine pattern is formed on top of a substrate and a lower layer beneath that pattern is then processed by conducting etching with this pattern as a mask are widely used in the semiconductor industry for IC fabrication and the like, and are attracting considerable attention.

These fine patterns are typically formed from an organic material, and are formed, for example, using a lithography method or a nanoimprint method or the like. For example, in a lithography method, a resist film composed of a resist material that exhibits changed solubility in a developing solution upon exposure is formed on a support such as a substrate, and the resist film is subjected to selective exposure of radial rays such as light or an electron beam, followed by development, thereby forming a resist pattern having a predetermined shape on the resist film. Then, using this resist pattern as a mask, a semiconductor element or the like is produced by conducting a step in which the substrate is processed by etching.

A resist material in which the exposed portions develop increased solubility in the developing solution is called a positive-type, and a resist material in which the exposed portions exhibit reduced solubility in the developing solution is called a negative-type.

In recent years, advances in lithography techniques have lead to rapid progress in the field of pattern miniaturization. Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production, and pattern formation at 45 nm level resolution is now possible with lithography using an ArF excimer laser. Moreover, in order to achieve further improvements in resolution, research is also being conducted into lithography techniques that use exposure light source having a wavelength shorter than these excimer lasers, such as $F_2$ excimer lasers, electron beams, extreme ultraviolet radiation (EUV), and X rays.

Resist materials require lithography properties that include a high resolution capable of reproducing patterns of minute dimensions, and a high level of sensitivity to these types of exposure light sources. A chemically amplified resist composition that includes an acid generator that generates acid upon exposure can be used as a resist material that satisfies these conditions. In addition to the above acid generator, a chemically amplified resist composition usually includes a base component that exhibits changed solubility in an alkali developing solution under the action of the acid generated from the acid generator, and for example, the base component in a positive chemically amplified resist uses a component that exhibits increased solubility in an alkali developing solution under the action of acid (for example, see Patent Document 1). Further, a resin is normally used as the base component of a chemically amplified resist composition.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a liquid (an immersion medium) that has a larger refractive index than the refractive index of air (for example, see Non-Patent Document 1).

With this type of immersion exposure, it is considered that higher resolutions equivalent to those obtained using a shorter wavelength light source or a higher NA lens can be achieved using the same exposure light source wavelength, with no reduction in the depth of focus. Furthermore, immersion exposure can be conducted using existing exposure apparatus. As a result, it is expected that immersion exposure will enable the formation of resist patterns of higher resolution and superior depth of focus at lower costs. Accordingly, in the production of semiconductor elements, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is capable of being used in combination with currently studied super-resolution techniques, such as phase shift methods and modified illumination methods. Currently, techniques using an ArF excimer laser as the exposure source are the most actively studied immersion exposure techniques. Further, water is mainly being investigated as the immersion medium.

Recently, a new lithography technique called a double patterning process has been proposed, in which a resist pattern is formed by conducting patterning two or more times (for example, see Non-Patent Documents 2 and 3).

There are a number of varieties of double patterning processes, and examples include (1) a method in which a lithography step (from application of a resist composition through to exposure and developing) and an etching step are performed two or more times to form a pattern, and (2) a method in which the lithography step is repeated twice or more in succession.

Pattern formation using method (1) is executed, for example, using the sequence described below. First, a laminate is prepared by laminating a substrate, an underlayer film and a hard mask. Next, a resist film is provided on top of the hard mask, and the resist film is selectively exposed through a photomask and developed, thus forming a first resist pattern in which a plurality of resist patterns of predetermined size are positioned at predetermined locations. Subsequently, the hard mask is etched using the first resist pattern as a mask, and the remaining first resist pattern is then removed. This yields a hard mask to which the first resist pattern has been transferred. Next, a resist composition is applied to the hard mask, forming a resist film that fills the gaps within the hard mask. This resist film is then selectively exposed through a photomask having different pattern positioning and developed, thus forming a second resist pattern. Subsequently, the hard mask is etched using the second resist pattern as a mask, and the remaining second resist pattern is then removed. This yields a hard mask to which both the first resist pattern and the second resist pattern have been transferred. By subsequently conducting etching using this hard mask as a mask, the pattern in the hard mask can be transferred to the underlayer film, and as a result, a pattern is formed having a narrower pitch than the photomask that was used.

In the method (2), for example, a first resist film is formed on top of a support, a plurality of resist patterns are formed by patterning the resist film, a second resist material is then applied, thereby forming a second resist film that fills the gaps within the above plurality of resist patterns, and the second resist film is then subjected to patterning.

By using these double patterning processes, a resist pattern can be formed that has a higher resolution than a resist pattern formed using only a single lithography step (single patterning), even when a light source having the same exposure wavelength is used, and even when the same resist composition is used. Further, a double patterning process can be performed using an existing exposure apparatus.

[Patent Document 1]
Japanese Unexamined Patent Application, First Publication No. 2003-241385
[Non-Patent Document 1]
Proceedings of SPIE, vol. 5754, pp. 119 to 128 (2005)
[Non-Patent Document 2]
Proceedings of SPIE, vol. 5256, pp. 985 to 994 (2003)
[Non-Patent Document 3]
Proceedings of SPIE, vol. 6153, pp. 615301-1 to 19 (2006)

In those cases where a chemically amplified resist composition is used to form an isolated space pattern (trench pattern) or a hole pattern, and particularly in the case where a positive composition is used, the pattern formation is constrained to formation using a weaker incident light intensity than that used when an isolated line pattern, a line and space pattern or a dot pattern is formed, and therefore the contrast between the light intensities irradiated onto the exposed portions and the unexposed portions is small. As a result, restrictions tend to exist on the pattern formability during the resist pattern formation, including the resolution and the lithography margins (for example, the allowable margins for the exposure dose and the depth of focus (the EL margin and DOF margin respectively), and the degree of verticalness of the pattern shape), meaning it tends to be very difficult to form a resist pattern having high resolution.

One possible technique for forming a high-resolution resist pattern involves using the type of double patterning process described above. However, of the double patterning processes described above, the method (1) requires that resist film patterning is performed at least twice and etching of the underlying hard mask is performed at least twice in order to form a pattern on the substrate, which is problematic in terms of the increased number of steps, the increased amounts of reagents that must be used, and the associated increase in production costs. Further, the method (2) is suited to formation of a line and space pattern, but is unsuited to the formation of an isolated space pattern (trench pattern) or a hole pattern.

Accordingly, a novel technique that enables an isolated space pattern or a hole pattern to be formed at a high resolution has been keenly sought.

SUMMARY OF THE INVENTION

The present invention has been developed in light of the above circumstances, and has an object of providing a method of forming a resist pattern that is capable of forming an isolated space pattern or hole pattern at a high level of resolution.

A method of forming a resist pattern of the present invention that realizes the above object, includes: applying a positive chemically amplified resist composition to a support to form a first resist film, exposing a region on a portion of the first resist film, performing a post exposure bake treatment, and then performing developing to form a first resist pattern, and applying a negative chemically amplified resist composition to the support having the first resist pattern formed thereon, thereby forming a second resist film, exposing a region of the second resist film that includes the positions in which the first resist pattern has been formed, performing a post exposure bake treatment at a bake temperature that increases the solubility of the first resist film in an alkali developing solution and decreases the solubility of the second resist film in an alkali developing solution, and then performing developing to form a resist pattern.

In this description and within the scope of the appended claims, the term "exposure" is a general concept that includes irradiation with any form of radiation.

A "structural unit" describes a monomer unit that contributes to the formation of a resin component (namely, a polymer or copolymer).

The term "alkyl group" includes linear, branched and cyclic, monovalent saturated hydrocarbon groups, unless otherwise specified.

The term "alkylene group" includes linear, branched and cyclic divalent saturated hydrocarbon groups, unless otherwise specified.

A "halogenated alkyl group" describes a group in which some or all of the hydrogen atoms of an alkyl group have been substituted with halogen atoms, wherein examples of the halogen atom include a fluorine atom, chlorine atom, bromine atom or iodine atom.

The term "aliphatic" is a relative concept used in relation to the term "aromatic", and defines a group or compound or the like that has no aromaticity.

According to the method of forming a resist pattern of the present invention, an isolated space pattern or hole pattern can be formed at a high resolution.

DETAILED DESCRIPTION OF THE PREFERRED EMBODIMENTS

<<Method of Forming a Resist Pattern>>

Figure 1A:
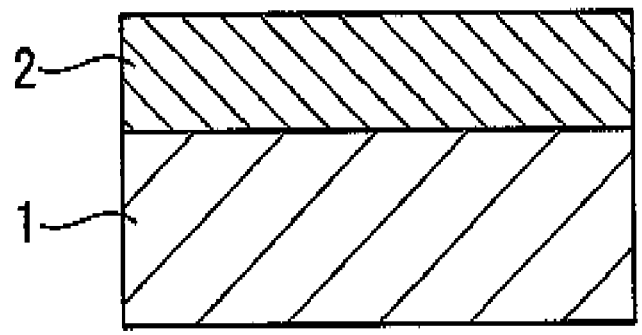
FIG. 1A through FIG. 1C are schematic process diagrams describing a preferred embodiment of a first patterning step in a method of forming a resist pattern according to the present invention.

A method of forming a resist pattern according to the present invention includes: applying a positive chemically amplified resist composition to a support to form a first resist film, exposing a region on a portion of the first resist film, performing a post exposure bake treatment, and then performing developing to form a first resist pattern (hereafter, this series of operations is frequently referred to as "the first patterning step"), and applying a negative chemically amplified resist composition to the support having the first resist pattern formed thereon, thereby forming a second resist film, exposing a region of the second resist film that includes the positions in which the first resist pattern has been formed, performing a post exposure bake treatment at a bake temperature that increases the solubility of the first resist film in an alkali developing solution and decreases the solubility of the second resist film in an alkali developing solution, and then performing developing to form a resist pattern (hereafter, this series of operations is frequently referred to as "the second patterning step").

In the method of forming a resist pattern according to the present invention, a chemically amplified resist composition is used in each of the first patterning step and the second patterning step.

A chemically amplified resist composition includes an acid generator component that generates acid upon exposure as an essential component, and when acid is generated from this acid generator component by exposure, the action of the acid causes a change in the solubility within an alkali developing solution of the entire chemically amplified resist composition. For example, in the case of a positive chemically amplified resist composition, the composition generally contains a compound having an acid-dissociable, dissolution-inhibiting group (for example, the component (A) described below), and when acid is generated from the acid generator component upon exposure, the action of that acid causes the acid-dissociable, dissolution-inhibiting group to dissociate from the compound.

This acid-dissociable, dissolution-inhibiting group is a group that has an alkali dissolution inhibiting effect that renders the entire compound substantially insoluble in an alkali developing solution prior to exposure, but then dissociates under the action of the acid generated from the acid generator component, and the dissociation of this acid-dissociable, dissolution-inhibiting group causes an increase in the solubility of the compound within an alkali developing solution. Further, in the case of a negative chemically amplified resist composition, the composition generally contains a resin that is soluble in an alkali developing solution (an alkali-soluble resin) and a cross-linker, and when acid is generated from the acid generator component by exposure, the action of the acid causes a reaction between the alkali-soluble resin and the cross-linker, resulting in a decrease in the solubility of the alkali-soluble resin within an alkali developing solution.

Accordingly, by conducting selective exposure of a resist film formed using a chemically amplified resist composition, the action of the acid generated from the acid generator component causes a change in the solubility within an alkali developing solution of the exposed portions of the resist film, whereas the unexposed portions undergo no change in solubility within an alkali developing solution, and as a result, alkali developing can then be used to dissolve and remove either the exposed portions in the case of a positive composition, or the unexposed portions in the case of a negative composition, thereby forming a resist pattern.

In the present invention, the chemically amplified resist composition used in the first patterning step (hereafter frequently referred to as "the first chemically amplified resist composition") is a positive composition, whereas the chemically amplified resist composition used in the second patterning step (hereafter frequently referred to as "the second chemically amplified resist composition") is a negative composition.

Embodiments of the method of forming a resist pattern according to the present invention are described below with reference to the drawings. However, the present invention is in no way limited by the embodiments described below.

Figure 1B:
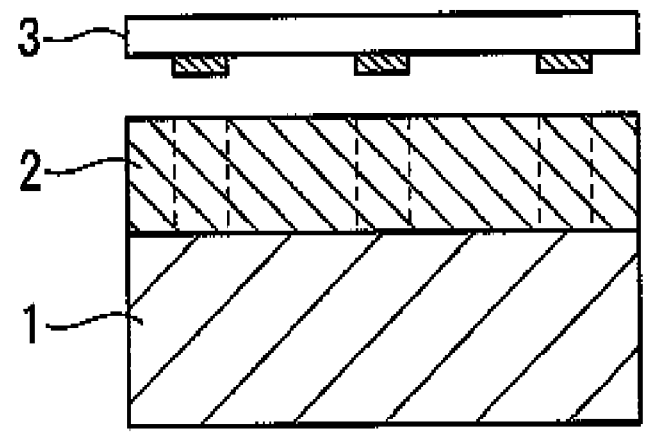
Figure 1C:
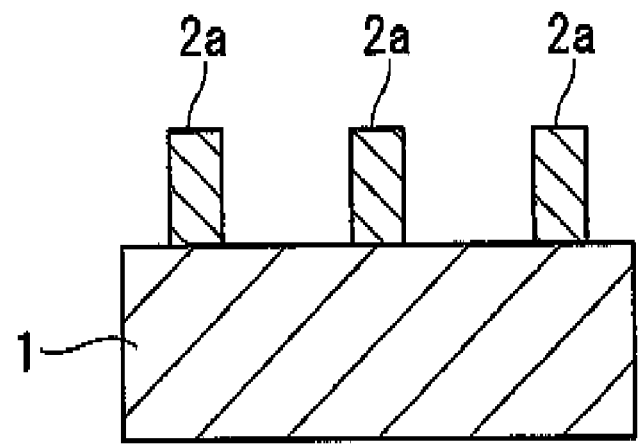

In a first embodiment of the present invention, first, a first patterning step is conducted using the procedure illustrated in FIG. 1.

In this first patterning step, first, as shown in FIG. 1A, a positive chemically amplified resist composition is applied to a support 1 as the first chemically amplified resist composition, thus forming a first resist film 2.

Next, as illustrated in FIG. 1B, the first resist film 2 is selectively exposed through a photomask 3 having a predetermined pattern formed thereon, and a post exposure bake (PEB) treatment is then conducted. This causes an increase in the alkali solubility of the exposed portions of the first resist film 2, and therefore by performing developing with an alkali developing solution, the exposed portions of the first resist film 2 are removed while the unexposed portions remain, and as a result, a first resist pattern 2a formed from a plurality of line patterns and/or dot patterns is formed on the support 1.

Thereafter, using a negative chemically amplified resist composition as the second chemically amplified resist composition, the second patterning step is conducted using the procedure illustrated in FIG. 2.

Figure 2A:
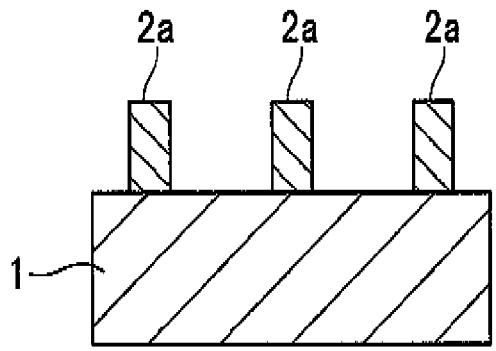
FIG. 2A through FIG. 2D are schematic process diagrams describing a preferred embodiment of a second patterning step in a method of forming a resist pattern according to the present invention.
Figure 2B:
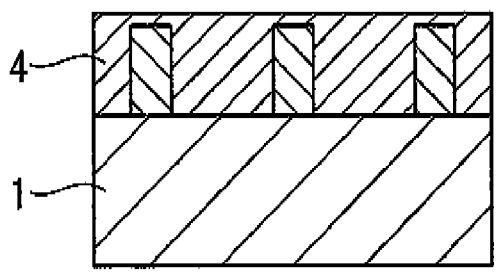

In the second patterning step, first, the chemically amplified negative resist composition is coated onto the support 1 having the first resist pattern 2a from the first patterning step formed thereon (FIG. 2A), thereby forming a second resist film 4 that fills the gaps between the lines (or dots) of the first resist pattern 2a, as illustrated in FIG. 2B.

Figure 2C:
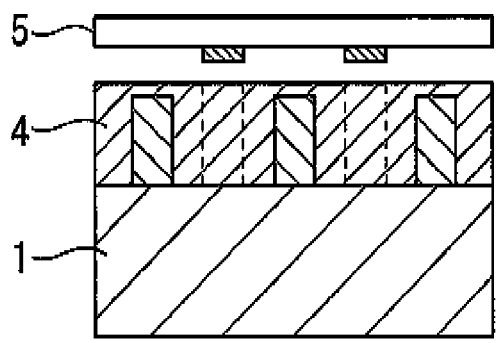

Subsequently, as illustrated in FIG. 2C, the second resist film 4 is selectively exposed through a photomask 5 having a predetermined pattern (a line pattern and/or a dot pattern) formed therein, and is then subjected to a PEB treatment.

Figure 2D:
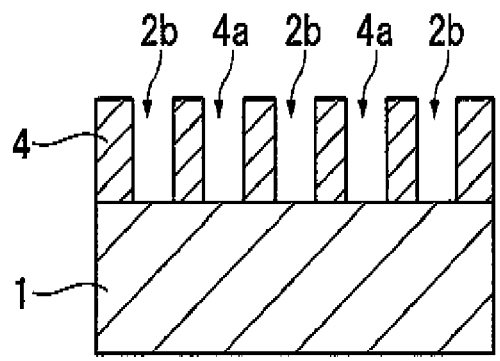

Following the PEB treatment, by performing developing using an alkali developing solution, only the unexposed portions of the second resist film 4 are removed, thereby forming a plurality of space patterns and/or hole patterns 4a in the second resist film 4, as illustrated in FIG. 2D. At the same time, the resist pattern 2a within the region corresponding with the exposed portions of the second resist film 4 is also removed, meaning a pattern that represents an inverted image of the first resist pattern 2a (namely, an inverse pattern 2b) is formed in positions corresponding with the first resist pattern 2a.

A resist pattern formed in this manner is a dense pattern having a narrower pitch than the resist pattern formed by the first patterning step.

The first patterning step and second patterning step within the first embodiment described above are described below in further detail.

[First Patterning Step]

There are no particular limitations on the support, and a conventionally known support can be used. Examples of the support include substrates used for electronic components, and such substrates having wiring patterns formed thereon.

Specific examples include metal substrates such as silicon wafer, copper, chromium, iron and aluminum, as well as glass substrates. Materials that may be used for the wiring pattern include copper, aluminum, nickel and gold.

Further, any one of the above-exemplified substrates with an inorganic and/or organic film provided on the surface thereof may also be used as the support. Examples of the inorganic film include inorganic antireflective films (inorganic BARC), whereas examples of the organic film include organic antireflective films (organic BARC) and the lower layer films from multilayer resist methods. If an organic film is provided, then a pattern having a high aspect ratio can be formed on the substrate, which is particularly desirable in the production of semiconductors.

Here, a "multilayer resist method" describes a method in which at least one organic film (the lower layer film) and at least one resist film are provided on top of a substrate, and a resist pattern formed in the upper layer resist film is then used as a mask for conducting patterning of the lower layer, and is regarded as a method that is capable of forming patterns having a high aspect ratio. Multilayer resist methods can be basically classified as either methods that yield a two-layer structure composed of an upper layer resist film and a lower layer film, or methods that yield a multilayer structure of three or more layers in which one or more intermediate layers (such as thin metal films) are provided between the resist film and the lower layer film. According to a multilayer resist method, by using the lower layer film to ensure the desired level of thickness, the resist film can be formed as a very thin film, enabling the formation of a very fine pattern having a high aspect ratio.

An inorganic film can be formed, for example, by applying an inorganic antireflective film composition such as a silicon-based material to the substrate, and then performing baking or the like.

An organic film can be formed, for example, by using a spinner or the like to apply an organic film-forming material, prepared by dissolving a resin component or the like that forms the organic film in an organic solvent, to the surface of the substrate, and then conducting a bake treatment under conditions that include heating at a temperature that is preferably within a range from 200 to 300° C., for a period that is preferably within a range from 30 to 300 seconds, and more preferably from 60 to 180 seconds.

The positive chemically amplified resist composition (hereafter also referred to as simply "the positive resist composition") used as the first chemically amplified resist composition may be selected appropriately from known compositions. Details regarding specific examples of the positive resist composition and the method of selecting the composition are described below.

There are no particular restrictions on the method used for applying the positive resist composition to the support 1 to form the first resist film 2, and conventional methods may be used.

Specifically, the first resist film 2 can be formed, for example, by using a conventional method such as a spinner or the like to apply the positive resist composition to the surface of the support 1, and then conducting a bake treatment (a prebake) under temperature conditions within a range from 80 to 150° C., for a period of 40 to 120 seconds and preferably for 60 to 90 seconds, to volatilize the organic solvent.

The thickness of the first resist film 2 is preferably within a range from 50 to 500 nm, and is more preferably from 50 to 450 nm. Ensuring a thickness within this range yields favorable effects, such as enabling the formation of a resist pattern at a high resolution, and ensuring that a satisfactory level of resistance to etching is obtained.

Subsequently, the first resist film 2 formed in the manner described above is selectively exposed through the photomask 3, subjected to a PEB treatment, and then developed to form the plurality of resist patterns 2a.

There are no particular restrictions on the wavelength used for the exposure, and radiation from a KrF excimer laser, ArF excimer laser, $F_2$ excimer laser, EUV (extreme ultra violet), VUV (vacuum ultra violet), EB (electron beam), X-ray or soft X-ray can be used.

As the photomask, a binary mask in which the transmittance of the shielded portions is 0%, or a halftone phase shift mask (HT-mask) in which the transmittance of the shielded portions is 6% or the like may be used.

The binary mask generally employs a quartz glass substrate with a chromium film or chromium oxide film or the like formed thereon as the light-shielding portions.

The halftone phase shift mask generally employs a quartz glass substrate with a MoSi (molybdenum silicide) film, chromium film, chromium oxide film or silicon oxynitride film or the like formed thereon as the light-shielding portions.

In the present embodiment, exposure is conducted through the photomask 3, but the present invention is not limited to this configuration, and exposure without using a photomask, such as direct patterning using an EB or the like, may also be used to effect the selective exposure.

The selective exposure of the first resist film 2 may be conducted either using a normal exposure process (dry exposure), which is performed within air or an inert gas such as nitrogen, or using immersion exposure.

As described above, in immersion exposure, the exposure is conducted in a state where the region between the lens and the resist film formed on the wafer, which is conventionally filled with air or an inert gas such as nitrogen, is filled with a solvent (a liquid immersion medium) having a larger refractive index than the refractive index of air.

More specifically, immersion exposure can be performed by filling the region between the resist film obtained in the manner described above and the lens at the lowermost point of the exposure apparatus with a solvent (the immersion medium) that has a larger refractive index than the refractive index of air, and then conducting exposure (immersion exposure) through a desired mask pattern in this state.

The immersion medium is preferably a solvent that has a refractive index that is larger than the refractive index of air but smaller than the refractive index of the resist film undergoing exposure in the immersion exposure process (namely, the first resist film 2 in the first patterning step). The refractive index of the solvent is not particularly limited provided it satisfies this range.

Examples of this solvent that has a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids that contain a fluorine-based compound such as $C_3HCl_2F_5$, $C_4F_9OCH_3$, $C_4F_9OC_2H_5$ or $C_5H_3F_7$ as the main component, and have a boiling point that is preferably within a range from 70 to 180° C. and more preferably from 80 to 160° C. A fluorine-based inert liquid having a boiling point within the above-mentioned range is advantageous in that the removal of the medium after the immersion exposure can be conducted by a simple method.

As the fluorine-based inert liquid, a perfluoroalkyl compound in which all of the hydrogen atoms of an alkyl group are substituted with fluorine atoms is particularly desirable. Examples of these perfluoroalkyl compounds include perfluoroalkylether compounds and perfluoroalkylamine compounds.

Specifically, one example of a perfluoroalkylether compound is perfluoro(2-butyl-tetrahydrofuran) (boiling point: 102° C.), whereas an example of a perfluoroalkylamine compound is perfluorotributylamine (boiling point: 174° C.).

Following exposure, a post exposure bake (PEB) treatment is performed on the first resist film 2.

In the present invention, the first chemically amplified resist composition is a positive composition. Accordingly, the post exposure bake (PEB) treatment during the first patterning step is conducted at a bake temperature that increases the solubility of the exposed portions of the first resist film 2 in an alkali developing solution.

In other words, after exposure, performing the PEB treatment of the first resist film 2 formed from the positive chemically amplified resist composition causes the acid generated from the acid generator component to diffuse through the resist film 2, and also causes an increase in the solubility of the resist film within an alkali developing solution as a result of the action of the acid. At this time, unless the bake temperature during the PEB treatment (namely, the PEB temperature) is sufficient, the generation and diffusion of the acid do not proceed satisfactorily, and the solubility of the exposed portions within an alkali developing solution does not increase sufficiently, meaning the difference in the dissolution rates within an alkali developing solution between the exposed portions and the unexposed portions (namely, the solubility contrast) is small, and therefore even if developing is conducted, a favorable resist pattern cannot be formed. In other words, when conducting exposure, PEB treatment and developing of the first resist film 2 in order to achieve patterning of the resist film 2, it is necessary to ensure that the PEB treatment is conducted at a PEB temperature that causes the exposed portions of the resist film 2 to develop a level of solubility within an alkali developing solution that is sufficient to enable dissolution and removal of those exposed portions within the developing solution. Hereafter, this PEB temperature is referred to as the "effective PEB temperature" for that particular resist composition.

Accordingly, in order to enable patterning of the first resist film 2 in the first patterning step, the PEB treatment is performed at a bake temperature that increases the solubility of the first resist film 2 in an alkali developing solution, namely, at a temperature that is not less than the minimum value for the effective PEB temperature for the first resist film. In other words, if the minimum value for the effective PEB temperature for the first resist film is termed $T_{min1}$, and the PEB temperature for the first patterning step is termed $T_{peb1}$, then in order to enable formation of the first resist pattern during the first patterning step, the relationship $T_{min1} \leq T_{peb1}$ must be satisfied.

A determination as to whether or not the bake temperature used in the PEB treatment of the first patterning step is a bake temperature capable of increasing the solubility of the first resist film 2 in an alkali developing solution (that is, whether or not the PEB temperature is an effective PEB temperature) can be made in the manner described below.

The first resist film 2 is exposed with various exposure doses, using the exposure source (such as an ArF excimer laser, EB or EUV or the like) used for the first patterning step, the PEB treatment is conducted at a predetermined bake temperature for a period of 30 to 120 seconds, and developing is then performed using a 2.38% by weight aqueous solution of tetramethylammonium hydroxide (23° C.) as the developing solution.

In those cases where, as the exposure dose is increased, the dissolution rate of the exposed portions of the first resist film 2 in the developing solution reaches a level of 1 nm/second or higher once the exposure dose has reached or exceeded a predetermined value, the bake temperature used is deemed to be a bake temperature capable of increasing the solubility of the first resist film 2 in the alkali developing solution.

On the other hand, in those cases where, even when the exposure dose is increased, the dissolution rate of the exposed portions of the first resist film 2 in the developing solution does not reach a level of 1 nm/second or higher, but rather becomes saturated at a lower dissolution rate, the bake temperature used is deemed to be a bake temperature that does not increase the solubility of the first resist film 2 in the alkali developing solution.

As described above, the PEB temperature for the first patterning step ($T_{peb1}$) may be any bake temperature that increases the solubility of the first resist film 2 in an alkali developing solution, and is typically set with due consideration of factors such as the value of $T_{min1}$ and the PEB temperature for the second patterning step.

$T_{peb1}$ varies depending on the composition of the positive resist composition being used, but is typically within a range from 70 to 150° C., preferably from 80 to 140° C., more preferably from 85 to 135° C., and most preferably from 95 to 130° C.

The bake time at this PEB temperature is typically within a range from 40 to 120 seconds, and preferably from 60 to 90 seconds.

Following the PEB treatment, the first resist film 2 is developed. Developing can be conducted by a conventional method, using an alkali developing solution such as an aqueous solution of tetramethylammonium hydroxide (TMAH) with a concentration of 0.1 to 10% by weight. As a result of the alkali developing, the exposed portions of the first resist film 2 are removed, forming the resist pattern 2a.

Following the above alkali developing treatment, a rinse treatment may be conducted using water or the like.

Further, an additional bake treatment (a post bake) may be conducted following the above alkali developing. A post bake (which is conducted to remove any residual moisture following the alkali developing and rinse treatments) is typically conducted at 100° C., and the treatment time is preferably within a range from 30 to 90 seconds.

[Second Patterning Step]

Subsequently, a negative chemically amplified resist composition (hereafter also referred to as simply "the negative resist composition") used as the second chemically amplified resist composition is applied to the support 1 having the resist pattern 2a formed thereon, thereby forming the second resist film 4 that fills the gaps between sections of the resist pattern 2a.

The negative resist composition may be selected appropriately from known compositions.

In the present invention, the negative resist composition preferably includes, as an organic solvent, an organic solvent that does not dissolve the first resist film. This means that when the negative resist composition is applied, dissolution of the first resist pattern or mixing at the interfaces between the first resist pattern and the second resist film can be suppressed, thus further improving the effects of the present invention.

A more detailed description of the negative resist composition is presented below.

In a similar manner to the first resist film 2, the second resist film 4 can be formed by conventional methods.

The film thickness of the second resist film 4 is preferably at least the same as, or greater than, the height of the resist pattern 2a. In other words, when viewed from the side of the second resist film 4, the surface on top of the support 1 preferably appears smooth.

Next, the second resist film 4 formed in the above manner is selectively exposed through the photomask 5.

As described above, the selective exposure of the second resist film 4 is performed so that positions in which the resist pattern 2a has been formed are included within the exposed portions, whereas some of the space portions between the sections of the resist pattern 2a are positioned within the unexposed portions. As a result, those sections of the resist pattern 2a positioned within the exposed portions are irradiated, and when a PEB treatment is conducted following the exposure, the solubility within an alkali developing solution of those sections of the resist pattern 2a increases, meaning subsequent alkali developing removes those sections, making it possible to form an inverse pattern 2b.

The exposure of the second resist film 4 can be conducted, for example, by using the photomask used in the first patterning step, and slightly shifting the exposure position so that the regions between the plurality of resist patterns 2a become unexposed portions. Alternatively, a separate photomask to the photomask used in the first patterning step may be used.

The positions of the unexposed portions in the second patterning step need not necessarily display absolutely no overlap with the positions of the resist pattern 2a, and may partially overlap the positions of the resist pattern 2a. However, it is preferable that the positioning of the resist pattern 4a displays absolutely no overlap with the positioning of the first resist pattern 2a. This means that a resist pattern can be obtained that has a narrower pitch between patterns than that of the first resist pattern formed in the first patterning step.

For example, in the case of the formation of a space and line resist pattern, in the first patterning step, a line and space resist pattern is formed using a line and space photomask having a plurality of lines arranged at a predetermined pitch, and in the subsequent second patterning step, by positioning the unexposed portions at intermediate positions between individual line patterns formed in the first patterning step, a space and line resist pattern (dense pattern) is formed in which the spaces are arranged at a narrower pitch than in the initially formed line and space resist pattern (sparse pattern).

A "sparse pattern" preferably describes a line and space resist pattern having a broad space in which the ratio of line width:space width is 1:2 or greater.

Following exposure, a PEB treatment is performed.

The second chemically amplified resist composition is a negative composition, and therefore the PEB treatment during the second patterning step is conducted at a bake temperature that reduces the solubility of the exposed portions of the second resist film in an alkali developing solution.

In other words, after exposure, performing the PEB treatment of the second resist film formed from the negative chemically amplified resist composition causes the acid generated from the acid generator component to diffuse through the resist film, and also causes a reduction in the solubility of the resist film within an alkali developing solution as a result of the action of the acid.

At this time, unless the bake temperature during the PEB treatment (namely, the PEB temperature) is sufficient, the generation and diffusion of the acid do not proceed satisfactorily, and the solubility of the exposed portions within an alkali developing solution does not decrease sufficiently, meaning the difference in the dissolution rates within an alkali developing solution between the exposed portions and the unexposed portions (namely, the solubility contrast) is small, and therefore even if developing is conducted, a favorable resist pattern cannot be formed. In other words, when conducting exposure, PEB treatment and developing of the second resist film in order to achieve patterning of the resist film, it is necessary to ensure that the PEB treatment is conducted at a PEB temperature that causes the exposed portions of the resist film to decrease a level of solubility within an alkali developing solution that is insufficient to enable dissolution and removal of those exposed portions within the developing solution. Hereafter, this PEB temperature is referred to as the "effective PEB temperature" for that particular resist composition.

Accordingly, in order to enable patterning of the second resist film in the second patterning step, the PEB treatment is performed at a bake temperature that decreases the solubility of the second resist film in an alkali developing solution, namely, at a temperature that is not less than the minimum value for the effective PEB temperature for the second resist film. In other words, if the minimum value for the effective PEB temperature for the second resist film is termed $T_{min2}$, and the PEB temperature for the second patterning step is termed $T_{peb2}$, then in order to enable the solubility in an alkali developing solution of the exposed portions of the second resist film to be reduced satisfactorily during the second patterning step, the relationship $T_{min2} \leq T_{peb2}$ must be satisfied.

A determination as to whether or not the bake temperature used in the PEB treatment of the second patterning step is a bake temperature capable of reducing the solubility of the second resist film in an alkali developing solution (that is, whether or not the PEB temperature is an effective PEB temperature) can be made in the manner described below.

The second resist film is exposed (full surface exposure) with various exposure doses, using the exposure source (such as an ArF excimer laser, EB or EUV or the like) used for the second patterning step, the PEB treatment is conducted at a predetermined bake temperature for a period of 30 to 120 seconds, and developing is then performed using a 2.38% by weight aqueous solution of tetramethylammonium hydroxide (23° C.) as the developing solution.

During this process, (1) as the exposure dose is increased, the exposed portions of the resist film need to be confirmed as remaining on the support once the exposure dose has reached or exceeded a predetermined value. Provided it can be confirmed that a residual film representing 70% or more of the resist film is retained, the bake temperature used is deemed to be a bake temperature capable of decreasing the solubility of the second resist film in the alkali developing solution. On the other hand, if a residual film of 70% or more cannot be confirmed within the exposed portions of the second resist film even when the exposure dose is increased, then the bake temperature used is deemed to be a bake temperature that does not decrease the solubility of the second resist film in the alkali developing solution. Here, the residual film ratio (%) is the ratio (%) of [film thickness of the resist film following exposure, PEB and developing] relative to [film thickness of the resist film prior to conducting exposure, PEB and developing].

Furthermore, in those cases where (2) as the exposure dose is increased, the dissolution rate of the exposed portions of the second resist film in the developing solution is less than 1 nm/second once the exposure dose has reached or exceeded a predetermined value, the bake temperature used is deemed to be a bake temperature capable of reducing the solubility of the second resist film in the alkali developing solution.

On the other hand, in those cases where, even when the exposure dose is increased, the dissolution rate of the exposed portions of the second resist film in the developing solution does not fall to a level of less than 1 nm/second, but rather becomes saturated at a higher dissolution rate, the bake temperature used is deemed to be a bake temperature that does not reduce the solubility of the second resist film in the alkali developing solution.

In the present invention, the above PEB treatment is conducted at a bake temperature that increases the solubility of the first resist film in the alkali developing solution and reduces the solubility of the second resist film in the alkali developing solution, specifically, at a temperature that satisfies $T_{peb2} \geq T_{min1}$. Provided the PEB temperature satisfies $T_{peb2} \geq T_{min1}$, the second PEB treatment described above need not necessarily be conducted at a PEB temperature equal to, or higher than, the PEB temperature used in the first patterning step. However, the second PEB treatment is preferably conducted at a temperature equal to, or higher than, the PEB temperature used in the first patterning step. This means that the solubility in the alkali developing solution of the exposed region (the exposed portions) of the second resist film can be reduced, while the solubility in the alkali developing solution of those portions of the first resist that exist within the exposed portions is increased.

At this time, within the exposed portions of the second resist film 4, the solubility within an alkali developing solution of the second resist film decreases, making the resist film substantially insoluble, whereas the resist pattern 2a that exists within the exposed portions undergoes an increase in solubility within an alkali developing solution as a result of the exposure and subsequent PEB treatment performed during the second patterning step. The unexposed portions of the second resist film 4 undergo no change and remain soluble in an alkali developing solution.

As a result, when developing with an alkali developing solution is conducted following the above PEB treatment, then as illustrated in FIG. 2D, only the unexposed portions of the second resist film 4 are removed, thereby forming a plurality of space patterns and/or hole patterns 4a within the second resist film 4. At the same time, those sections of the resist pattern 2a within the exposed portions of the second resist film 4 are also removed, thereby forming a pattern that represents an inverted image of the resist pattern 2a (namely, an inverse pattern 2b) in positions corresponding with the first resist pattern 2a. For example, if the resist pattern 2a is a line pattern, then a space pattern of the same width is formed as the inverse pattern 2b, whereas if the resist pattern 2a is a dot pattern, then a hole pattern of the same diameter is formed as the inverse pattern 2b.

In those cases where, as illustrated in FIG. 2B and FIG. 2C, the film thickness of the second resist film 4 is greater than the height of the first resist pattern 2a, a thin second resist film 4 exists on top of the first resist pattern 2a. This portion of the resist film 4 has a film thickness (the thickness measured upwards from the top surface of the first resist pattern 2a) that is very small, and therefore absorbs little of the exposure light during the second patterning, and exhibits minimal photosensitivity. As a result, the solubility in the alkali developing solution tends to change little even following the PEB treatment, meaning the film remains in a state that is readily soluble in the alkali developing solution. Moreover, because the film thickness itself is very thin, thickness loss caused by the alkali developing solution also occurs readily. Accordingly, this thin portion of the second resist film 4 tends to be dissolved and removed during developing, together with the first resist pattern 2a.

Considering the above facts, the difference between the film thickness of the second resist film 4 and the height of the first resist pattern 2a is preferably within a range from 50 to 0 nm, and is more preferably from 30 to 5 nm.

In the present invention, in order to ensure that the PEB treatment described above is conducted under conditions that satisfy $T_{peb2} \geq T_{min1}$, the maximum value ($T_{max2}$) for the effective PEB temperature for the second chemically amplified resist composition (the negative composition) is preferably either equal to, or higher than, the minimum value ($T_{min1}$) for the effective PEB temperature for the first chemically amplified resist composition (the positive composition).

The difference between $T_{min1}$ and $T_{max2}$ ($T_{max2}-T_{min1}$) is preferably within a range from 0 to 40° C., more preferably from 5 to 35° C., and still more preferably from 10 to 30° C. A difference that is within the above range is preferred in terms of forming a finer pattern.

In those cases where $T_{max2}$ is equal to $T_{min1}$ ($T_{max2}=T_{min1}$), the PEB temperature for the second patterning step ($T_{peb2}$) becomes the same value as the PEB temperature for the first patterning step ($T_{peb1}$).

In those cases where $T_{max2}$ is higher than $T_{min1}$ ($T_{max2} > T_{min1}$), the PEB temperature for the second patterning step ($T_{peb2}$) should satisfy $T_{max2} \geq T_{peb2} \geq T_{min1}$.

Consequently, the PEB temperature for the second patterning step ($T_{peb2}$) is set with due consideration of the values of $T_{min1}$ and $T_{max2}$ and the like, so as to ensure that $T_{min1} \leq T_{peb2} \leq T_{max2}$. The value of $T_{peb2}$ is typically within a range from 60 to 130° C., preferably from 70 to 120° C., and more preferably from 80 to 110° C.

For example, by patterning the second chemically amplified resist composition and analyzing the sensitivity and the shape of the resulting pattern, the ideal value for $T_{peb2}$ within the above temperature range can be determined.

Furthermore, provided the conditions listed above are satisfied, the difference between $T_{peb1}$ and $T_{peb2}$ ($T_{peb2}-T_{peb1}$) need not necessarily be a positive value. This difference is preferably within a range from −10 to 20° C., is more preferably from 0 to 15° C., and is still more preferably from 0 to 10° C. A difference that is within the above range is preferred in terms of forming a finer pattern.

The bake time for the PEB treatment of the second patterning step is typically within a range from 40 to 120 seconds, and is preferably from 60 to 90 seconds.

$T_{min1}$ varies depending on the first chemically amplified resist composition that is used.

The value of $T_{max2}$, rather than depending on the composition of the second chemically amplified resist composition, tends to depend on the process (the film thickness of the second chemically amplified resist composition and the target dimensions of the pattern), and usually satisfies the relationship $T_{max2} \geq T_{min1}$. The process margin can be improved by altering the composition of the first chemically amplified resist composition (so as to lower the value of $T_{min1}$), or by altering the composition of the second chemically amplified resist composition (so as to raise the value of $T_{min2}$, or so that $T_{min1} \leq T_{min2}$). The value of $T_{max2}$, even when high, is typically approximately 130° C., but is preferably not more than 130° C., and is more preferably not less than 110° C. and not more than 120° C.

The values of $T_{min1}$ and $T_{min2}$ and the difference therebetween can be adjusted by altering the composition of the first chemically amplified resist composition and/or the composition of the second chemically amplified resist composition. For example, in those cases where the first chemically amplified resist composition contains a compound having an acid-dissociable, dissolution-inhibiting group (such as the component (A) described below), the compound is prepared so that the deprotection energy is lower than the heat energy required for the cross-linking reaction of the negative resist of the second chemically amplified resist composition. This ensures that during the patterning using the second chemically amplified resist composition, when exposure is performed, the first chemically amplified resist composition undergoes a ready change in solubility within the alkali developing solution, meaning $T_{min1}$ is lower than $T_{min2}$.

Furthermore, by using an acid generator that generates a comparatively weak acid as the acid generator component within the first chemically amplified resist composition, and using an acid generator that generates a comparatively strong acid as the acid generator component within the second chemically amplified resist composition, the value of $T_{min1}$ can be set to a value lower than $T_{min2}$.

These factors such as the acid-dissociable, dissolution-inhibiting groups within the first chemically amplified resist composition, and the combination of acid generator components used in the first chemically amplified resist composition and the second chemically amplified resist composition are described below in detail.

Following the PEB treatment, the second resist film 4 is developed. Developing can be conducted by a conventional method, using an alkali aqueous solution such as an aqueous solution of tetramethylammonium hydroxide (TMAH) with a concentration of 0.1 to 10% by weight. By conducting alkali developing, the unexposed portions of the second resist film 4 are removed to form a space pattern and/or hole pattern 4a, while at the same time, those sections of the first resist pattern 2a that exist within the exposed portions of the second resist film 4 and the thin film of the second resist film 4 that exists on top of the first resist pattern 2a are dissolved and removed, thus forming the inverse pattern 2b.

Following the above developing treatment, a rinse treatment may be conducted using water or the like.

Further, an additional bake treatment (a post bake) may be conducted following the above alkali developing. A post bake (which is conducted to remove any residual moisture following the alkali developing and rinse treatments) is typically conducted at 100° C., and the treatment time is preferably within a range from 30 to 90 seconds.

As illustrated in the above first embodiment, the present invention enables very fine isolated space patterns or hole patterns, which have conventionally proven difficult to form, to be obtained as inverse patterns. Accordingly, the first resist pattern described above is preferably a line pattern and/or dot pattern.

In a specific example, if a line and space pattern having a line width of 60 nm and a ratio of line width:space width=1:3 (a sparse pattern) is formed, the second resist film is then formed, and a space and line pattern having a space width of 60 nm and a ratio of space width:line width=1:3 is formed in the second resist film in intermediate positions between each of the lines of the above sparse pattern and parallel to each of the lines, then a space and line pattern having a space width of 60 nm and a ratio of space width:line width=1:1 (namely, a dense pattern) is formed.

Compared with the case in which an isolated space pattern (trench pattern) or hole pattern is formed directly, the type of inverse pattern described above exhibits superior resolution and shape, and also displays superior pattern formability in terms of the lithography margin (such as the allowable margins for the exposure dose and the depth of focus (the EL margin and DOF margin respectively), and the degree of verticalness of the pattern shape). In other words, when an isolated space pattern (trench pattern) or hole pattern is formed directly, which requires the removal of very small portions or very fine regions of the resist film, then as mentioned above, pattern formation is constrained to formation using a weak incident light intensity, meaning there are considerable limitations on the pattern formability, whereas the pattern formability during formation of the above inverse pattern is dependent on the pattern formability during formation of the first resist pattern (such as an isolated line pattern, dot pattern, or line and space pattern), and therefore there are far fewer limitations on the pattern formability compared with the case where an isolated space pattern (trench pattern) or hole pattern is formed directly, meaning a more favorable resist pattern can be formed.

Furthermore, by subjecting the photomask used in the first patterning step to a rotational movement, or by using a photomask that is different from the photomask used in the first patterning step (for example, by using a line and space pattern photomask in the first patterning step and using a hole mask pattern in the second patterning step), very fine resist patterns, and/or a multitude of resist patterns can be formed.

Next is a description of a second embodiment of the present invention with reference to FIG. 3.

In this embodiment, with the exception of the fact that the exposure during the second patterning step is conducted as full surface exposure (namely, exposure without using a photomask), the method is performed using the same procedure as that described for the first embodiment. Specifically, after performing the first patterning step in the same manner as the first embodiment, the second patterning step can be conducted using the sequence illustrated in FIG. 3.

Figure 3A:
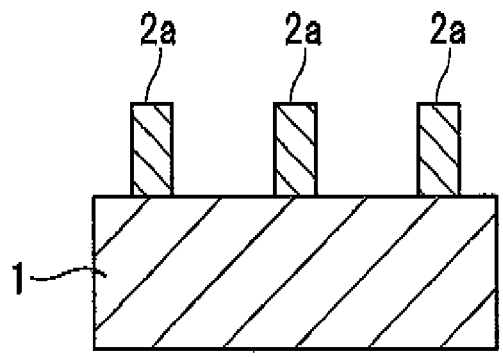
FIG. 3A through FIG. 3D are schematic process diagrams describing a preferred embodiment of a second patterning step in a method of forming a resist pattern according to the present invention.
Figure 3B:
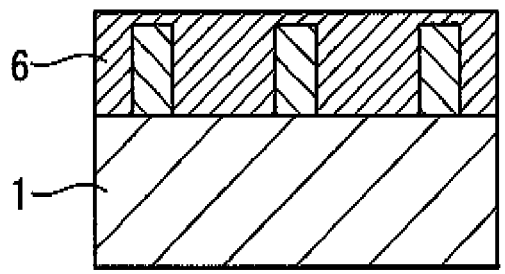

First, the chemically amplified negative resist composition is coated onto the support 1 having the first resist pattern 2a from the first patterning step formed thereon (FIG. 3A), thereby forming a second resist film 6 that fills the gaps between the plurality of resist patterns 2a, as illustrated in FIG. 3B.

Figure 3C:
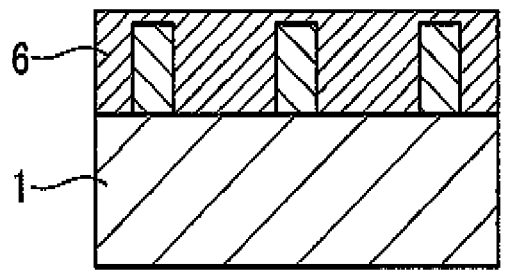

Subsequently, as illustrated in FIG. 3C, the second resist film 6 is subjected to full surface exposure, and is then subjected to a post exposure bake (PEB) treatment. This reduces the alkali solubility of the entire second resist film 6.

Figure 3D:
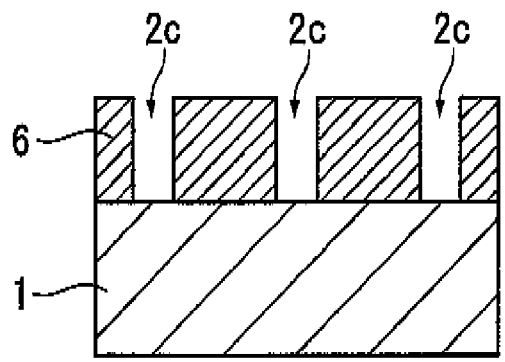

In a similar manner to that described in the first embodiment, this PEB treatment of the second resist film 6 is performed at a bake temperature that increases the solubility of the first resist film in an alkali developing solution and decreases the solubility of the second resist film in an alkali developing solution. This means that when developing with an alkali developing solution is conducted following the PEB treatment, the resist pattern 2a and the portions of the second resist film 6 positioned on top of the first resist pattern 2a are removed, resulting in the formation of an inverse pattern 2c of the resist pattern 2a in the position of the first resist pattern 2a, as shown in FIG. 3D.

In the method of forming a resist pattern according to the present invention, following completion of the second patterning step, a patterning step similar to the second patterning step may be repeated a plurality of times. In other words, the operation within the second patterning step of coating a resist composition onto the support having a resist pattern formed thereon, thereby forming a resist film, selectively exposing this resist film, and then performing developing to form a resist pattern may be conducted a number of times. By repeating this operation a plurality of times, a denser pattern having an even narrower pitch or a complex shape can be formed.

In the method of forming a resist pattern according to the present invention, following completion of the second patterning step described above, the formed resist pattern may be used as a mask for conducting etching of the support 1.

By etching the support 1, a semiconductor device or the like can be produced.

The etching method may use conventional methods, and for example in the case of etching of an organic film (such as a resist pattern or organic antireflective film), dry etching is preferred. Oxygen plasma etching or etching using $CF_4$ gas or $CHF_3$ gas is preferred, and of these, oxygen plasma etching is particularly desirable.

Etching of the substrate or an inorganic antireflective film is preferably conducted by etching using a halogen gas or etching using a fluorocarbon-based gas, and etching using either $CF_4$ gas or $CHF_3$ gas is particularly desirable.

<Positive Resist Composition>

The chemically amplified positive resist composition of the present invention generally includes a base component (A) (hereafter referred to as "component (A)") that exhibits increased solubility in an alkali developing solution under the action of acid and an acid generator component (B) (hereafter referred to as "component (B)") that generates acid upon exposure dissolved in an organic solvent (S) (hereafter referred to as "component (S)"). In this resist composition, when acid is generated from the component (B) upon exposure, the action of that acid causes an increase in the solubility of the component (A) in an alkali developing solution.

Here, the term "base component" describes an organic compound having a film-forming ability. The base component is preferably an organic compound having a molecular weight of 500 or more. When the organic compound has a molecular weight of 500 or more, the film-forming ability is improved, and a nano level resist pattern can be more easily formed.

These "organic compounds having a molecular weight of 500 or more" that are used as the base component are broadly classified into non-polymers and polymers.

The non-polymers are typically compounds having a molecular weight of not less than 500 but less than 4,000. Hereafter, non-polymers having a molecular weight of not less than 500 but less than 4,000 are referred to as "low molecular weight compounds".

As the polymers, compounds having a molecular weight of not less than 2,000 are typically used. Hereafter polymers having a molecular weight of 2,000 or more are referred to as "high molecular weight compounds". In the case of these high molecular weight compounds, the molecular weight is the polystyrene equivalent weight average molecular weight determined by GPC (gel permeation chromatography). Hereafter, a high molecular weight compound may be referred to simply as a "resin".

The component (A) may be a resin component (A1) that exhibits increased solubility in an alkali developing solution under the action of acid (hereafter also referred to as "component (A1)"), a low molecular weight compound (A2) that exhibits increased solubility in an alkali developing solution under the action of acid (hereafter also referred to as "component (A2)"), or a mixture of the component (A1) and the component (A2).

[Component (A1)]

The component (A1) may be selected appropriately from amongst the base resins proposed for conventional chemically amplified positive resist compositions for use with a KrF excimer laser or ArF excimer laser, in accordance with the exposure source used during formation of the resist pattern.

Specific examples of the base resin include resins containing hydrophilic groups (such as hydroxyl groups or carboxyl groups) in which the hydrophilic groups have been protected with acid-dissociable, dissolution-inhibiting groups.

Examples of the resin containing hydrophilic groups include novolak resins, resins having a structural unit derived from hydroxystyrene (namely, (PHS-based resins)), such as polyhydroxystyrenes (PHS) and hydroxystyrene-styrene copolymers, and acrylic resins containing a structural unit derived from an acrylate ester. Any one of these resins may be used individually, or two or more resins may be used in combination.

Here, a "structural unit derived from hydroxystyrene" is a structural unit that is formed by cleavage of the ethylenic double bond of hydroxystyrene or an α-lower alkyl hydroxystyrene. An "α-lower alkyl hydroxystyrene" refers to a compound in which a lower alkyl group is bonded to the carbon atom to which the phenyl group is bonded.

A "structural unit derived from an acrylate ester" is a structural unit that is formed by cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned. With respect to the "structural unit derived from an acrylate ester", the "α-position" (the carbon atom on the α-position) refers to the carbon atom having the carbonyl group bonded thereto, unless specified otherwise.

A "lower alkyl group" describes an alkyl group of 1 to 5 carbon atoms. Specific examples of the lower alkyl group for the substituent at the carbon atom on the α-position include linear or branched lower alkyl groups such as a methyl group, ethyl group, propyl group, isopropyl group, n-butyl group, isobutyl group, tert-butyl group, pentyl group, isopentyl group, and neopentyl group.

Specific examples of the halogenated lower alkyl group include groups in which some or all of the hydrogen atoms of an aforementioned lower alkyl group are substituted with halogen atoms. Examples of the halogen atoms include fluorine atoms, chlorine atoms, bromine atoms and iodine atoms, and fluorine atoms are particularly desirable.

In a structural unit derived from an acrylate ester, it is preferable that a hydrogen atom, a lower alkyl group or a halogenated lower alkyl group, and more preferably a hydrogen atom, a lower alkyl group or a fluorinated lower alkyl group, is bonded to the α-position of the acrylate ester. In terms of industrial availability, a hydrogen atom or a methyl group is particularly desirable.

The component (A1) in the positive resist composition used in the present invention preferably contains a structural unit derived from an acrylate ester.

It is particularly desirable that the component (A1) have a structural unit (a1) derived from an acrylate ester containing an acid-dissociable, dissolution-inhibiting group.

Further, it is preferable that the component (A1) have a structural unit (a2) derived from an acrylate ester containing a lactone-containing cyclic group, as well as the structural unit (a1).

Furthermore, it is preferable that the component (A1) have a structural unit (a3) derived from an acrylate ester containing a polar group-containing aliphatic hydrocarbon group, either in addition to the structural unit (a1), or in addition to the structural unit (a1) and the structural unit (a2).

Structural Unit (a1):

The structural unit (a1) is a structural unit derived from an acrylate ester containing an acid-dissociable, dissolution-inhibiting group.

The acid-dissociable, dissolution-inhibiting group in the structural unit (a1) has an alkali dissolution-inhibiting effect that renders the entire component (A1) substantially insoluble in an alkali developing solution prior to dissociation, but then dissociates under the action of acid, causing an increase in the solubility of the entire component (A1) in the alkali developing solution. There are no particular restrictions on the acid-dissociable, dissolution-inhibiting group, and any of the groups that have been proposed as acid-dissociable, dissolution-inhibiting groups for the base resins of chemically amplified resists can be used. Generally, groups that form either a cyclic or chain-like tertiary alkyl ester with the carboxyl group of the (meth)acrylic acid, and acetal-type acid-dissociable, dissolution-inhibiting groups such as alkoxyalkyl groups are the most widely known. Here, the term "(meth)acrylic acid" is a generic term that includes either or both of acrylic acid having a hydrogen atom bonded to the α-position and methacrylic acid having a methyl group bonded to the α-position.

A "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom. The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include aliphatic branched, acid-dissociable, dissolution-inhibiting groups and aliphatic cyclic group-containing acid-dissociable, dissolution-inhibiting groups.

The term "aliphatic branched" refers to a branched structure having no aromaticity. The structure of the "aliphatic branched, acid-dissociable, dissolution-inhibiting group" is not limited to structures constituted solely of carbon atoms and hydrogen atoms (not limited to hydrocarbon groups), but is preferably a hydrocarbon group. Further, the "hydrocarbon group" may be either saturated or unsaturated, but is preferably saturated.

Examples of aliphatic branched, acid-dissociable, dissolution-inhibiting groups include groups represented by a formula —C($R^{71}$)($R^{72}$)($R^{73}$). In this formula, $R^{71}$ to $R^{73}$ each independently represents a linear alkyl group of 1 to 5 carbon atoms. The group represented by —C($R^{71}$)($R^{72}$)($R^{73}$) preferably contains from 4 to 8 carbon atoms, and specific examples include a tert-butyl group, 2-methyl-2-butyl group, 2-methyl-2-pentyl group, and 3-methyl-3-pentyl group. A tert-butyl group is particularly preferred.

The term "aliphatic cyclic group" refers to a monocyclic group or polycyclic group that has no aromaticity.

In the aliphatic cyclic group-containing acid-dissociable, dissolution-inhibiting group, the aliphatic cyclic group may or may not have a substituent. Examples of substituents include lower alkyl groups of 1 to 5 carbon atoms, a fluorine atom, fluorinated lower alkyl groups of 1 to 5 carbon atoms, and an oxygen atom (=O).

The aliphatic cyclic group may be a hydrocarbon group constituted solely of carbon and hydrogen (namely, an alicyclic group), or a heterocyclic group in which a portion of the carbon atoms that constitute the ring structure of an alicyclic group have been substituted with a hetero atom such as an oxygen atom, nitrogen atom or sulfur atom. As the aliphatic cyclic group, an alicyclic group is preferred.

The aliphatic cyclic group may be either saturated or unsaturated, but in terms of achieving superior transparency to ArF excimer lasers and the like, and also achieving excellent resolution and depth of focus (DOF) and the like, a saturated group is preferred.

The number of carbon atoms within the aliphatic cyclic group is preferably within a range from 5 to 15.

Examples of monocyclic aliphatic cyclic groups include groups in which one or more hydrogen atoms have been removed from a cycloalkane. Specific examples include groups in which one or more hydrogen atoms have been removed from cyclopentane or cyclohexane, and groups in which two hydrogen atoms have been removed from cyclohexane are particularly desirable.

Examples of polycyclic aliphatic cyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane.

Of these, groups in which two hydrogen atoms have been removed from adamantane, norbornane or tetracyclododecane are readily available industrially, and are therefore preferred. Of these groups, groups in which two hydrogen atoms have been removed from adamantane or norbornane are particularly preferred.

Examples of the aliphatic cyclic group-containing acid-dissociable, dissolution-inhibiting group include (i) groups having a tertiary carbon atom within the ring structure of an aliphatic cyclic group, and (ii) groups containing an aliphatic cyclic group, and a branched alkylene group having a tertiary carbon atom which is bonded to the aliphatic cyclic group.

Specific examples of (i) include groups represented by general formulas (1-1) to (1-9) shown below.

Specific examples of (ii) include groups represented by general formulas (2-1) to (2-6) shown below.

[Chemical Formula 1]

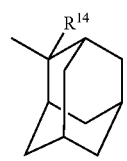

(1-1)

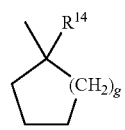

(1-2)

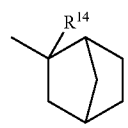

(1-3)

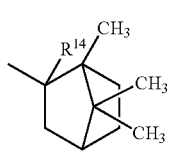 (1-4)

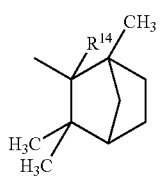 (1-5)

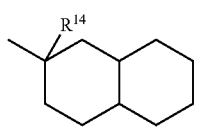 (1-6)

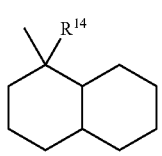 (1-7)

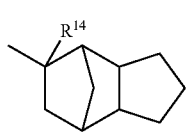 (1-8)

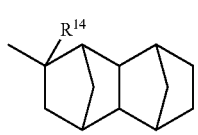 (1-9)

wherein $R^{14}$ represents an alkyl group, and g represents an integer of 0 to 8.

[Chemical Formula 2]

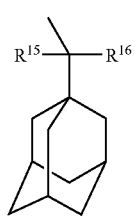 (2-1)

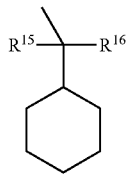 (2-2)

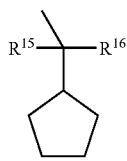 (2-3)

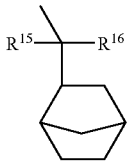 (2-4)

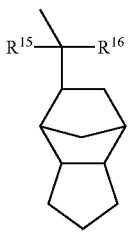 (2-5)

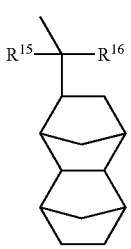 (2-6)

wherein $R^{15}$ and $R^{16}$ each independently represents an alkyl group.

As the alkyl groups for $R^{14}$ to $R^{16}$, lower alkyl groups are preferred, and linear or branched alkyl groups are also preferred. Specific examples include a methyl group, ethyl group, propyl group, isopropyl group, n-butyl group, isobutyl group, tert-butyl group, pentyl group, isopentyl group, and neopentyl group. Of these, a methyl group, ethyl group or n-butyl group is preferred, and a methyl group or ethyl group is more preferred.

In formula (1-2), g is preferably an integer of 0 to 5, more preferably an integer of 1 to 3, and is most preferably either 1 or 2.

Specific examples of acid-dissociable, dissolution-inhibiting groups represented by formula (1-2) include a 1-methyl-1-cyclobutyl group, 1-ethyl-1-cyclobutyl group, 1-isopropyl-1-cyclobutyl group, 1-methyl-1-cyclopentyl group, 1-ethyl-1-cyclopentyl group, 1-isopropyl-1-cyclopentyl group, 1-methyl-1-cyclohexyl group, 1-ethyl-1-cyclohexyl group, 1-isopropyl-1-cyclohexyl group, 1-methyl-1-cycloheptyl group, 1-ethyl-1-cycloheptyl group, 1-isopropyl-1-cycloheptyl group, 1-methyl-1-cyclooctyl group, and 1-ethyl-1-cyclooctyl group.

An "acetal-type acid-dissociable, dissolution-inhibiting group" generally substitutes a hydrogen atom at the terminal of an alkali-soluble group such as a carboxyl group or hydroxyl group, so as to be bonded with an oxygen atom. When acid is generated upon exposure, the generated acid cleaves the bond between the acetal-type acid-dissociable, dissolution-inhibiting group and the oxygen atom to which the acetal-type, acid-dissociable, dissolution-inhibiting group is bonded.

Examples of acetal-type acid-dissociable, dissolution-inhibiting groups include groups represented by general formula (p1) shown below.

[Chemical Formula 3]

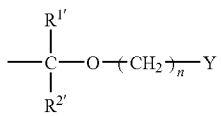

(p1)

wherein $R^{1'}$ and $R^{2'}$ each independently represents a hydrogen atom or a lower alkyl group, n represents an integer of 0 to 3, and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$, the same groups as the lower alkyl groups for R above can be exemplified, a methyl group or ethyl group is preferable, and a methyl group is particularly desirable.

In the present invention, it is preferable that at least one of $R^{1'}$ and $R^{2'}$ is a hydrogen atom. That is, it is preferable that the acid-dissociable, dissolution-inhibiting group (p1) is a group represented by general formula (p1-1) shown below.

[Chemical Formula 4]

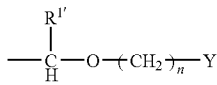

(p1-1)

wherein $R^{1'}$, n and Y are as defined above (namely, have the same definition, and can be exemplified using the same examples)

As the lower alkyl group for Y, the same groups as the lower alkyl groups for R above can be exemplified.

As the aliphatic cyclic group for Y, any of the numerous monocyclic or polycyclic aliphatic cyclic groups that have been proposed for conventional ArF resists and the like can be appropriately selected for use. For example, the same groups as those described above in connection with the "aliphatic cyclic group" can be exemplified.

Further, as the acetal-type, acid-dissociable, dissolution-inhibiting group, groups represented by general formula (p2) shown below can also be exemplified.

[Chemical Formula 5]

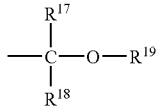

(p2)

wherein $R^{17}$ and $R^{18}$ each independently represents a linear or branched alkyl group or a hydrogen atom, and $R^{19}$ represents a linear, branched or cyclic alkyl group, or alternatively, $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), wherein $R^{19}$ and $R^{17}$ are bonded together.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one structural unit selected from the group consisting of structural units represented by general formula (a1-0-1) shown below and structural units represented by general formula (a1-0-2) shown below.

Specific examples of the structural unit (a1) include structural units represented by general formula (a1-0-1) below and structural units represented by general formula (a1-0-2) below.

[Chemical Formula 6]

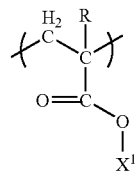

(a1-0-1)

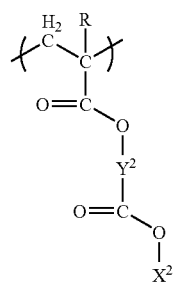

(a1-0-2)

wherein R represents a hydrogen atom, a lower alkyl group or a halogenated lower alkyl group, $X^1$ represents an acid-dissociable, dissolution-inhibiting group, $Y^2$ represents a divalent linking group, and $X^2$ represents an acid-dissociable, dissolution-inhibiting group.

In general formula (a1-0-1), the lower alkyl group and halogenated lower alkyl group for R are as defined for the lower alkyl group and halogenated lower alkyl group that may be bonded to the α-position of the aforementioned acrylate ester.

$X^1$ is not particularly limited as long as it is an acid-dissociable, dissolution-inhibiting group. Examples thereof include the aforementioned tertiary alkyl ester-type acid-dissociable, dissolution-inhibiting groups and acetal-type acid-dissociable, dissolution-inhibiting groups, and tertiary alkyl ester-type acid-dissociable, dissolution-inhibiting groups are preferable.

In general formula (a1-0-2), R is as defined above.

$X^2$ is the same as $X^1$ in general formula (a1-0-1).

As the divalent linking group represented by $Y^2$, divalent hydrocarbon groups that may have a substituent, and divalent linking groups containing a hetero atom are preferred.

The description that the hydrocarbon group "may have a substituent" means that some or all of the hydrogen atoms within the hydrocarbon group may be substituted with an atom other than a hydrogen atom or with a group.

The hydrocarbon group may be an aliphatic hydrocarbon group or an aromatic hydrocarbon group. An "aliphatic hydrocarbon group" describes a hydrocarbon group that contains no aromaticity.

The aliphatic hydrocarbon group may be saturated or unsaturated, but is preferably saturated.

More specific examples of the aliphatic hydrocarbon group include linear or branched aliphatic hydrocarbon groups, and aliphatic hydrocarbon groups that include a ring within the structure.

The linear or branched aliphatic hydrocarbon group preferably contains 1 to 10 carbon atoms, more preferably 1 to 8 carbon atoms, still more preferably 1 to 5 carbon atoms, and most preferably 1 or 2 carbon atoms.

As the linear aliphatic hydrocarbon group, linear alkylene groups are preferred, and specific examples include a methylene group [—$CH_2$—], ethylene group [—$(CH_2)_2$—], trimethylene group [—$(CH_2)_3$—], tetramethylene group [—$(CH_2)_4$—], or pentamethylene group [—$(CH_2)_5$—].

As the branched aliphatic hydrocarbon group, branched alkylene groups are preferred, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)$ $CH_2$—, —$CH(CH_3)CH(CH_3)$—, —$C(CH_3)_2CH_2$— and —$CH(CH_2CH_3)CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. The alkyl group within the alkylalkylene group is preferably an alkyl group of 1 to 5 carbon atoms.

These chain-like aliphatic hydrocarbon groups may or may not have a substituent. Examples of possible substituents include a fluorine atom, a fluorinated lower alkyl group of 1 to 5 carbon atoms, and an oxygen atom (=O).

Examples of the aliphatic hydrocarbon group that includes a ring within the structure include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an above-mentioned chain-like aliphatic hydrocarbon group, or interposed partway along a chain-like aliphatic hydrocarbon group.

The cyclic aliphatic hydrocarbon group preferably contains from 3 to 20 carbon atoms, and more preferably 3 to 12 carbon atoms.

The cyclic aliphatic hydrocarbon group may be either a polycyclic group or a monocyclic group. The monocyclic group is preferably a group in which two hydrogen atoms have been removed from a monocycloalkane of 3 to 6 carbon atoms, and specific examples of the monocycloalkane include cyclopentane and cyclohexane.

The polycyclic group is preferably a group in which two hydrogen atoms have been removed from a polycycloalkane of 7 to 12 carbon atoms, and specific examples of the polycycloalkane include adamantane, norbornane, isobornane, tricyclodecane, and tetracyclododecane.

The cyclic aliphatic hydrocarbon group may or may not have a substituent, and examples of the substituent include a lower alkyl group of 1 to 5 carbon atoms, a fluorine atom, a fluorinated lower alkyl group of 1 to 5 carbon atoms, and an oxygen atom (=O).

Examples of the hetero atom in a "divalent linking group containing a hetero atom" include atoms other than a carbon atom or hydrogen atom, and specific examples include an oxygen atom, nitrogen atom, sulfur atom or halogen atom.

Specific examples of divalent linking groups containing a hetero atom include —O—, —C(=O)—, —C(=O)—O—, a carbonate linkage (—O—C(=O)—O—), —NH—, —$NR^{04}$— (wherein, $R^{04}$ is an alkyl group), —NH—C (=O)—, and =N—. Further, combinations of a "divalent linking group containing a hetero atom" and a divalent hydrocarbon group may also be exemplified. Examples of the divalent hydrocarbon group include the same groups as those exemplified above in relation to the "hydrocarbon group that may have a substituent", and linear or branched aliphatic hydrocarbon groups are preferred.

In the present invention, the divalent linking group for $Y^2$ is preferably an alkylene group, a divalent aliphatic cyclic group, or a divalent linking group containing a hetero atom. Of these, an alkylene group is particularly desirable.

When $Y^2$ represents an alkylene group, the alkylene group preferably contains 1 to 10 carbon atoms, more preferably 1 to 6 carbon atoms, still more preferably 1 to 4 carbon atoms, and most preferably 1 to 3 carbon atoms. Specific examples include the same groups as those exemplified above in relation to the linear alkylene groups and branched alkylene groups.

When $Y^2$ represents a divalent aliphatic cyclic group, examples of the aliphatic cyclic group include the same cyclic aliphatic hydrocarbon groups exemplified above in relation to the "aliphatic hydrocarbon groups that include a ring within the structure".

As the aliphatic cyclic group, groups in which two or more hydrogen atoms have been removed from cyclopentane, cyclohexane, norbornane, isobornane, adamantane, tricyclodecane or tetracyclododecane are particularly preferred.

When $Y^2$ represents a divalent linking group containing a hetero atom, preferred examples of the divalent linking group include —O—, —C(=O)—O—, —C(=O)—, —O—C (=O)—O—, —C(=O)—NH—, —NH— (wherein the H may be substituted with a substituent such as an alkyl group or acyl group), —S—, —S(=O)$_2$—, —S(=O)$_2$—O—, groups represented by a formula: -A-O—B—, and groups represented by a formula: -[A-C(=O)—O]$_m$—B—. In these formulas, A and B each independently represents a divalent hydrocarbon group that may have a substituent, and m represents an integer of 0 to 3.

When $Y^2$ is an —NH— group, the H may be substituted with a substituent such as an alkyl group or acyl group. The substituent (the alkyl group or acyl group or the like) preferably contains 1 to 10 carbon atoms, more preferably 1 to 8 carbon atoms, and still more preferably 1 to 5 carbon atoms.

In the formula -A-O—B— or the formula -[A-C(=O)—O]$_m$—B—, A and B each independently represents a divalent hydrocarbon group that may have a substituent.

Examples of the divalent hydrocarbon group that may have a substituent represented by A or B include the same groups as those exemplified above in relation to the "divalent hydrocarbon group that may have a substituent" for the group $R^2$.

For A, a linear aliphatic hydrocarbon group is preferred, a linear alkylene group is more preferred, a linear alkylene group of 1 to 5 carbon atoms is still more preferred, and a methylene group or ethylene group is the most desirable.

For B, a linear or branched aliphatic hydrocarbon group is preferred, and a methylene group, ethylene group or alkylmethylene group is more preferable. The alkyl group within the alkylmethylene group is preferably linear alkyl group of 1 to 5 carbon atoms, is more preferably a linear alkyl group of 1 to 3 carbon atoms, and is most preferably a methyl group.

Furthermore, in the group represented by the formula -[A-C(=O)—O]$_m$—B—, m is an integer of 0 to 3, more preferably an integer of 0 to 2, still more preferably 0 or 1, and most preferably 1.

Specific examples of the structural unit (a1) include structural units represented by general formulas (a1-1) to (a1-4) shown below.

[Chemical Formula 7]

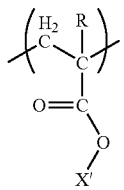

(a1-1)

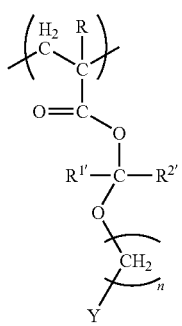

(a1-2)

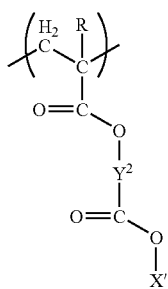

(a1-3)

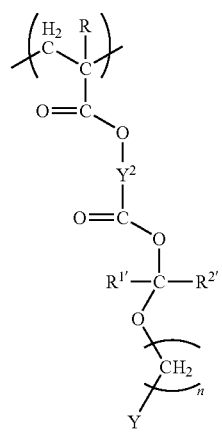

(a1-4)

wherein X' represents a tertiary alkyl ester-type acid-dissociable, dissolution-inhibiting group, Y represents a lower alkyl group of 1 to 5 carbon atoms or an aliphatic cyclic group, n represents an integer of 0 to 3, $Y^2$ represents a divalent linking group, R is as defined above, and $R^{1'}$ and $R^{2'}$ each independently represents a hydrogen atom or a lower alkyl group of 1 to 5 carbon atoms.

In the above formulas, examples of X' include the same groups as the tertiary alkyl ester-type acid-dissociable, dissolution-inhibiting groups exemplified above for $X^1$.

Examples of $R^{1'}$, $R^{2'}$, n and Y, include the same groups as those exemplified above for $R^{1'}$, $R^{2'}$, n and Y in general formula (p1) described above in connection with the "acetal-type acid-dissociable, dissolution-inhibiting groups".

Examples of $Y^2$ include the same groups as those exemplified above for $Y^2$ in general formula (a1-0-2).

Specific examples of structural units represented by general formulas (a1-1) to (a1-4) are shown below.

In each of the following formulas, $R^\alpha$ represents a hydrogen atom, a methyl group or a trifluoromethyl group.

[Chemical Formula 8]

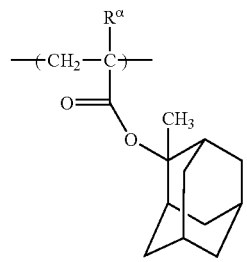

(a1-1-1)

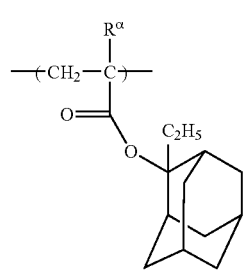

(a1-1-2)

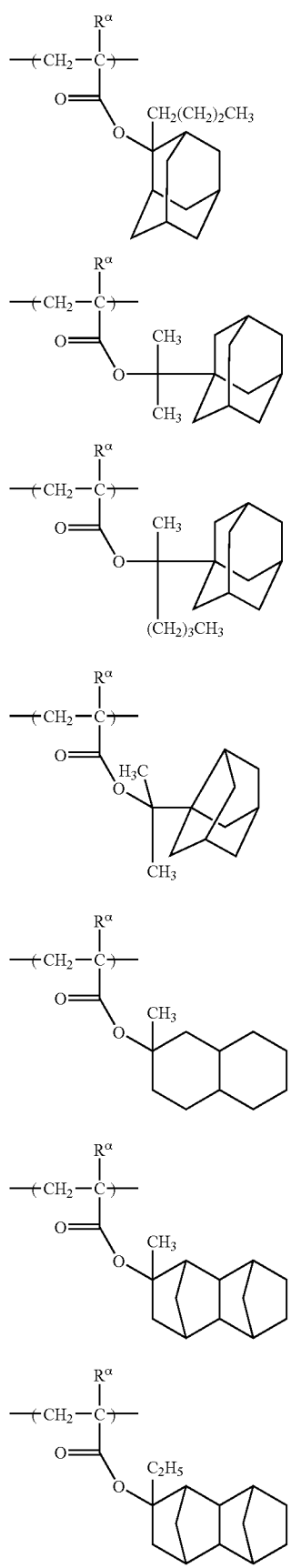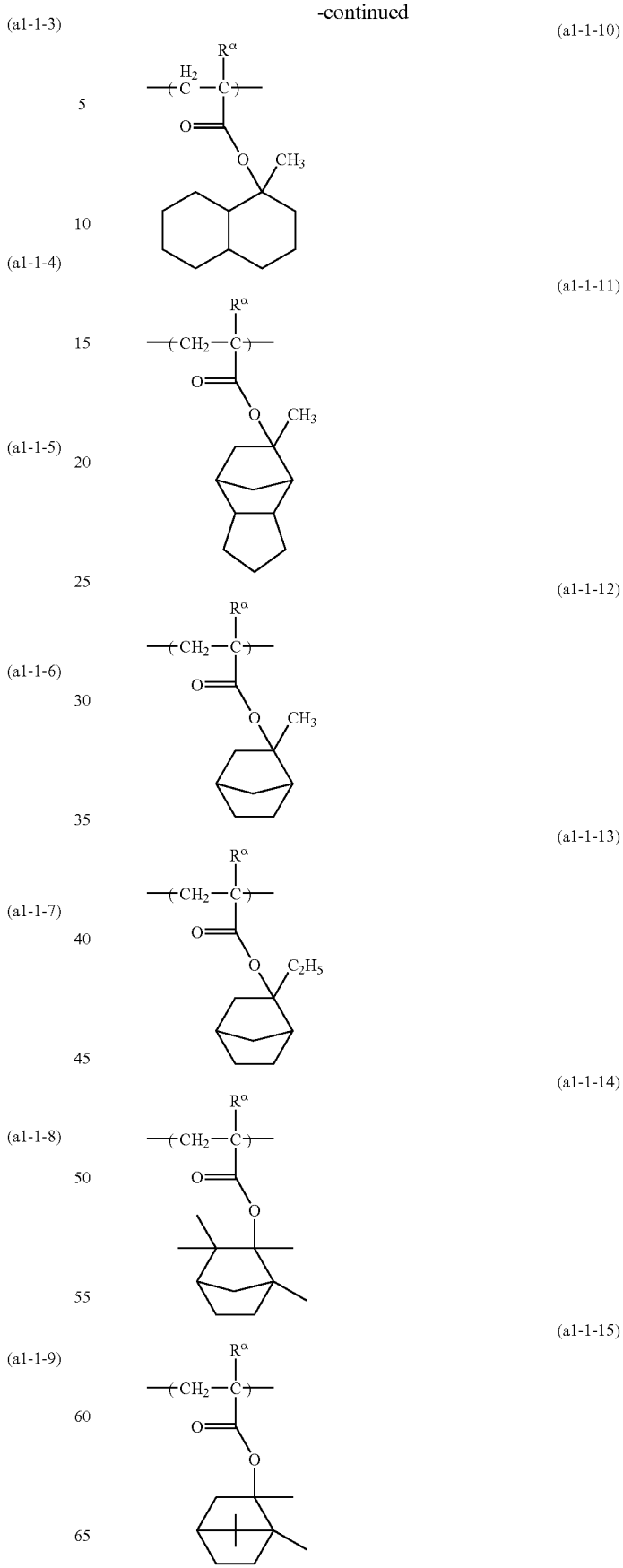

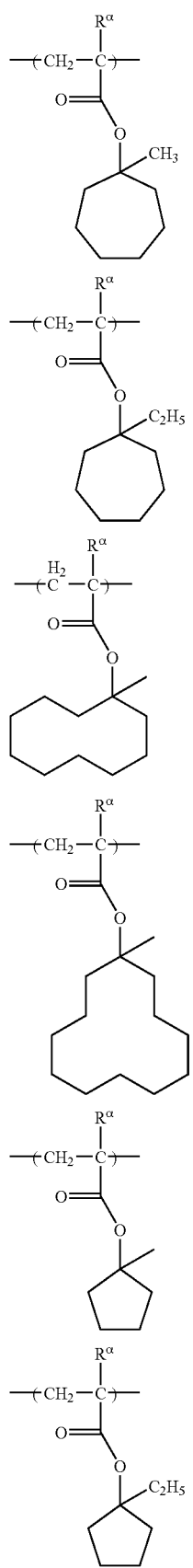
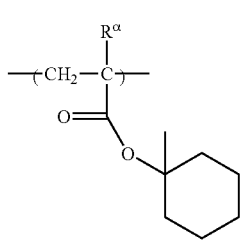
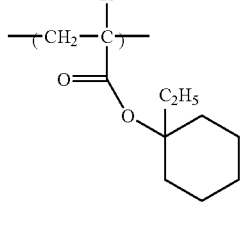
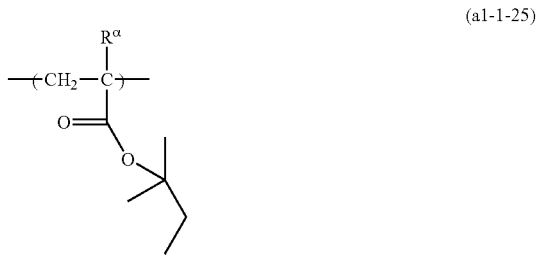
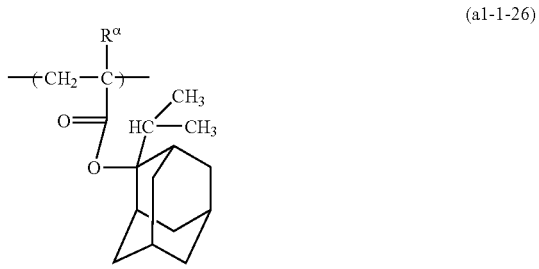
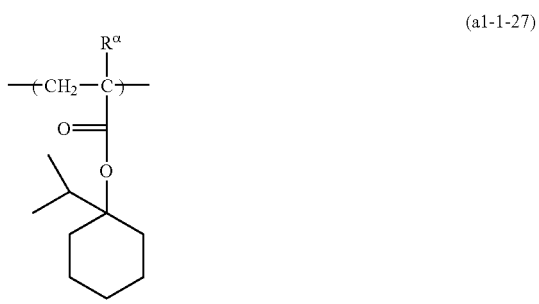

(a1-1-28) 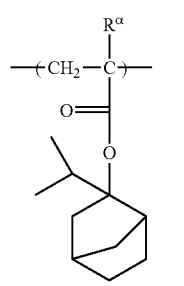
(a1-1-29) 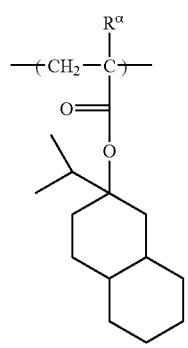
(a1-1-30) 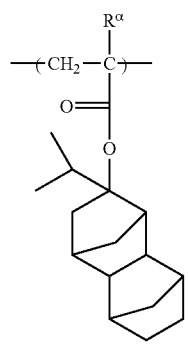
(a1-1-31) 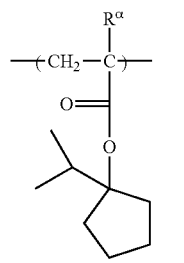
[Chemical Formula 10]
(a1-2-1) 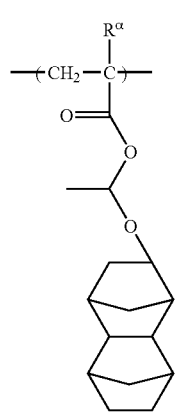
(a1-2-2) 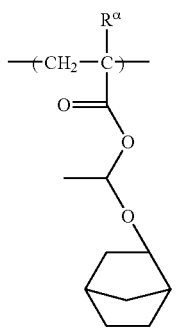
(a1-2-3) 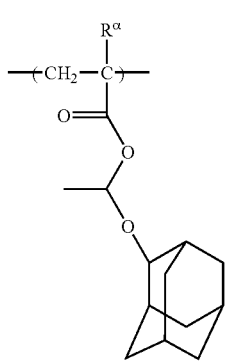
(a1-2-4) 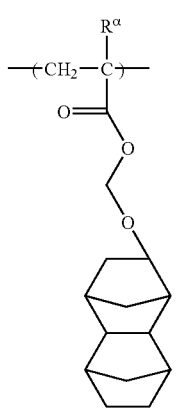
(a1-2-5) 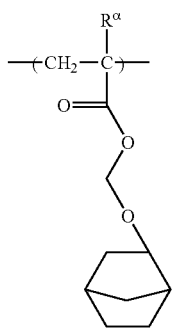

(a1-2-6)
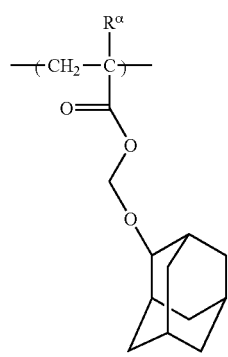
(a1-2-7)
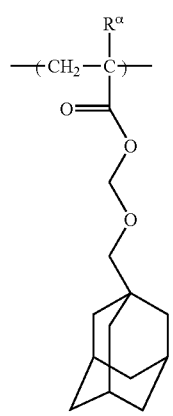
(a1-2-8)
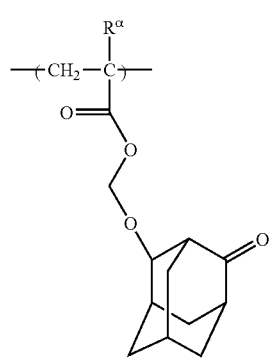
(a1-2-9)
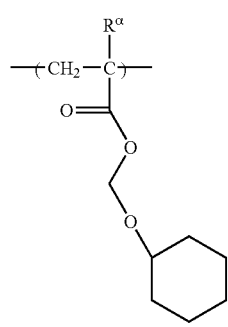
(a1-2-10)
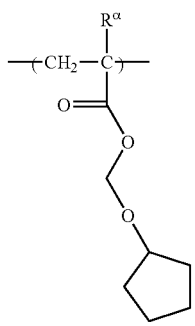
(a1-2-11)
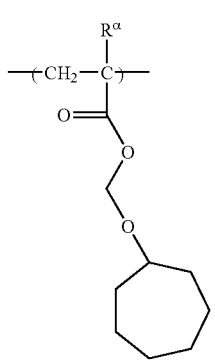
(a1-2-12)
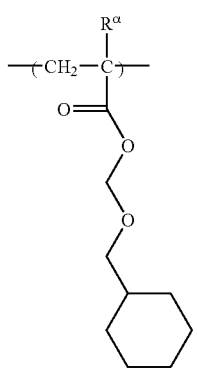
(a1-2-13)
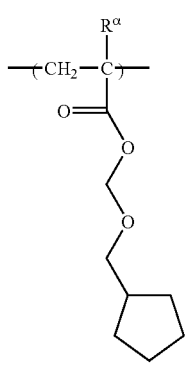

(a1-2-14)
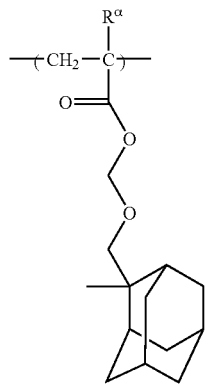
(a1-2-15)
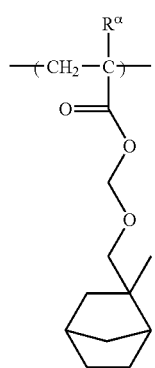
(a1-2-16)
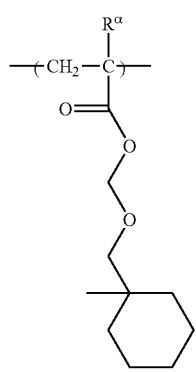
(a1-2-17)
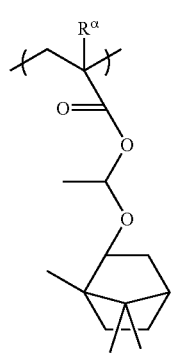
(a1-2-18)
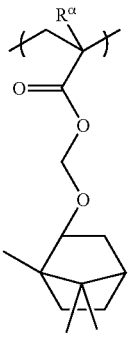
(a1-2-19)
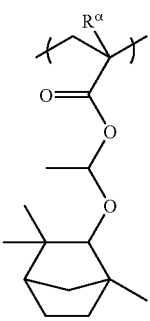
(a1-2-20)
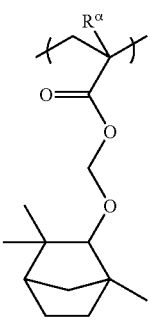
(a1-2-21)
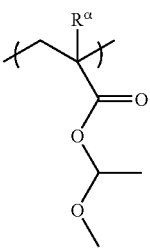
(a1-2-22)

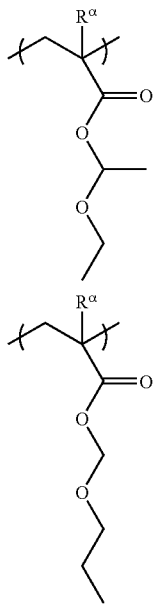
(a1-2-23)
(a1-2-24)
[Chemical Formula 11]
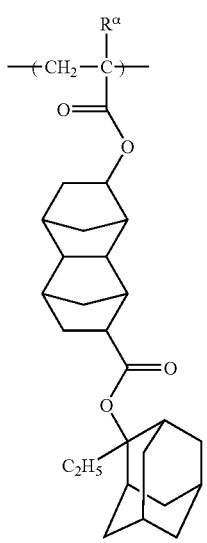
(a1-3-1)
(a1-3-2)
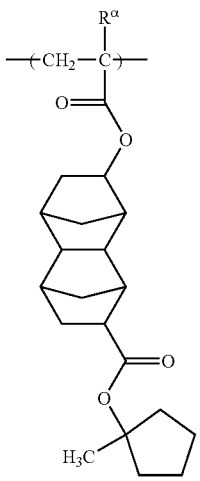
(a1-3-3)
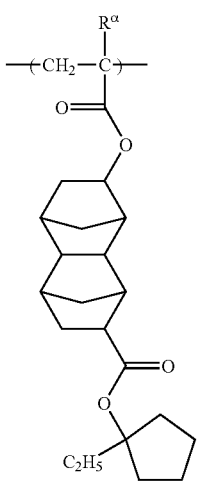
(a1-3-4)
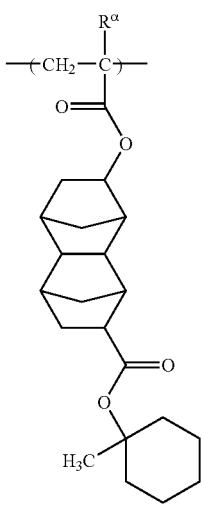
(a1-3-5)

(a1-3-6)
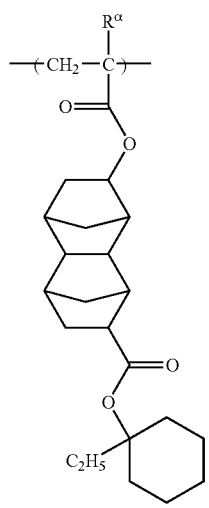
(a1-3-7)
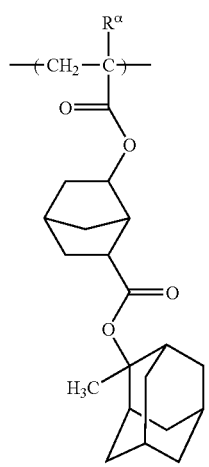
(a1-3-8)
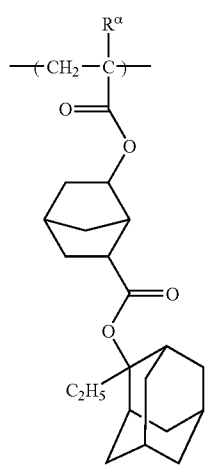
(a1-3-9)
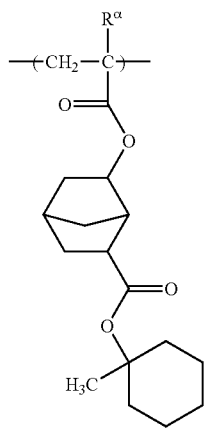
(a1-3-10)
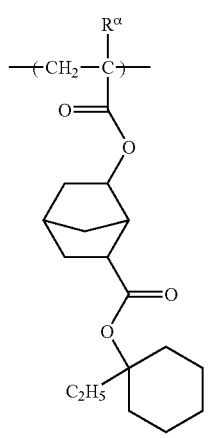
(a1-3-11)
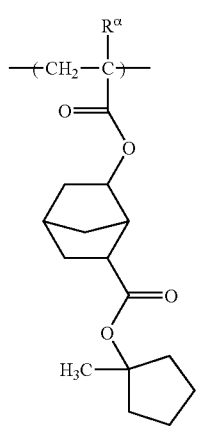

(a1-3-12)
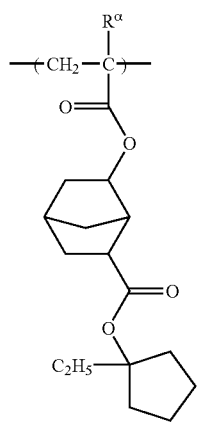
(a1-3-13)
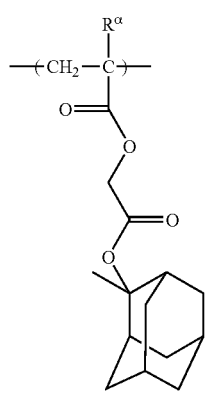
(a1-3-14)
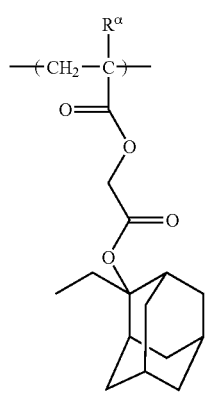
(a1-3-15)
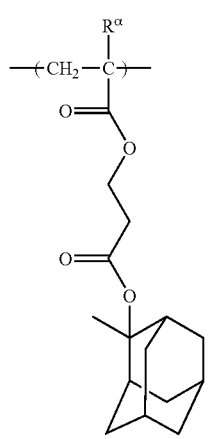
(a1-3-16)
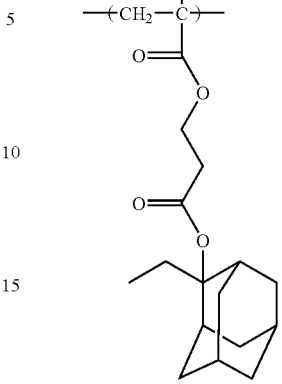
(a1-3-17)
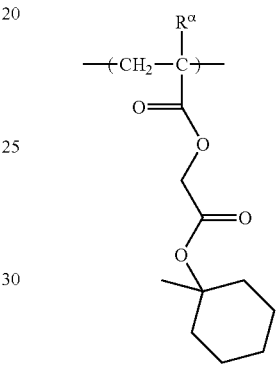
(a1-3-18)
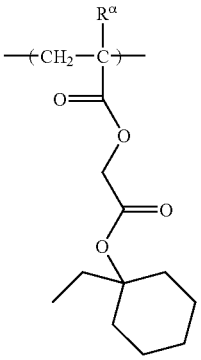
[Chemical Formula 12]
(a1-3-19)
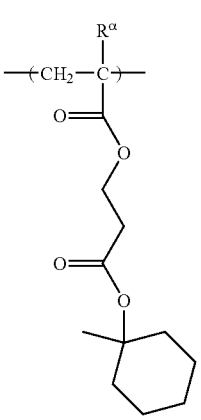

(a1-3-20)
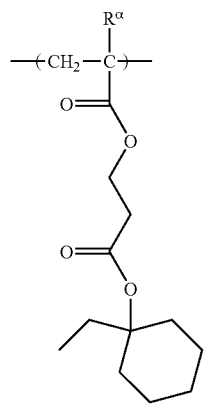
(a1-3-21)
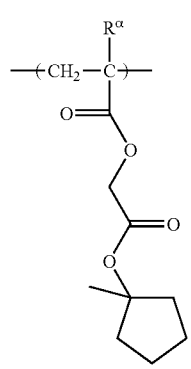
(a1-3-22)
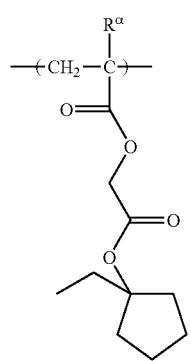
(a1-3-23)
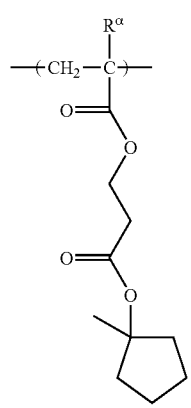
(a1-3-24)
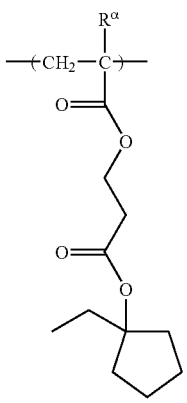
[Chemical Formula 13]
(a1-3-25)
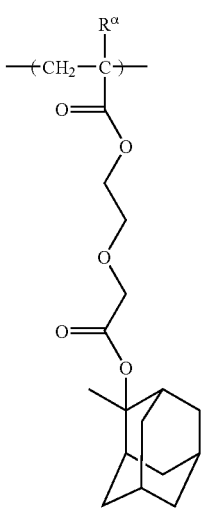
(a1-3-26)
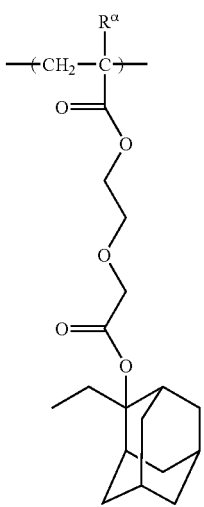

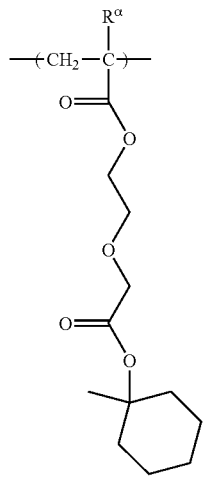
(a1-3-27)
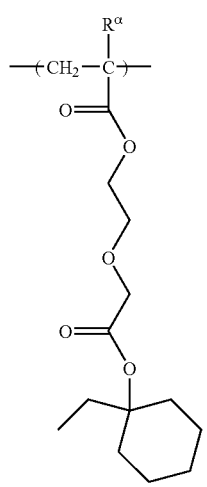
(a1-3-28)
(a1-3-29)
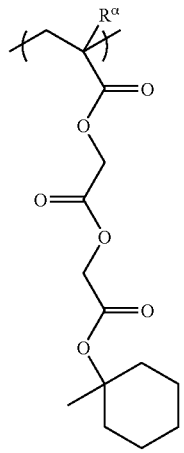
(a1-3-30)
[Chemical Formula 14]
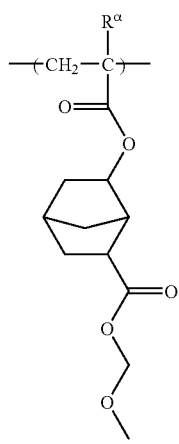
(a1-4-1)
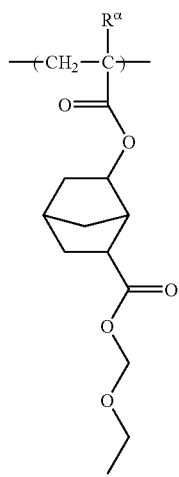
(a1-4-2)

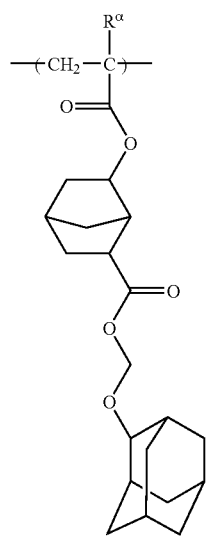
(a1-4-3)
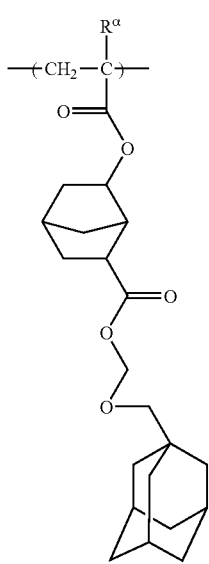
(a1-4-4)
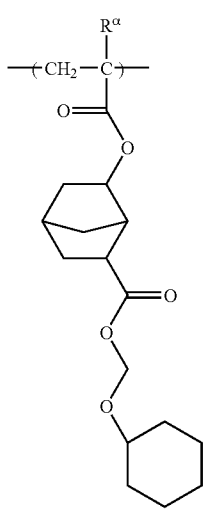
(a1-4-5)
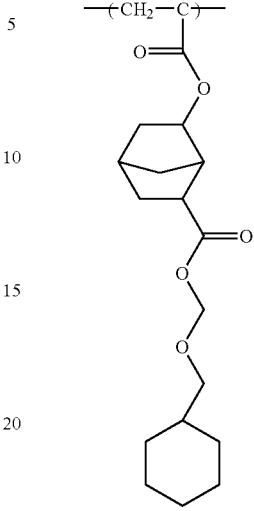
(a1-4-6)
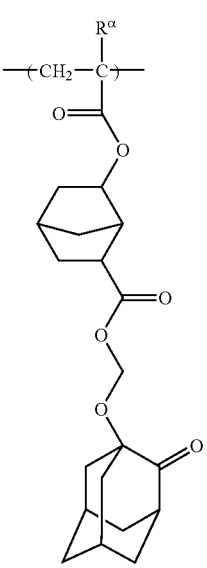
(a1-4-7)
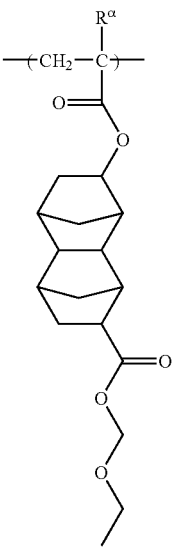
(a1-4-8)

(a1-4-9)
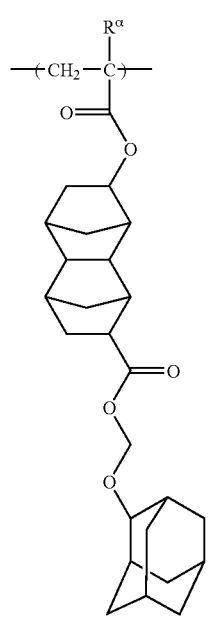
(a1-4-11)
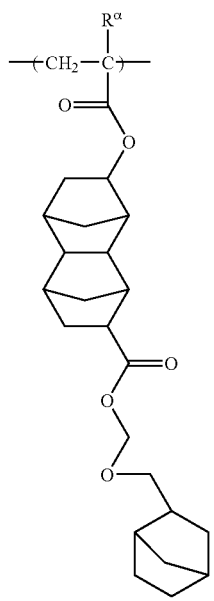
(a1-4-10)
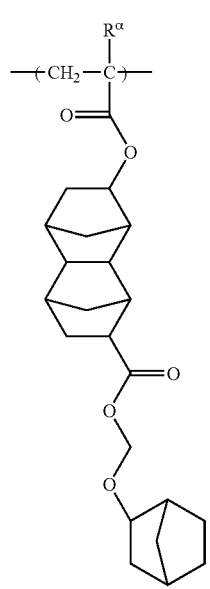
(a1-4-12)
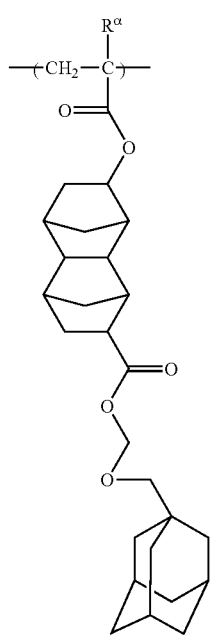

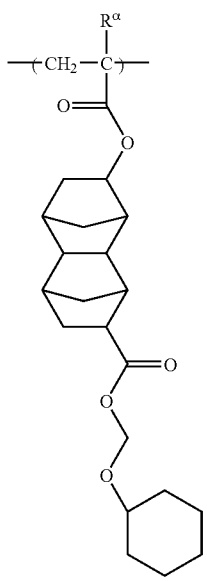

(a1-4-13)

(a1-4-14)

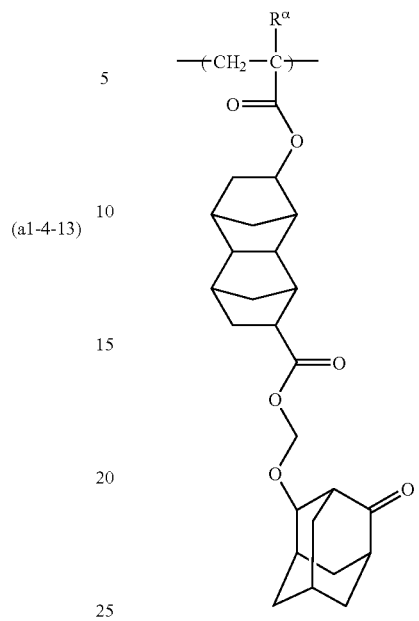

(a1-4-15)

As the structural unit (a1), one type may be used alone, or two or more types may be used in combination.

Among the above units, structural units represented by general formula (a1-1) or (a1-3) are preferable. More specifically, at least one structural unit selected from the group consisting of structural units represented by formulas (a1-1-1) to (a-1-1-4), (a1-1-20) to (a1-1-23) and (a1-3-25) to (a1-3-30) is more preferable.

Further, as the structural unit (a1), structural units represented by general formula (a1-1-01) shown below, which includes the structural units represented by formulas (a1-1-1) to (a1-1-3), structural units represented by general formula (a1-1-02) shown below, which includes the structural units represented by formulas (a1-1-16) to (a1-1-17) and formulas (a1-1-20) to (a1-1-23), structural units represented by general formula (a1-3-01) shown below, which includes the structural units represented by formulas (a1-3-25) to (a1-3-26), structural units represented by general formula (a1-3-02) shown below, which includes the structural units represented by formulas (a1-3-27) to (a1-3-28), and structural units represented by general formula (a1-3-03) shown below, which includes the structural units represented by formulas (a1-3-29) to (a1-3-30), are also preferable.

[Chemical Formula 15]

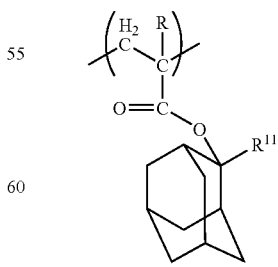

(a1-1-01)

wherein R represents a hydrogen atom, a lower alkyl group or a halogenated lower alkyl group, and $R^{11}$ represents a lower alkyl group.

[Chemical Formula 16]

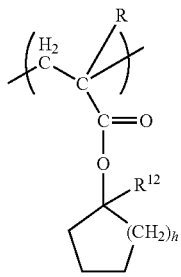
(a1-1-02)

wherein R represents a hydrogen atom, a lower alkyl group or a halogenated lower alkyl group, $R^{12}$ represents a lower alkyl group, and h represents an integer of 1 to 6.

[Chemical Formula 17]

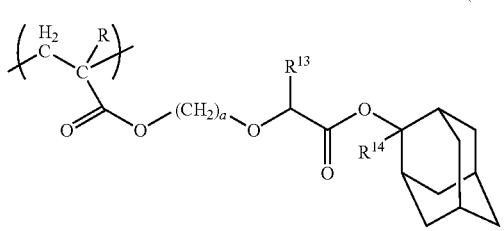
(a1-3-01)

wherein R represents a hydrogen atom, a lower alkyl group or a halogenated lower alkyl group, $R^{14}$ represents a lower alkyl group, $R^{13}$ represents a hydrogen atom or a methyl group, and a represents an integer of 1 to 10.

[Chemical Formula 18]

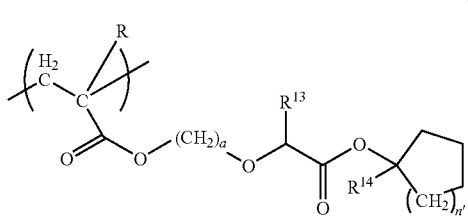
(a1-3-02)

wherein R represents a hydrogen atom, a lower alkyl group or a halogenated lower alkyl group, $R^{14}$ represents a lower alkyl group, $R^{13}$ represents a hydrogen atom or a methyl group, a represents an integer of 1 to 10, and n' represents an integer of 1 to 6.

[Chemical Formula 19]

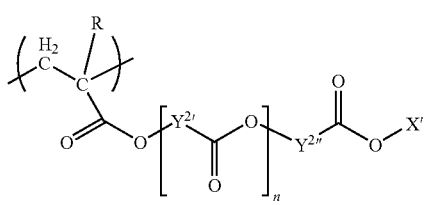
(a1-3-03)

wherein R is as defined above, $Y^{2'}$ and $Y^{2''}$ each independently represents a divalent linking group, X' represents an acid-dissociable, dissolution-inhibiting group, and n represents an integer of 0 to 3.

In general formulas (a1-1-01) and (a1-1-02), R is as defined above.

The lower alkyl group for $R^{11}$ is the same as the lower alkyl group for R above, and is preferably a methyl group or an ethyl group.

The lower alkyl group for $R^{12}$ is the same as the lower alkyl group for R above, and is preferably a methyl group or an ethyl group, and most preferably an ethyl group.

h is preferably 1 or 2, and most preferably 2.

In general formulas (a1-3-01) and (a1-3-02), R is as defined above.

$R^{13}$ is preferably a hydrogen atom.

The lower alkyl group for $R^{14}$ is the same as the lower alkyl group for R above, and is preferably a methyl group or an ethyl group.

a is preferably an integer of 1 to 8, more preferably an integer of 2 to 5, and most preferably 2.

In general formula (a1-3-03), examples of the divalent linking groups represented by $Y^{2'}$ and $Y^{2''}$ include the same groups as those exemplified above for $Y^2$ in general formula (a1-3).

$Y^{2'}$ is preferably a divalent hydrocarbon group that may have a substituent, more preferably a linear aliphatic hydrocarbon group, and still more preferably a linear alkylene group. Of such groups, a linear alkylene group of 1 to 5 carbon atoms is particularly preferred, and a methylene group or ethylene group is the most desirable.

$Y^{2''}$ is preferably a divalent hydrocarbon group that may have a substituent, more preferably a linear aliphatic hydrocarbon group, and still more preferably a linear alkylene group. Of such groups, a linear alkylene group of 1 to 5 carbon atoms is particularly preferred, and a methylene group or ethylene group is the most desirable.

The acid-dissociable, dissolution-inhibiting group represented by X' is as defined above, and is preferably a tertiary alkyl ester-type acid-dissociable, dissolution-inhibiting group, more preferably an aforementioned group (i) having a tertiary carbon atom within the ring structure of a monovalent aliphatic cyclic group, and of such groups, is most preferably a group represented by general formula (1-1).

n represents an integer of 0 to 3, and is preferably an integer of 0 to 2, more preferably 0 or 1, and most preferably 1.

In the component (A1), the amount of the structural unit (a1), based on the combined total of all the structural units that constitute the component (A1), is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A1). On the other hand, by making the amount of the structural unit (a1) no more than the upper limit of the above-mentioned range, a good balance can be achieved with the other structural units.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The lactone is counted as the first ring, and a lactone-containing cyclic group in which the only ring structure is the lactone ring is referred to as a monocyclic group, and groups containing other ring structures are described as polycyclic groups regardless of the structure of the other rings.

When the copolymer (A1) is used for forming a resist film, the lactone-containing cyclic group of the structural unit (a2) is effective in improving the adhesion between the resist film and the substrate, and increasing the compatibility with the developing solution containing water.

As the structural unit (a2), there are no particular limitations, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 20]

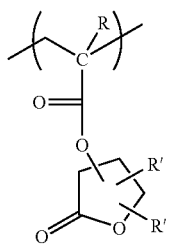

(a2-1)

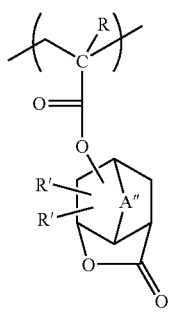

(a2-2)

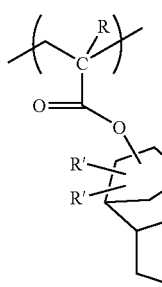

(a2-3)

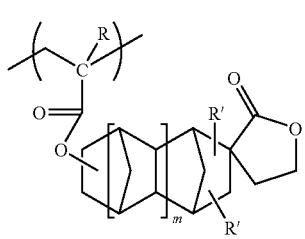

(a2-4)

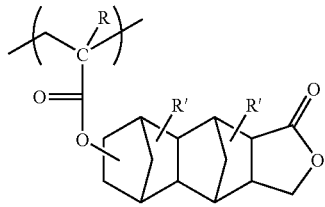

(a2-5)

wherein R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents an integer of 0 or 1; and A" either represents an alkylene group of 1 to 5 carbon atoms that may contain an oxygen atom or sulfur atom, or represents an oxygen atom or a sulfur atom.

In general formulas (a2-1) to (a2-5), R is the same as R in the structural unit (a1).

The lower alkyl group for R' is the same as the lower alkyl group for R in the structural unit (a1).

When R" is a linear or branched alkyl group, it preferably has 1 to 10 carbon atoms, and more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of the alkylene group of 1 to 5 carbon atoms that may contain an oxygen atom or a sulfur atom represented by A" include a methylene group, ethylene group, n-propylene group, isopropylene group, —O—CH$_2$—, —CH$_2$—O—CH$_2$—, —S—CH$_2$—, and —CH$_2$—S—CH$_2$—.

Specific examples of structural units represented by general formulas (a2-1) to (a2-5) above are shown below.

In each of the following formulas, R$^\alpha$ represents a hydrogen atom, a methyl group or a trifluoromethyl group.

[Chemical Formula 21]

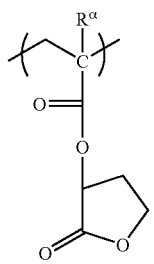

(a2-1-1)

(a2-1-2)
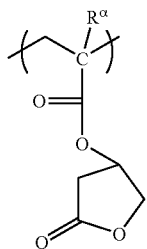
(a2-1-3)
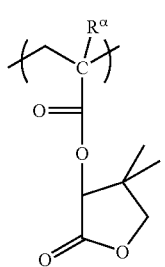
(a2-1-4)
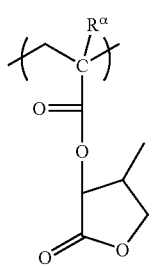
[Chemical Formula 22]
(a2-2-1)
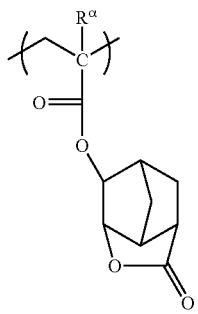
(a2-2-2)
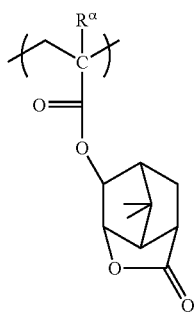
(a2-2-3)
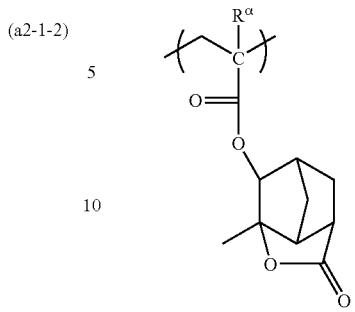
(a2-2-4)
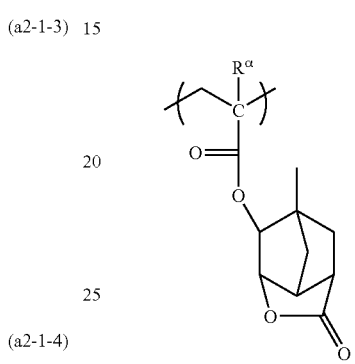
(a2-2-5)
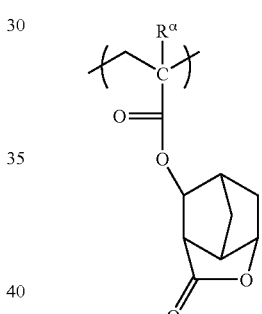
(a2-2-6)
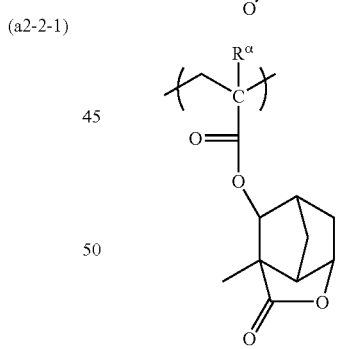
(a2-2-7)
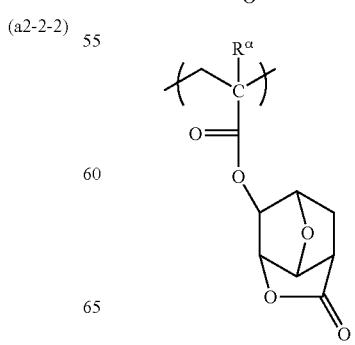

-continued
(a2-2-8)
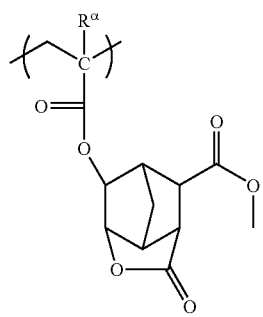
(a2-2-9)
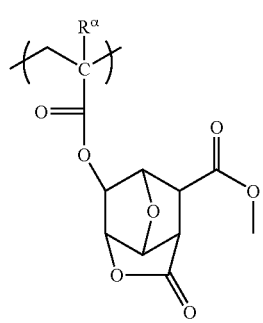
[Chemical Formula 23]
(a2-3-1)
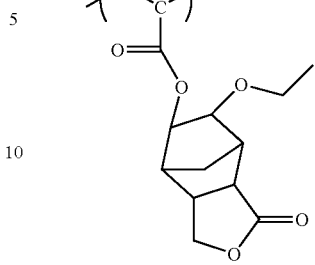
(a2-3-2)
(a2-3-3)
-continued
(a2-3-4)
(a2-3-5)
[Chemical Formula 24]
(a2-4-1)
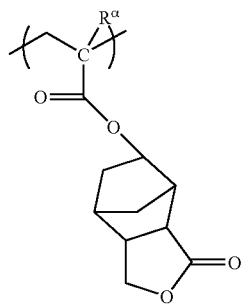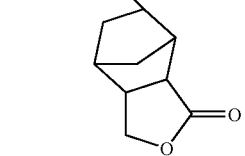
(a2-4-2)
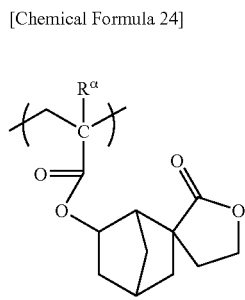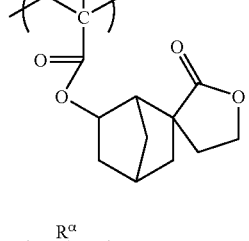
(a2-4-3)
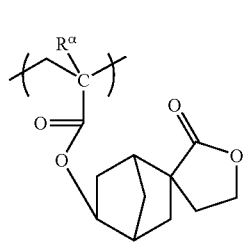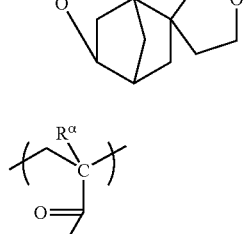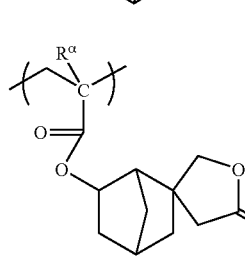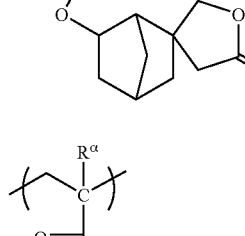
(a2-4-4)
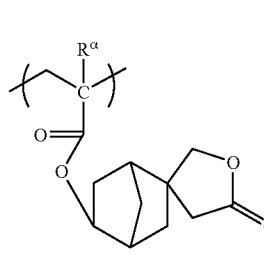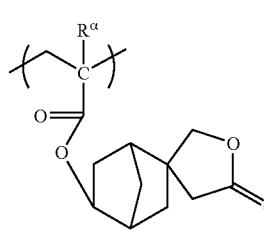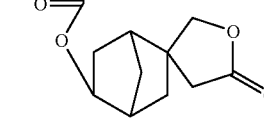

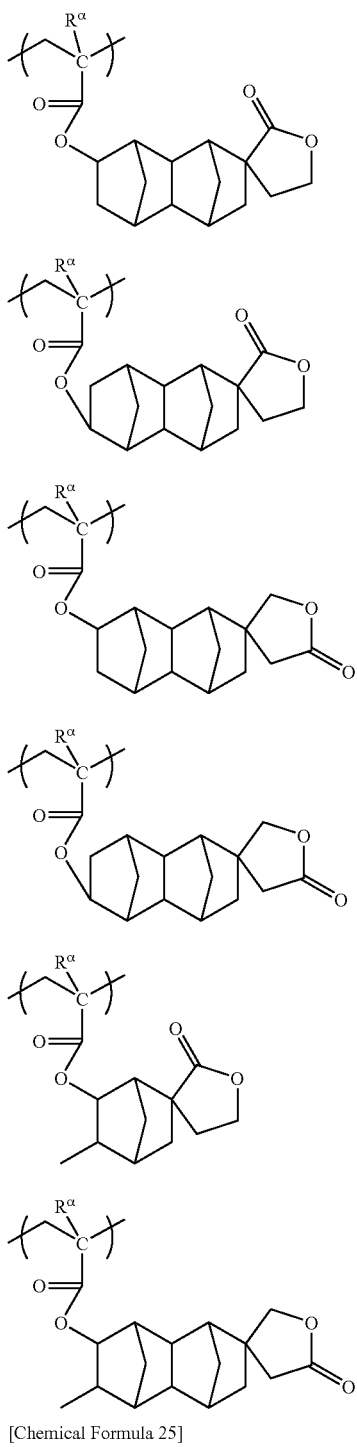
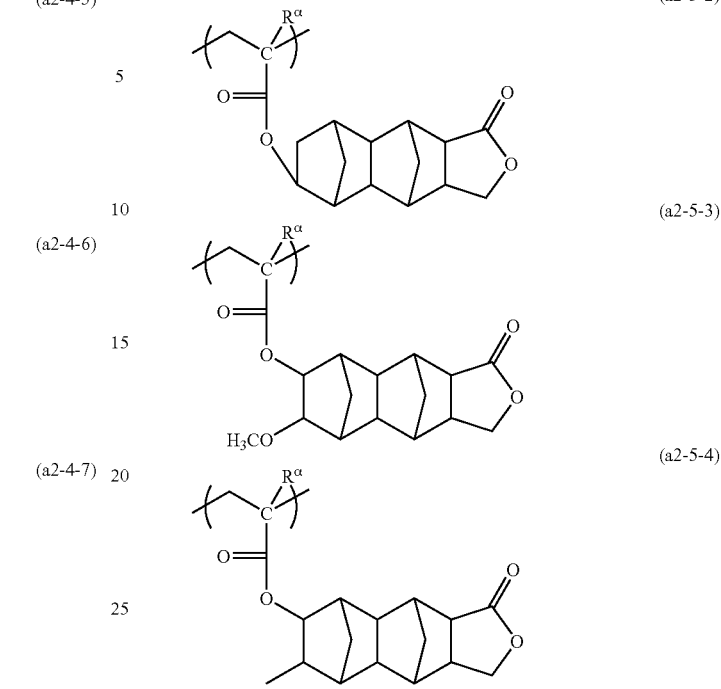

(a2-4-5)
(a2-4-6)
(a2-4-7)
(a2-4-8)
(a2-4-9)
(a2-4-10)

[Chemical Formula 25]

(a2-5-1)
(a2-5-2)
(a2-5-3)
(a2-5-4)

In the component (A1), one type of structural unit (a2) may be used, or two or more types may be used in combination.

As the structural unit (a2), at least one structural unit selected from the group consisting of general formulas (a2-1) to (a2-5) is preferable, and at least one structural unit selected from the group consisting of general formulas (a2-1) to (a2-3) is more preferable. Of these, it is preferable to use at least one structural unit selected from the group consisting of formulas (a2-1-1), (a2-2-1), (a2-2-7), (a2-3-1), and (a2-3-5).

In the component (A1), the amount of the structural unit (a2), based on the combined total of all the structural units that constitute the component (A1), is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3):

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to a favorable improvement in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 26]

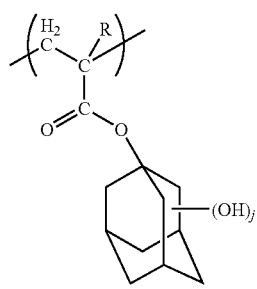

(a3-1)

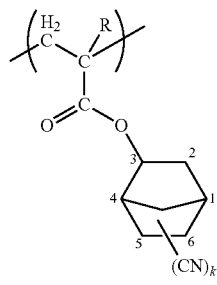

(a3-2)

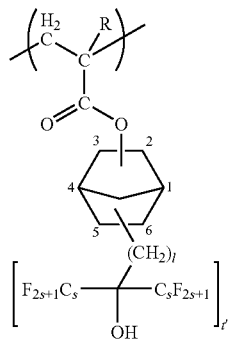

(a3-3)

wherein R is as defined above, j is an integer of 1 to 3, k is an integer of 1 to 3, t' is an integer of 1 to 3, l is an integer of 1 to 5, and s is an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1, and s is preferably 1. Further, in formula (a3-3), it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

As the structural unit (a3), one type of structural unit may be used, or two or more types may be used in combination.

The amount of structural unit (a3), based on the combined total of all the structural units that constitute the component (A1), is preferably 5 to 50 mol %, more preferably 5 to 40 mol %, and still more preferably 5 to 25 mol %.

Structural Unit (a4):

The component (A1) may also have a structural unit (a4), which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable.

Examples of this aliphatic polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used. In consideration of industrial availability and the like, at least one polycyclic group selected from amongst a tricyclodecanyl group, adamantyl group, tetracyclododecanyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 27]

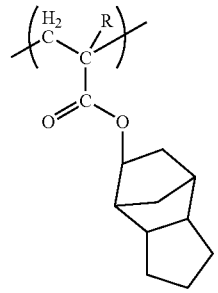

(a4-1)

-continued

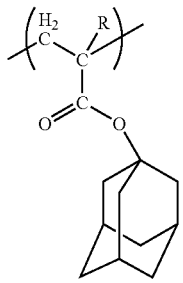
(a4-2)

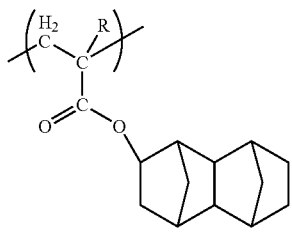
(a4-3)

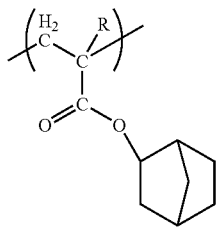
(a4-4)

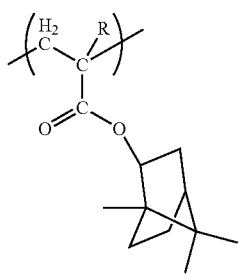
(a4-5)

wherein R is as defined above.

When the structural unit (a4) is included in the component (A1), the amount of the structural unit (a4), based on the combined total of all the structural units that constitute the component (A1), is preferably within the range from 1 to 30 mol %, and more preferably from 10 to 20 mol %.

The component (A1) is preferably a copolymer containing the structural units (a1), (a2) and (a3). Examples of such a copolymer include a copolymer consisting of the structural units (a1) and (a2) and (a3), and a copolymer consisting of the structural units (a1), (a2), (a3) and (a4).

In the component (A), as the component (A1), one type may be used, or two or more types may be used in combination.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having an introduced hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably within a range from 2,000 to 50,000, more preferably from 3,000 to 30,000, and most preferably from 5,000 to 20,000. By making the weight average molecular weight no more than the upper limit of the above-mentioned range, the component (A1) exhibits satisfactory solubility in a resist solvent when used as a resist. On the other hand, making the weight average molecular weight at least as large as the lower limit of the above-mentioned range improves the dry etching resistance and cross-sectional shape of the resist pattern.

Further, the dispersity (Mw/Mn) is preferably within a range from 1.0 to 5.0, more preferably from 1.0 to 3.0, and most preferably from 1.2 to 2.5. Here, Mn is the number average molecular weight.

[Component (A2)]

As the component (A2), it is preferable to use a low molecular weight compound that has a molecular weight of at least 500 but less than 4,000, contains a hydrophilic group, and also contains an acid-dissociable, dissolution-inhibiting group such as those exemplified above in connection with the component (A1). Specific examples include compounds containing a plurality of phenol structures in which the hydrogen atoms within some hydroxyl groups have been substituted with the aforementioned acid dissociable, dissolution-inhibiting groups.

Examples of the component (A2) include low molecular weight phenolic compounds in which a portion of the hydroxyl group hydrogen atoms have been substituted with an aforementioned acid-dissociable, dissolution-inhibiting group. These types of compounds are known, for example, as sensitizers or heat resistance improvers for use in non-chemically amplified g-line or i-line resists.

Examples of these low molecular weight phenol compounds include linear polyphenol compounds, including bisphenol type compounds such as bis(4-hydroxyphenyl) methane, bis(2,3,4-trihydroxyphenyl)methane, bis(4-hydroxy-3-methylphenyl)-3,4-dihydroxyphenylmethane, bis (3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl) ethyl]benzene, bis(2,3-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3'5'-dimethylphenyl) propane; trisphenol type compounds such as tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis (4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4- hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane; linear trinuclear phenol compounds such as 2,4-bis(3,5-dimethyl-4-hydroxybenzyl)-5-hydroxyphenol and 2,6-bis(2,5-dimethyl-4-hydroxybenzyl)-4-methylphenol; linear tetranuclear phenol compounds such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane; and linear pentanuclear phenol compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol; as well as polynuclear branched compounds such as 1-[1-(4-hydroxyphenyl)isopropyl]-4-[1,1-bis(4-hydroxyphenyl)ethyl]benzene and 1-[1-(3-methyl-4-hydroxyphenyl)isopropyl]-4-[1,1-bis(3-methyl-4-hydroxyphenyl)ethyl]benzene; and dimers through to dodecamers of formalin condensation products of phenols such as phenol, m-cresol, p-cresol and xylenol. Needless to say, the low molecular weight phenol compound is not limited to these examples.

Furthermore, there are no particular limitations on the acid-dissociable, dissolution-inhibiting group, and suitable examples include the groups described above.

[Component (B)]

As the component (B), any of the known acid generators used in conventional chemically amplified resist compositions may be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As the onium salt-based acid generator, a compound represented by general formula (b-1) or (b-2) shown below may be used.

[Chemical Formula 28]

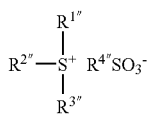

(b-1)

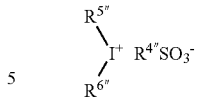

(b-2)

wherein $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom in the formula; and $R^{4''}$ represents an alkyl group that may have a substituent, a halogenated alkyl group, an aryl group or an alkenyl group, with the proviso that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. In formula (b-1), two of $R^{1''}$ to $R^{3''}$ in formula (b-1) may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited, and examples include aryl groups having 6 to 20 carbon atoms, in which some or all of the hydrogen atoms of the aryl group may or may not be substituted with alkyl groups, alkoxy groups, halogen atoms, hydroxyl groups, alkoxyalkyloxy groups, or alkoxycarbonylalkyloxy groups.

The aryl group is preferably an aryl group having 6 to 10 carbon atoms because such compounds can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and is most preferably a methyl group, ethyl group, propyl group, n-butyl group or tert-butyl group.

The alkoxy group with which hydrogen atoms of the aryl group may be substituted is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or ethoxy group.

The halogen atom with which hydrogen atoms of the aryl group may be substituted is preferably a fluorine atom.

Examples of the alkoxyalkyloxy group with which hydrogen atoms of the aryl group may be substituted include groups represented by a general formula: —O—C($R^{47}$)($R^{48}$)—O—$R^{49}$ (wherein each of $R^{47}$ and $R^{48}$ independently represents a hydrogen atom or a linear or branched alkyl group, and $R^{49}$ represents an alkyl group).

The alkyl group for $R^{47}$ and $R^{48}$ preferably has 1 to 5 carbon atoms and may be either linear or branched, is preferably an ethyl group or a methyl group, and is most preferably a methyl group.

It is preferable that at least one of $R^{47}$ and $R^{48}$ is a hydrogen atom, and it is particularly desirable that either one of $R^{47}$ and $R^{48}$ is a hydrogen atom and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and examples thereof include a methyl group, ethyl group, propyl group, n-butyl group or tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, which may or may not be substituted with alkyl groups of 1 to 5 carbon atoms, fluorine atoms or fluorinated alkyl groups. Examples of the monocycloalkane include cyclopentane and cyclohexane. Examples of polycycloalkane include adamantane, norbornane, isobornane, tricyclodecane and tetracyclododecane. Among these, groups in which one or more hydrogen atoms have been removed from adamantane are preferable.

Examples of the alkoxycarbonylalkyloxy group with which hydrogen atoms of the aryl group may be substituted include groups represented by a general formula: —O—$R^{50}$—C(=O)—O—$R^{51}$ (wherein $R^{50}$ represents a linear or branched alkylene group, and $R^{51}$ represents a tertiary alkyl group).

The linear or branched alkylene group for $R^{50}$ preferably has 1 to 5 carbon atoms, and examples thereof include a methylene group, ethylene group, trimethylene group, tetramethylene group and 1,1-dimethylethylene group.

Examples of the tertiary alkyl group for $R^{51}$ include a 2-methyl-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

The alkyl group for $R^{1''}$ to $R^{3''}$ is not particularly limited, and examples include linear, branched or cyclic alkyl groups having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group or decanyl group, and a methyl group is most preferable because it is excellent in resolution and can be synthesized at a low cost.

When two of $R^{1''}$ to $R^{3''}$ in formula (b-1) are bonded to each other to form a ring with the sulfur atom in the formula, it is preferable that the two of $R^{1''}$ to $R^{3''}$ form a 3- to 10-membered ring including the sulfur atom, and it is particularly desirable that the two of $R^{1''}$ to $R^{3''}$ form a 5- to 7-membered ring including the sulfur atom.

When two of $R^{1''}$ to $R^{3''}$ in formula (b-1) are bonded to each other to form a ring with the sulfur atom in the formula, the remaining one of $R^{1''}$ to $R^{3''}$ is preferably an aryl group. Examples of the aryl group include the same groups as those exemplified above for the aryl groups for $R^{1''}$ to $R^{3''}$.

$R^{4''}$ represents an alkyl group that may have a substituent, a halogenated alkyl group, an aryl group or an alkenyl group.

The alkyl group for $R^{4''}$ may be a linear, branched or cyclic group.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for $R^{4''}$ include groups in which some or all of the hydrogen atoms in an aforementioned linear, branched or cyclic alkyl group have been substituted with halogen atoms. Examples of the halogen atom include a fluorine atom, chlorine atom, bromine atom or iodine atom, and a fluorine atom is preferred In the halogenated alkyl group, the ratio of the number of halogen atoms relative to the combined total of halogen atoms and hydrogen atoms within the halogenated alkyl group (namely, the halogenation ratio (%)) is preferably within a range from 10 to 100%, more preferably from 50 to 100%, and is most preferably 100%. Higher values for the halogenation ratio are preferred, as they result in stronger acid strength.

The aryl group for $R^{4''}$ is preferably an aryl group of 6 to 20 carbon atoms.

The alkenyl group for $R^{4''}$ is preferably an alkenyl group of 2 to 10 carbon atoms.

In $R^{4''}$, the description that the group "may have a substituent" means that some or all of the hydrogen atoms within the linear, branched or cyclic alkyl group, the halogenated alkyl group, the aryl group or the alkenyl group may be substituted with a substituent (an atom other than a hydrogen atom or a group).

The number of such substituents within $R^{4''}$ may be either 1, or 2 or more.

Examples of the substituent include a halogen atom, hetero atom, alkyl group, or group represented by a formula: X-$Q^1$- (wherein $Q^1$ represents a divalent linking group containing an oxygen atom and X represents a hydrocarbon group of 3 to 30 carbon atoms that may have a substituent).

Examples of the halogen atom and alkyl group include the same atoms and groups exemplified above in relation to the halogen atom and alkyl group within the halogenated alkyl group for $R^{4''}$.

Examples of the hetero atom include an oxygen atom, nitrogen atom or sulfur atom.

In the group represented by X-$Q^1$-, $Q^1$ represents a divalent linking group containing an oxygen atom.

$Q^1$ may include atoms other than the oxygen atom. Examples of these atoms other than the oxygen atom include a carbon atom, hydrogen atom, oxygen atom, sulfur atom and nitrogen atom.

Examples of the divalent linking group containing an oxygen atom include non-hydrocarbon-based oxygen atom-containing linking groups such as an oxygen atom (an ether linkage, —O—), an ester linkage (—C(=O)—O—), an amide linkage (—C(=O)—NH—), a carbonyl group (—C(=O)—) and a carbonate linkage (—O—C(=O)—O—); and combinations of an aforementioned non-hydrocarbon-based oxygen atom-containing linking group and an alkylene group.

Examples of such combinations include groups represented by —$R^{91}$—O—, —$R^{92}$—O—C(=O)— and —C(=O)—O—$R^{93}$—O—C(=O)— (wherein $R^{91}$ to $R^{93}$ each independently represents an alkylene group).

The alkylene groups for $R^{91}$ to $R^{93}$ each preferably represents a linear or branched alkylene group, wherein the number of carbon atoms within the alkylene group is typically from 1 to 12, more preferably from 1 to 5, and most preferably from 1 to 3.

Specific examples of such alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$; an ethylene group [—$CH_2CH_2$—]; alkylethylene groups such as —CH($CH_3$)$CH_2$—, —CH($CH_3$)CH (CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$-]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$-].

As Q$^1$, a divalent linking group containing an ester linkage or ether linkage is preferred, and of such linking groups, groups represented by —R$^{91}$—O—, —R$^{92}$—O—C(=O)— and —C(=O)—O—R$^{93}$—O—C(=O)— are preferred.

In the group represented by X-Q$^1$-, the hydrocarbon group represented by X may be either an aromatic hydrocarbon group or an aliphatic hydrocarbon group.

The aromatic hydrocarbon group is a hydrocarbon group that contains an aromatic ring. The number of carbon atoms within the aromatic hydrocarbon group is preferably within a range from 3 to 30 carbon atoms, more preferably from 5 to 30 carbon atoms, still more preferably from 5 to 20 carbon atoms, still more preferably from 6 to 15 carbon atoms, and most preferably from 6 to 12 carbon atoms. This number of carbon atoms does not include any carbon atoms within any substituents.

Specific examples of the aromatic hydrocarbon group include aryl groups in which one hydrogen atom has been removed from an aromatic hydrocarbon ring such as a phenyl group, biphenyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The number of carbon atoms within the alkyl chain of the arylalkyl group is preferably from 1 to 4, more preferably from 1 to 2, and is most preferably 1.

The aromatic hydrocarbon group may have a substituent. For example, some of the carbon atoms that constitute the aromatic ring of the aromatic hydrocarbon group may be substituted with a hetero atom, or some of the hydrogen atoms bonded to the aromatic ring of the aromatic hydrocarbon group may be substituted with a substituent.

Examples of the former case include heteroaryl groups in which some of the carbon atoms that constitute the aromatic ring of an aforementioned aryl group have been substituted with a hetero atom such as an oxygen atom, sulfur atom or nitrogen atom, and heteroarylalkyl groups in which some of the carbon atoms that constitute the aromatic hydrocarbon ring within an aforementioned arylalkyl group have been substituted with an aforementioned hetero atom.

Examples of the substituent within the aromatic hydrocarbon group in the latter case include an alkyl group, alkoxy group, halogen atom, halogenated alkyl group, hydroxyl group or oxygen atom (=O).

As the alkyl group for the substituent within the aromatic hydrocarbon group, an alkyl group of 1 to 5 carbon atoms is preferred, and a methyl group, ethyl group, propyl group, n-butyl group or tert-butyl group is the most preferred.

As the alkoxy group for the substituent within the aromatic hydrocarbon group, an alkoxy group of 1 to 5 carbon atoms is preferred, a methoxy group, ethoxy group, n-propoxy group, iso-propoxy group, n-butoxy group or tert-butoxy group is more preferred, and a methoxy group or ethoxy group is the most desirable.

Examples of the halogen atom for the substituent within the aromatic hydrocarbon group include a fluorine atom, chlorine atom, bromine atom or iodine atom, and a fluorine atom is preferred.

Examples of the halogenated alkyl group for the substituent within the aromatic hydrocarbon group include groups in which some or all of the hydrogen atoms within an aforementioned alkyl group have been substituted with the aforementioned halogen atoms.

The aliphatic hydrocarbon group for X may be either a saturated aliphatic hydrocarbon group or an unsaturated aliphatic hydrocarbon group. Further, the aliphatic hydrocarbon group may be a linear, branched or cyclic group.

In the aliphatic hydrocarbon group for X, some of the carbon atoms that constitute the aliphatic hydrocarbon group may be substituted with a substituent that contains a hetero atom, and some or all of the hydrogen atoms that constitute the aliphatic hydrocarbon group may also be substituted with substituents that contain a hetero atom.

There are no particular limitations on this "hetero atom" within the group X, as long as it is an atom other than a carbon atom or hydrogen atom, and examples include a halogen atom, oxygen atom, sulfur atom or nitrogen atom. Examples of the halogen atom include a fluorine atom, chlorine atom, iodine atom and bromine atom.

The substituent that contains a hetero atom may be composed solely of the hetero atom, or may be a group that includes a group or atom(s) other than the hetero atom. Specific examples of the substituent that may substitute some of the carbon atoms include —O—, —C(=O)—O—, —C(=O)—, —O—C(=O)—O—, —C(=O)—NH—, —NH— (wherein the H may be substituted with a substituent such as an alkyl group or acyl group), —S—, —S(=O)$_2$—, and —S(=O)$_2$—O—. These substituents may be included within the cyclic structure in those cases where the aliphatic hydrocarbon group is a cyclic group.

Specific examples of the substituent that may substitute some or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or ethoxy group.

Examples of the halogen atom include a fluorine atom, chlorine atom, bromine atom or iodine atom, and a fluorine atom is preferred.

Examples of the halogenated alkyl group include groups in which some or all of the hydrogen atoms of an alkyl group of 1 to 5 carbon atoms such as a methyl group, ethyl group, propyl group, n-butyl group or tert-butyl group have been substituted with the type of halogen atom described above.

As the aliphatic hydrocarbon group, a linear or branched saturated hydrocarbon group, a linear or branched monovalent unsaturated hydrocarbon group, or a cyclic aliphatic hydrocarbon group (an aliphatic cyclic group) is preferred.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decanyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group, or docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of the linear monovalent unsaturated hydrocarbon group include a vinyl group, propenyl group (allyl group) or butynyl group. Examples of the branched monovalent unsaturated hydrocarbon group include a 1-methylpropenyl group or 2-methylpropenyl group.

As the unsaturated hydrocarbon group, of the above, a propenyl group is particularly preferred.

The aliphatic cyclic group may be either a monocyclic group or a polycyclic group. The number of carbon atoms within the aliphatic cyclic group is preferably within a range from 3 to 30, more preferably from 5 to 30, still more preferably from 5 to 20, still more preferably from 6 to 15, and most preferably from 6 to 12.

Specific examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In those cases where the aliphatic cyclic group does not include a substituent containing a hetero atom within the ring structure, the aliphatic cyclic group is preferably a polycyclic group, is more preferably a group in which one or more hydrogen atoms have been removed from a polycycloalkane, and is most preferably a group in which one or more hydrogen atoms have been removed from adamantane.

In those cases where the aliphatic cyclic group includes a substituent containing a hetero atom within the ring structure, the substituent containing the hetero atom is preferably —O—, —C(=O)—O—, —S—, —S(=O)$_2$—, or —S(=O)$_2$—O—. Specific examples of this type of aliphatic cyclic group include groups of the formulas (L1) to (L5) and (S1) to (S4) shown below.

[Chemical Formula 29]

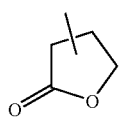
(L1)

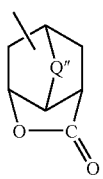
(L2)

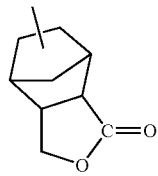
(L3)

-continued

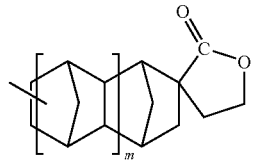
(L4)

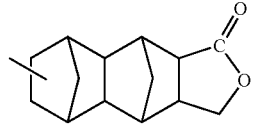
(L5)

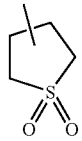
(S1)

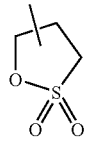
(S2)

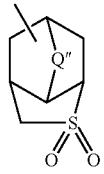
(S3)

(S4)

wherein Q" represents an alkylene group of 1 to 5 carbon atoms, —O—, —S—, —O—R$^{94}$— or —S—R$^{95}$—, wherein R$^{94}$ and R$^{95}$ each independently represents an alkylene group of 1 to 5 carbon atoms, and m represents an integer of 0 or 1.

In the above formulas, the alkylene groups for Q", R$^{94}$ and R$^{95}$ are each as defined above for the alkylene groups for R$^{91}$ to R$^{93}$.

Within these aliphatic cyclic groups, some of the hydrogen atoms bonded to the carbon atoms that constitute the ring structure may be substituted with substituents. Examples of these substituents include an alkyl group, alkoxy group, halogen atom, halogenated alkyl group, hydroxyl group or oxygen atom (=O).

As the alkyl group, an alkyl group of 1 to 5 carbon atoms is preferred, and a methyl group, ethyl group, propyl group, n-butyl group or tert-butyl group is particularly desirable.

Examples of the alkoxy group or halogen atom include the same alkoxy groups or halogen atoms as those exemplified above for the substituent that may substitute some or all of the hydrogen atoms.

In the present invention, X is preferably a cyclic group that may have a substituent. The cyclic group may be an aromatic hydrocarbon group that may have a substituent or an aliphatic cyclic group that may have a substituent.

As the aromatic hydrocarbon group that may have a substituent, a naphthyl group that may have a substituent or a phenyl group that may have a substituent is preferred.

As the aliphatic cyclic group that may have a substituent, a polycyclic aliphatic cyclic group that may have a substituent is preferred. As this polycyclic aliphatic cyclic group, the aforementioned groups in which one or more hydrogen atoms have been removed from a polycycloalkane, and the groups represented by formulas (L2) to (L5) and (S3) to (S4) above are preferred.

In the present invention, $R^{4''}$ preferably includes a group represented by X-$Q^1$- as a substituent. In such cases, $R^{4''}$ is preferably a group represented by a formula: X-$Q^1$-$Y^1$-, wherein $Q^1$ and X are as defined above, and $Y^1$ represents an alkylene group of 1 to 4 carbon atoms that may have a substituent or a fluorinated alkylene group of 1 to 4 carbon atoms that may have a substituent.

In the group represented by X-$Q^1$-$Y^1$-, examples of the alkylene group for $Y^1$ include those alkylene groups exemplified above for $Q^1$ that contain from 1 to 4 carbon atoms.

Examples of the fluorinated alkylene group include groups in which some or all of the hydrogen atoms of an above alkylene group have been substituted with fluorine atoms.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, CH($CH_2CH_3$)—, —$C(CH_3)_2$—, —$CH_2CH_2CH_2CH_2$—, —$CH(CH_3)$$CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —CH($CH_2CH_2CH_3$)—, and —$C(CH_3)(CH_2CH_3)$—.

As $Y^1$, fluorinated alkylene groups are preferred, and fluorinated alkylene groups in which the carbon atom bonded to the adjacent sulfur atom is fluorinated are particularly desirable. Examples of this type of fluorinated alkylene group include —$CF_2$—, —$CF_2CF_2$—, —$CF_2CF_2CF_2$—, —CF($CF_3$)$CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2$$CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these groups, —$CF_2$—, —$CF_2CF_2$—, —$CF_2CF_2CF_2$— or $CH_2CF_2CF_2$— is preferred, —$CF_2$—, —$CF_2CF_2$— or —$CF_2CF_2CF_2$— is more preferable, and —$CF_2$— is particularly desirable.

The alkylene group or fluorinated alkylene group for $Y^1$ may have a substituent.

The expression that the alkylene group or fluorinated alkylene group "may have a substituent" means that some or all of the hydrogen atoms or fluorine atoms within the alkylene group or fluorinated alkylene group may be substituted with an atom other than a hydrogen atom or fluorine atom, or with a group.

Examples of the substituent with which the alkylene group or fluorinated alkylene group may be substituted include an alkyl group of 1 to 4 carbon atoms, an alkoxy group of 1 to 4 carbon atoms, and a hydroxyl group.

In formula (b-2), $R^{5''}$ and $R^{6''}$ each independently represents an aryl group or an alkyl group. At least one of $R^{5''}$ and $R^{6''}$ represents an aryl group. It is preferable that both of $R^{5''}$ and $R^{6''}$ represent aryl groups.

As the aryl group for $R^{5''}$ and $R^{6''}$, the same as the aryl groups for $R^{1''}$ to $R^{3''}$ can be exemplified.

As the alkyl group for $R^{5''}$ and $R^{6''}$, the same as the alkyl groups for $R^{1''}$ to $R^{3''}$ can be exemplified.

It is particularly desirable that both of $R^{5''}$ and $R^{6''}$ represent phenyl groups.

As $R^{4''}$ in formula (b-2), the same as those mentioned above for $R^{4''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of any of these onium salts has been replaced by an alkylsulfonate such as a methanesulfonate, n-propanesulfonate, n-butanesulfonate, or n-octanesulfonate.

Furthermore, it is also possible to use onium salts in which the anion moiety of any of the above onium salts has been replaced by an anion moiety represented by one of formulas (b1) to (b7) shown below.

[Chemical Formula 30]

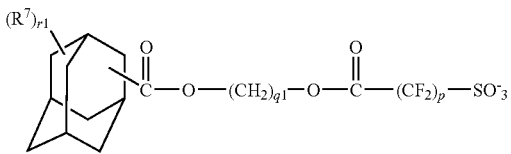
(b1)

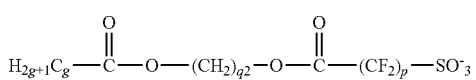
(b2)

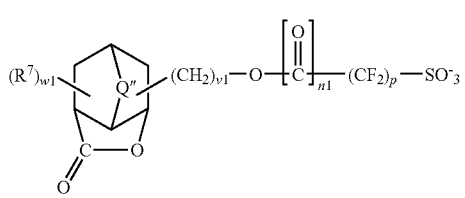
(b3)

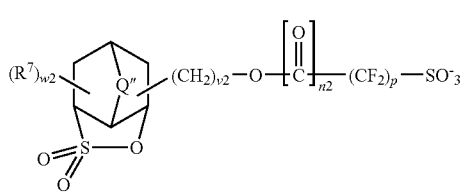
(b4)

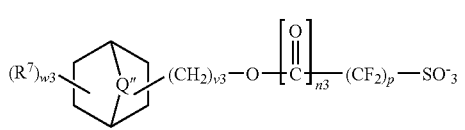
(b5)

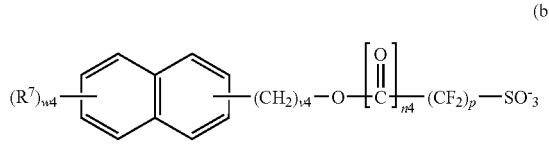
(b6)

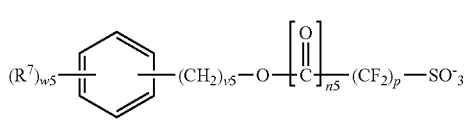
(b7)

wherein p represents an integer of 1 to 3, q1 and q2 each independently represents an integer of 1 to 5, r1 represents an integer of 0 to 3, g represents an integer of 1 to 20, $R^7$ represents a substituent, n1 to n5 each independently represents either 0 or 1, v1 to v5 each independently represents an integer of 0 to 3, w1 to w5 each independently represents an integer of 0 to 3, and Q" is as defined above.

Examples of the substituent for $R^7$ include the substituents for the aliphatic hydrocarbon group and the substituents for the aromatic hydrocarbon group exemplified above in connection with the group X.

In those cases where the subscript appended to $R^7$ (namely, r1 or w1 to w5) is an integer of 2 or greater, the plurality of $R^7$ groups within the compound may be the same or different.

Further, onium salt-based acid generators in which the anion moiety in general formula (b-1) or (b-2) is replaced by an anion moiety represented by general formula (b-3) or (b-4) shown below (and in which the cation moiety is the same as (b-1) or (b-2)) may also be used.

[Chemical Formula 31]

(b-3)

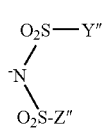
(b-4)

wherein X" represents an alkylene group of 2 to 6 carbon atoms in which at least one hydrogen atom has been substituted with a fluorine atom, and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group has 1 to 10 carbon atoms, preferably 1 to 7 carbon atoms, and most preferably 1 to 3 carbon atoms.

Within the above-mentioned ranges for the number of carbon atoms, the smaller the number of carbon atoms within the alkylene group for X" or the alkyl group for Y" and Z", the more the solubility in a resist solvent can be improved.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved. The amount of fluorine atoms within the alkylene group or alkyl group, namely the fluorination ratio, is preferably within a range from 70 to 100% and more preferably from 90 to 100%, and it is particularly desirable that the alkylene group or alkyl group is a perfluoroalkylene or perfluoroalkyl group in which all of the hydrogen atoms are substituted with fluorine atoms.

Furthermore, a sulfonium salt having a cation moiety represented by general formula (b-5) or (b-6) shown below may also be used as an onium salt-based acid generator.

[Chemical Formula 32]

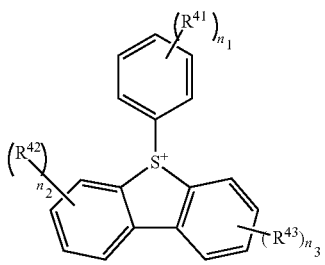
(b-5)

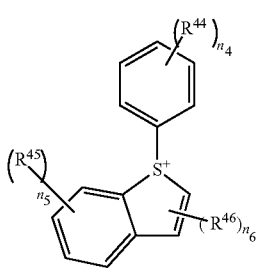

(b-6)

wherein $R^{41}$ to $R^{46}$ each independently represents an alkyl group, an acetyl group, an alkoxy group, a carboxyl group, a hydroxyl group or a hydroxyalkyl group, $n_1$ to $n_5$ each independently represents an integer of 0 to 3, and $n_6$ represents an integer of 0 to 2.

The alkyl group for each of $R^{41}$ to $R^{46}$ is preferably an alkyl group of 1 to 5 carbon atoms, and of these, a linear or branched alkyl group is preferred, and a methyl group, ethyl group, propyl group, isopropyl group, n-butyl group or tert-butyl group is particularly desirable.

The alkoxy group is preferably an alkoxy group of 1 to 5 carbon atoms, and of these, a linear or branched alkoxy group is preferred, and a methoxy group or ethoxy group is particularly desirable.

The hydroxyalkyl group is preferably a group in which one or more of the hydrogen atoms within an above-mentioned alkyl group have been substituted with a hydroxyl group, and specific examples include a hydroxymethyl group, hydroxyethyl group and hydroxypropyl group.

When the subscripts $n_1$ to $n_6$ appended to $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by formula (b-5) or (b-6) is not particularly limited, and the same anion moieties as those used in previously proposed onium salt-based acid generators may be used. Examples of such anion moieties include fluorinated alkylsulfonate ions such as anion moieties ($R^{4"}SO_3^-$) for onium salt-based acid generators represented by general formula (b-1) or (b-2) shown above; and anion moieties represented by general formula (b-3) or (b-4) shown above. Among these, fluorinated alkylsulfonate ions are preferable, fluorinated alkylsulfonate ions of 1 to 4 carbon atoms are more preferable, and linear perfluoroalkylsulfonate ions of 1 to 4 carbon atoms are particularly desirable. Specific examples include a trifluoromethylsulfonate ion, heptafluoro-n-propylsulfonate ion and nonafluoro-n-butylsulfonate ion.

In the present description, an oxime sulfonate-based acid generator is a compound having at least one group represented by general formula (B-1) shown below, and has a feature of generating acid by irradiation. Such oxime sulfonate-based acid generators are widely used for chemically amplified resist compositions, and any of these conventional compounds may be appropriately selected.

[Chemical Formula 33]

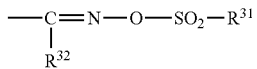

(B-1)

wherein $R^{31}$ and $R^{32}$ each independently represents an organic group.

The organic group for $R^{31}$ and $R^{32}$ refers to a group containing a carbon atom, and may include atoms other than carbon atoms (such as a hydrogen atom, an oxygen atom, a nitrogen atom, a sulfur atom, or a halogen atom (such as a fluorine atom or a chlorine atom)).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms that has no substituent or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 34]

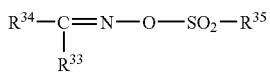

(B-2)

wherein $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 35]

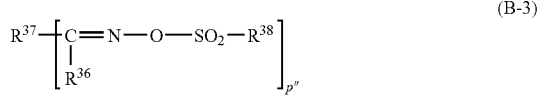

(B-3)

wherein $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group represented by $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has at least 50%, more preferably 70% or more, and most preferably 90% or more of the hydrogen atoms of the alkyl group fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which some of the carbon atoms constituting the ring(s) of these groups are substituted with a hetero atom such as an oxygen atom, a sulfur atom, or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group for the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group represented by $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has at least 50%, more preferably 70% or more, and still more preferably 90% or more of the hydrogen atoms of the alkyl group fluorinated. A completely fluorinated alkyl group in which 100% of the hydrogen atoms are substituted with fluorine atoms is particularly desirable.

In general formula (B-3), the alkyl group having no substituent and the halogenated alkyl group represented by $R^{36}$ are the same as the alkyl group having no substituent and the halogenated alkyl group described for $R^{33}$.

Examples of the divalent or trivalent aromatic hydrocarbon group represented by $R^{37}$ include groups in which one or two additional hydrogen atoms have been removed from the aryl group for $R^{34}$.

Examples of the alkyl group having no substituent or the halogenated alkyl group represented by $R^{38}$ include the same groups as the alkyl groups having no substituent or the halogenated alkyl groups exemplified above for $R^{35}$.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 85) may also be used favorably.

Furthermore, preferred oxime sulfonate-based acid generators include the compounds shown below.

[Chemical Formula 36]

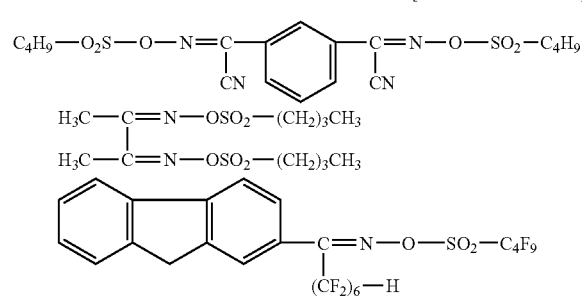

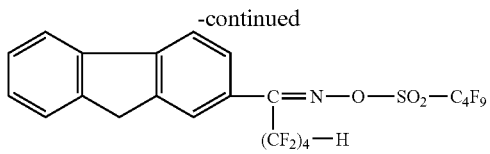

Of the above diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator may be used, or two or more types may be used in combination.

The total amount of the component (B) within the positive resist composition is typically within a range from 0.5 to 50 parts by weight, and preferably 1 to 40 parts by weight, relative to 100 parts by weight of the component (A). When the amount of the component (B) is within the above range, formation of a resist pattern can be satisfactorily performed. Further, by virtue of the above-mentioned range, a uniform solution can be obtained and the storage stability becomes satisfactory.

[Optional Components]

The positive resist composition of the present invention may include a nitrogen-containing organic compound (D) (hereafter referred to as "component (D)") as an optional component.

As the component (D), any compound that acts as an acid diffusion inhibitor, namely, a quencher that traps the acid generated from the component (B) upon exposure, may be used without any particular limitations. A multitude of these types of compounds have already been proposed, and any of these known compounds may be used, although a cyclic amine or an aliphatic amine, and particularly a secondary aliphatic amine or tertiary aliphatic amine is preferable. Here, the term "aliphatic amine" describes an amine having one or more aliphatic groups, wherein the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (such as alkylamines or alkyl alcohol amines). Specific examples of alkylamines and alkyl alcohol amines include monoalkylamines such as n-hexylamine, n-heptylamine, n-octylamine, n-nonylamine and n-decylamine; dialkylamines such as diethylamine, di-n-propylamine, di-n-heptylamine, di-n-octylamine and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine; and alkyl alcohol amines such as diethanolamine, triethanolamine, diisopropanolamine, triisopropanolamine, di-n-octanolamine and tri-n-octanolamine. Among these, alkyl alcohol amines and trialkylamines are preferred.

Examples of cyclic amines include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds may be used either alone, or in combinations of two or more different compounds.

The component (D) is typically used in an amount within a range from 0.01 to 5.0 parts by weight, relative to 100 parts by weight of the component (A). Using an amount within this range improves the resist pattern shape and the post exposure stability of the latent image formed by the pattern-wise exposure of the resist layer.

Furthermore, in order to prevent any deterioration in sensitivity, and improve the resist pattern shape and the post exposure stability of the latent image formed by the pattern-wise exposure of the resist layer, at least one compound (E) (hereafter referred to as "component (E)") selected from the group consisting of organic carboxylic acids, phosphorus oxo acids and derivatives thereof may be added to the positive resist composition.

Examples of the organic carboxylic acids include acetic acid, malonic acid, citric acid, malic acid, succinic acid, benzoic acid and salicylic acid.

Examples of the phosphorus oxo acids or derivatives thereof include phosphoric acid, phosphonic acid and phosphinic acid, and of these, phosphonic acid is particularly desirable.

Examples of the phosphorus oxo acid derivatives include esters in which a hydrogen atom within an above-mentioned oxo acid is substituted with a hydrocarbon group. Examples of the hydrocarbon group include an alkyl group of 1 to 5 carbon atoms or an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one compound may be used alone, or two or more compounds may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention.

Examples of such miscible additives include additive resins for improving the performance of coating films of the resist composition, surfactants for improving the applicability, dissolution inhibitors, plasticizers, stabilizers, colorants, halation prevention agents, and dyes.

[Component (S)]

The component (S) may be any organic solvent which can dissolve the respective components described above to give a uniform solution, and any one or more kinds of organic solvents may be selected from those which have been conventionally known as solvents for a resist compositions.

Specific examples of the solvent include lactones such as γ-butyrolactone; ketones such as acetone, methyl ethyl ketone, cyclohexanone, methyl isopentyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol, and the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate and ethyl ethoxypropionate. Moreover, the alcohol-based solvents, fluorine-based solvents and ether-based organic solvents having no hydroxyl group described below may also be used. These solvents may be used individually, or as mixed solvents containing two or more different solvents.

Among these solvents, in those cases where the positive resist composition is used as the first chemically amplified resist composition, propylene glycol monomethyl ether acetate (PGMEA), ethyl lactate (EL) and propylene glycol monomethyl ether (PGME) are preferred as the component (S). Of these, a combination of propylene glycol monomethyl ether acetate (PGMEA) and a polar solvent is particularly desirable. The mixing ratio (weight ratio) of such a mixed solvent can be determined appropriately with due consideration of the compatibility of the PGMEA with the polar solvent, but is preferably in a range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

In the component (S), any one or more of the above organic solvents may be used.

There are no particular limitations on the amount used of the component (S), although typically an amount is used that ensures that the chemically amplified resist composition is a liquid having a concentration that enables ready application to the support.

<Negative Resist Composition>

The chemically amplified negative resist composition of the present invention generally includes a resin component (A') that is soluble in an alkali developing solution (an alkali-soluble resin) (hereafter referred to as "component (A')"), an acid generator component (B') (hereafter referred to as "component (B')") that generates acid upon exposure, and a cross-linker (C') (hereafter referred to as "component (C')") dissolved in an organic solvent (S') (hereafter referred to as "component (S')").

In this negative resist composition, when acid is generated from the component (B') upon exposure, the action of that acid causes cross-linking between the component (A') and the component (C'), causing the negative resist composition to change from a state that is soluble in an alkali developing solution to a state that is insoluble in an alkali developing solution. Accordingly, during formation of a resist pattern, by selectively irradiating a resist film obtained by applying the negative resist composition to a support such as a substrate, the exposed portions become insoluble in an alkali developing solution, whereas the unexposed portions remain soluble in an alkali developing solution, meaning alkali developing can then be conducted.

There are no particular limitations on the negative resist composition, which may be appropriately selected from among conventional negative resist compositions in accordance with factors such as the exposure source and the lithography properties.

[Component (A')]

The component (A') may be selected appropriately from the numerous alkali-soluble resins proposed for conventional chemically amplified negative resist compositions for use with a KrF excimer laser, ArF excimer laser or the like, with due consideration of the type of exposure source used during resist pattern formation. Specific examples of these alkali-soluble resins include novolak resins having hydrophilic groups (such as hydroxyl groups or carboxyl groups), PHS-based resins and acrylic resins. Any of these resins may be used individually, or two or more different resins may be used in combination.

In the negative resist composition used in the present invention, the component (A') is preferably an alkali-soluble resin having a fluorinated hydroxyalkyl group (such as a group represented by general formula (a1'-1-1) shown below).

Specific examples of preferred forms of the component (A') include resins (A1') that contain a structural unit (a1') containing, within the main chain, an aliphatic cyclic group having a fluorinated hydroxyalkyl group.

Further, another preferred form of the component (A') besides the resin (A1') is a resin (A2') that contains a structural unit containing an aliphatic cyclic group having a fluorinated hydroxyalkyl group, and preferably also contains a structural unit derived from an acrylate ester containing a hydroxyl group-containing aliphatic cyclic group, and/or a structural unit derived from an acrylic acid that has no cyclic structure and has an alcoholic hydroxyl group on a side chain.

[Resin (A1')]

The resin (A1') includes a structural unit (a1') containing, within the main chain, an aliphatic cyclic group having a fluorinated hydroxyalkyl group.

Further, the resin (A1') preferably also includes, in addition to the structural unit (a1'), a structural unit (a2') having a hydroxyalkyl group (hereafter abbreviated as "structural unit (a2')").

Structural Unit (a1')

In the structural unit (a1'), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one, and preferably two or more carbon atoms within the ring structure of the aliphatic cyclic group constitute part of the main chain of the resin (A1').

In the present invention, using a component (A') that includes the resin (A1') containing the structural unit (a1') enhances the solubility of the resist composition within an alkali developing solution, and ensures excellent lithography properties such as the resist pattern shape and the line width roughness (LWR). Further, because the resin (A1') includes the aliphatic cyclic group (such as a norbornane or tetracyclododecane structure) within the main chain, the carbon density is increased, yielding an improvement in the etching resistance.

Here, a "fluorinated hydroxyalkyl group" refers to a hydroxyalkyl group, in which a portion of the hydrogen atoms of an alkyl group have been substituted with hydroxyl groups, wherein some or all of the remaining hydrogen atoms within the hydroxyalkyl group, besides the hydrogen atom of the hydroxyl group, have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group. Although there are no particular limitations on the number of carbon atoms within the alkyl group, the number of carbon atoms is preferably within a range from 1 to 20, more preferably from 4 to 16, and most preferably from 4 to 12.

There are no particular limitations on the number of hydroxyl groups within the fluorinated hydroxyalkyl group, although a single hydroxyl group is preferred.

As the fluorinated hydroxyalkyl group, groups in which a fluorinated alkyl group and/or a fluorine atom is bonded to the carbon atom to which the hydroxyl group is bonded (hereafter referred to as the α-position carbon atom of the hydroxyalkyl group) are preferred.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The "aliphatic cyclic group" within the "aliphatic cyclic group having a fluorinated hydroxyalkyl group" may be either a monocyclic group or a polycyclic group. In the structural unit (a1'), a polycyclic group is preferred as it provides superior etching resistance.

The aliphatic cyclic group includes both hydrocarbon groups formed solely from carbon and hydrogen (namely, alicyclic groups), and heterocyclic groups in which some of the carbon atoms that constitute the ring structure of an alicyclic group have been substituted with a hetero atom such as an oxygen atom, nitrogen atom, or sulfur atom. These aliphatic cyclic groups may have a substituent, and examples of the substituent include alkyl groups of 1 to 5 carbon atoms.

The expression "have a substituent" means that some or all of the hydrogen atoms bonded to the carbon atoms that constitute the ring structure of the aliphatic cyclic group are substituted with substituents (atoms other than a hydrogen atom, or groups). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Specific examples of the aliphatic cyclic group include the groups described below.

Examples of the monocyclic groups include groups in which two or more hydrogen atoms have been removed from a cycloalkane. Specific examples include groups in which two or two hydrogen atoms have been removed from cyclopentane or cyclohexane, and groups in which two or more hydrogen atom have been removed from cyclohexane are preferred.

Examples of the polycyclic groups include groups in which two or more hydrogen atoms have been removed from a bicycloalkane, a tricycloalkane or a tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions designed for use in ArF excimer laser processes.

Of the various possibilities, groups in which two or more hydrogen atoms have been removed from cyclohexane, adamantane, norbornane or tetracyclododecane are readily available industrially, and are consequently preferred.

Of the alicyclic groups exemplified above, groups such as those shown in a structural unit (a1'-1) below, in which three hydrogen atoms have been removed from norbornane or tetracyclododecane, are preferred, and groups in which three hydrogen atoms have been removed from norbornane are particularly desirable.

As the structural unit (a1'), structural units (a1'-1) represented by general formula (a1'-1) shown below are preferred. By including the structural unit (a1'-1), the solubility of the resin in an alkali developing solution improves significantly. Furthermore, the lithography properties such as the resolution are also improved.

[Chemical Formula 37]

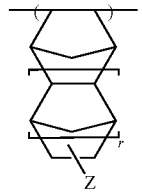

(a1'-1)

wherein Z represents a fluorinated hydroxyalkyl group, and r is either 0 or 1.

In formula (a1'-1), r is either 0 or 1, and in terms of industrial availability, is preferably 0.

Further, in formula (a1'-1), examples of the "fluorinated hydroxyalkyl group" represented by Z include the same groups as those exemplified above.

Of these, Z is preferably a group represented by general formula (a1'-1-1) shown below, as such groups yield a particularly superior resist pattern shape as well as reduced levels of line edge roughness (LER) and the like. The term "line edge roughness (LER)" refers to non-uniform unevenness in the side walls of pattern lines.

[Chemical Formula 38]

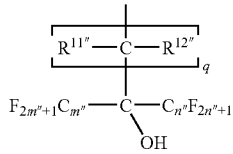

(a1'-1-1)

wherein $R^{11''}$ and $R^{12''}$ each independently represents a hydrogen atom or a lower alkyl group, m'' and n'' each independently represents an integer of 1 to 5, and q also represents an integer of 1 to 5.

In formula (a1'-1-1), $R^{11''}$ and $R^{12''}$ each independently represents a hydrogen atom or a lower alkyl group.

As the lower alkyl group, a linear or branched lower alkyl group of not more than 5 carbon atoms is preferred, and specific examples thereof include a methyl group, ethyl group, propyl group, isopropyl group, n-butyl group, isobutyl group, tert-butyl group, pentyl group, isopentyl group or neopentyl group, and a methyl group is particularly desirable.

Of the various possibilities, groups in which $R^{11''}$ and $R^{12''}$ are both hydrogen atoms are particularly desirable.

q represents an integer of 1 to 5, and preferably an integer of 1 to 3, and is most preferably 1.

m'' and n'' each independently represents an integer of 1 to 5, and preferably an integer of 1 to 3. Groups in which m'' and n'' are both 1 are preferred in terms of ease of synthesis.

The structural unit (a1') may use either one type of structural unit, or a mixture of two or more types.

The amount of the structural unit (a1') within the resin (A1'), based on the combined total of all the structural units that constitute the component (A1'), is preferably within a range from 50 to 90 mol %, more preferably from 55 to 90 mol %, and still more preferably from 60 to 80 mol %. Making this amount at least as large as the lower limit of the above-mentioned range yields an improvement in the effects achieved by including the structural unit (a1'), whereas by ensuring that the amount is not more than the upper limit of the above-mentioned range, a good balance can be achieved with the other structural units.

Structural Unit (a2')

In addition to the structural unit (a1'), the resin (A1') preferably also includes a structural unit (a2') having a hydroxyalkyl group.

In the present invention, including a resin (A1') containing the structural unit (a2') within the component (A') improves the solubility within an alkali developing solution. Further, the cross-linking of the component (A') with the component (C') is enhanced, meaning the difference in the solubility within the alkali developing solution (the contrast) between the exposed portions and the unexposed portions can be increased, enabling the composition to function more effectively as a negative resist.

As the structural unit (a2'), units such as a structural unit (a210') that contains, within the main chain, an aliphatic cyclic group having a hydroxyalkyl group (hereafter abbreviated as "structural unit (a210')"), and a structural unit (a220') derived from an acrylate ester having a hydroxyl group-containing alkyl group (hereafter abbreviated as "structural unit (a220')") can be used favorably.

The structural unit (a2') may use either one type of structural unit, or a mixture of two or more types.

Structural Unit (a210')

In the present invention, the structural unit (a210') is a structural unit that contains, within the main chain, an aliphatic cyclic group having a hydroxyalkyl group.

Examples of the structural unit (a210') include the same units as those exemplified above for the structural unit (a1'), with the exception that the "fluorinated hydroxyalkyl group" within the structural unit (a1') is replaced with an unfluorinated hydroxyalkyl group, namely a hydroxyalkyl group in which a portion of the hydrogen atoms of an alkyl group have been substituted with hydroxyl groups, but the remaining hydrogen atoms have not been substituted with fluorine atoms.

As the structural unit (a210'), structural units (a2'-1) represented by general formula (a2'-1) shown below are preferred. By including the structural unit (a2'-1), lithography properties such as the resist pattern shape and the line width roughness (LWR) are improved. Further, a favorable contrast is more readily obtained, and the etching resistance also improves.

[Chemical Formula 39]

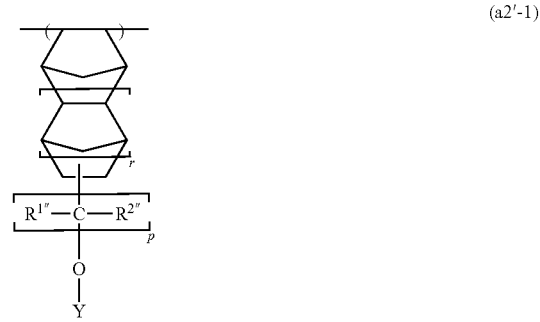

(a2'-1)

wherein $R^{1'''}$ and $R^{2'''}$ each independently represents a hydrogen atom or a lower alkyl group, Y represents a hydrogen atom or a hydroxyalkyl group, r represents either 0 or 1, and p represents an integer of 1 to 3.

The structural unit (a2'-1) represented by general formula (a2'-1) is a structural unit containing, within the main chain, a norbornane or tetracyclododecane structure having a hydroxyalkyl group.

In formula (a2'-1), $R^{1'''}$ and $R^{2'''}$ each independently represents a hydrogen atom or a lower alkyl group. Examples of the lower alkyl group include the same groups as those exemplified above for the lower alkyl groups represented by $R^{11''}$ and $R^{12''}$ in formula (a1'-1-1). Of the various possibilities, groups in which $R^{1'''}$ and $R^{2'''}$ are both hydrogen atoms are particularly desirable.

Y represents a hydrogen atom or a hydroxyalkyl group.

As the hydroxyalkyl group, a linear or branched hydroxyalkyl group of not more than 10 carbon atoms is preferred, a linear or branched hydroxyalkyl group of not more than 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y is most preferably a hydrogen atom.

r is either 0 or 1, and is preferably 0.

p represents an integer of 1 to 3, is preferably 1 or 2, and is most preferably 1.

Specific examples of the structural unit (a2'-1) include units represented by chemical formulas (a2'-1-1) to (a2'-1-7) shown below.

[Chemical Formula 40]

(a2'-1-1)

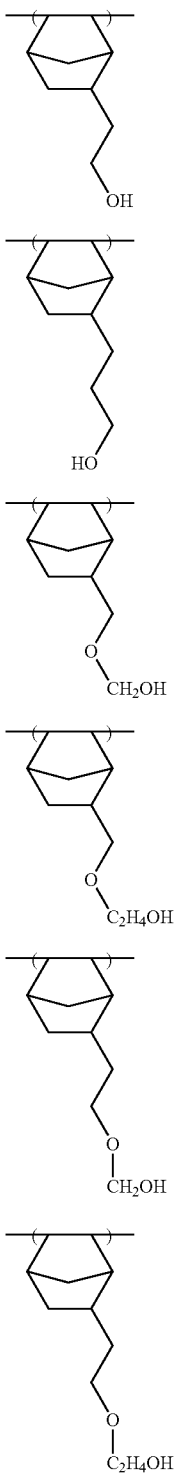

(a2'-1-2)

(a2'-1-3)

(a2'-1-4)

(a2'-1-5)

(a2'-1-6)

(a2'-1-7)

Of these structural units, those represented by the above chemical formulas (a2'-1-1), (a2'-1-2) and (a2'-1-3) are preferred.

The structural unit (a210') may use either one type of structural unit, or a mixture of two or more types.

The amount of the structural unit (a210') within the resin (A1'), based on the combined total of all the structural units that constitute the resin (A1'), is preferably within a range from 10 to 50 mol %, more preferably from 15 to 50 mol %, and still more preferably from 20 to 45 mol %. Making this amount at least as large as the lower limit of the abovementioned range improves the effects achieved by including the structural unit (a210') such as improving the alkali solubility and making a favorable contrast more readily obtainable. On the other hand, by ensuring that the amount is not more than the upper limit of the above-mentioned range, a good balance can be achieved with the other structural units.

Structural Unit (a220')

The structural unit (a220') is a structural unit derived from an acrylate ester having a hydroxyl group-containing alkyl group.

The hydroxyl group-containing alkyl group may be broadly classified into hydroxyl group-containing cyclic alkyl groups and hydroxyl group-containing chain-like alkyl groups.

If the structural unit (a220') is a structural unit that includes a hydroxyl group-containing cyclic alkyl group (hereafter abbreviated as "structural unit (a221')"), then the resist pattern swelling suppression effect is enhanced. Further, the resolution is also improved. Furthermore, favorable levels of contrast and etching resistance are also more readily obtained.

Examples of the structural unit (a221') include those units, amongst the structural units exemplified below in the description of a "structural unit (a22') derived from an acrylate ester containing a hydroxyl group-containing aliphatic cyclic group" that constitutes a resin (A2') described below, in which the aliphatic cyclic group is a saturated hydrocarbon group. Of these structural units, units in which the substituent bonded to the α-position of the acrylate ester is a fluorine atom or a fluorinated alkyl group are preferred, and this substituent is more preferably a fluorinated alkyl group, and most preferably a trifluoromethyl group (—$CF_3$).

If the structural unit (a220') is a structural unit that includes a hydroxyl group-containing chain-like alkyl group (hereafter abbreviated as "structural unit (a222')"), then the hydrophilicity of the entire component (A') is increased, the solubility of the component within an alkali developing solution is improved, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222') include those units, amongst the structural units exemplified below in the description of a "structural unit (a23') derived from an acrylic acid that has no cyclic structure and has an alcoholic hydroxyl group on a side chain" that constitutes the resin (A2') described below, that include a hydroxyalkyl group. Of these structural units, units having a hydroxyalkyl group at the ester portion of the acrylate ester are preferred, structural units in which the substituent bonded to the α-position of the acrylate ester is a fluorine atom or a fluorinated alkyl group are more preferred, and this substituent is still more preferably a fluorinated alkyl group, and most preferably a trifluoromethyl group (—$CF_3$).

The structural unit (a220') may use either one type of structural unit, or a mixture of two or more types.

The amount of the structural unit (a220') within the resin (A1'), based on the combined total of all the structural units that constitute the resin (A1'), is preferably within a range from 10 to 80 mol %, more preferably from 15 to 60 mol %, and still more preferably from 20 to 55 mol %. Making this amount at least as large as the lower limit of the above-mentioned range ensures that the effects obtained by including the structural unit (a220') are achieved, whereas by ensuring that the amount is not more than the upper limit of the above-mentioned range, a good balance can be achieved with the other structural units.

In those cases where the structural unit (a220') includes both the structural unit (a221') and the structural unit (a222'), the mixing ratio between the two structural units, reported as a molar ratio, is preferably such that the ratio of structural unit (a221'):structural unit (a222') is from 9:1 to 1:9, more preferably from 8:2 to 2:8, and most preferably from 6:4 to 7:3.

By including the structural unit (a221') and the structural unit (a222') in a favorable balance that satisfies the above-mentioned mixing ratio, a favorable exposure margin can be achieved. Further, a suitable level of contrast is obtained, and the resolution is improved. Moreover, the etching resistance also improves.

Other Structural Units

In the negative resist composition used in the present invention, besides the structural units (a1') and (a2') described above, the resin (A1') may also include other structural units typically used in the component (A') of conventional chemically amplified resist compositions.

However, in the present invention, the resin (A1') is preferably a resin in which the structural units (a1') and (a2') represent the main components.

Here the term "main components" means that the combined amount of the structural unit (a1') and the structural unit (a2') preferably represents at least 70 mol %, and more preferably 80 mol % or more, of all of the structural unit that constitute the resin (A1'). Of the various possibilities, resins that are formed solely of the structural units (a1') and (a2') are particularly desirable.

In the present invention, the combination of the structural unit (a1') and the structural unit (a2') within the resin (A1') is preferably a combination of the structural unit (a1') and the structural unit (a210'). Examples of this combination include the combinations of structural units represented by chemical formulas (A1'-1) to (A1'-4) shown below.

[Chemical Formula 41]

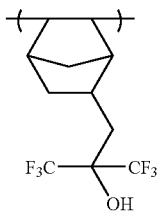

(A1'-1)

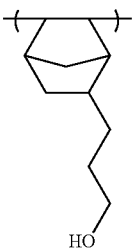

(A1'-2)

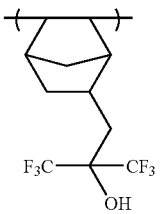

(A1'-3)

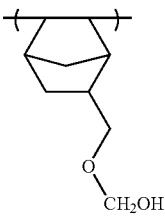

(A1'-4)

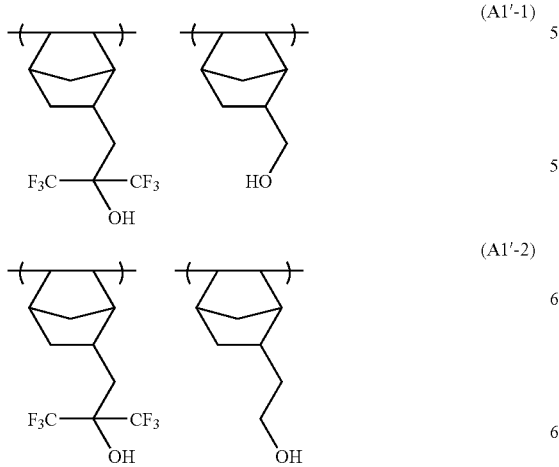

The weight average molecular weight (Mw, the polystyrene equivalent molecular weight measured by gel permeation chromatography) of the resin (A1') is preferably within a range from 2,000 to 10,000, more preferably from 3,000 to 6,000, and most preferably from 3,000 to 5,000. Ensuring that this molecular weight is at least as large as the lower limit of the above-mentioned range enables good contrast to be obtained, whereas ensuring the molecular weight is not more than the upper limit of the above-mentioned range can suppress swelling of the resist pattern. As a result, the resolution can be improved. Further, suppressing swelling of the pattern also yields an improvement in the depth of focus (DOF) properties and improved suppression of line edge roughness (LER). Furthermore, ensuring a weight average molecular weight within the above range is preferred in terms of achieving a large suppression effect on resist pattern swelling. Lower weight average molecular weights within the above-mentioned range tend to yield more favorable properties.

Further, the dispersity (Mw/Mn) is preferably within a range from 1.0 to 5.0, and is more preferably from 1.0 to 2.5.

When the resin (A1') is used in the component (A'), one type of the resin (A1') may be used alone, or a mixture of two or more types may be used.

In those cases where the resin (A1') is used, the proportion of the resin (A1') within the component (A') is preferably at least 70 mol %, more preferably 80 mol % or greater, and is most preferably 100 mol %.

[Resin (A2')]

The resin (A2') includes a structural unit containing an aliphatic cyclic group having a fluorinated hydroxyalkyl group (hereafter abbreviated as "structural unit (a21')").

Further, in addition to the structural unit (a21'), the resin (A2') preferably also includes a structural unit derived from an acrylate ester containing a hydroxyl group-containing aliphatic cyclic group (hereafter abbreviated as "structural unit (a22')").

Furthermore, in addition to the structural unit (a21'), or in addition to a combination of the structural unit (a21') and the structural unit (a22'), the resin (A2') preferably also includes a structural unit derived from an acrylic acid that has no cyclic structure and has an alcoholic hydroxyl group on a side chain (hereafter abbreviated as "structural unit (a23')").

Structural Unit (a21')

The structural unit (a21') is a structural unit that includes an aliphatic cyclic group having a fluorinated hydroxyalkyl group. Including the structural unit (a21') improves the solubility of the resin (A2') in an alkali developing solution. Further, swelling of the resist is suppressed, and lithography properties such as the pattern shape and LWR are improved.

The aliphatic cyclic group having a fluorinated hydroxyalkyl group is the same as that described above for the structural unit (a1'), and as the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a21') is preferably a structural unit derived from acrylic acid. A structure in which the above-mentioned aliphatic cyclic group is bonded to the oxygen atom (—O—) at the terminal of the carbonyloxy group [—C(O)—O—] of an acrylate ester (namely, a structure in which the hydrogen atom of the carboxyl group of acrylic acid has been substituted with the aliphatic cyclic group) is particularly desirable.

As the structural unit (a21'), structural units represented by general formula (1) shown below are preferred.

[Chemical Formula 42]

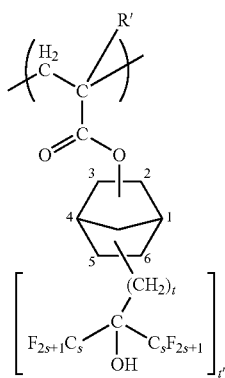

(1)

wherein R' represents a hydrogen atom, an alkyl group or a halogenated alkyl group, and s, t and t' each independently represents an integer of 1 to 5.

In formula (1), R' represents a hydrogen atom, an alkyl group or a halogenated alkyl group.

As the alkyl group for R', a lower alkyl group of not more than 5 carbon atoms is preferred, and examples thereof include a methyl group, ethyl group, propyl group, isopropyl group, n-butyl group, isobutyl group, tert-butyl group, pentyl group, isopentyl group or neopentyl group, and a methyl group is particularly desirable.

The halogenated alkyl group for R' is preferably a group in which at least one hydrogen atom of a lower alkyl group of not more than 5 carbon atoms has been substituted with a halogen atom. Specific examples of the alkyl group include the same groups as those exemplified above. Examples of the halogen atom include a fluorine atom, chlorine atom, bromine atom or iodine atom, and a fluorine atom is preferred. The hydrogen atoms substituted by the halogen atoms may represent some or all of the hydrogen atoms that constitute the alkyl group.

In the present invention, R' is preferably a hydrogen atom or an alkyl group, and in terms of industrial availability, is most preferably a hydrogen atom or a methyl group.

Each s independently represents an integer of 1 to 5, preferably an integer of 1 to 3, and most preferably 1.

t represents an integer of 1 to 5, preferably an integer of 1 to 3, and most preferably 1.

t' represents an integer of 1 to 3, preferably an integer of 1 to 2, and most preferably 1.

The structural unit represented by general formula (1) preferably has a 2-norbornyl group or 3-norbornyl group bonded to the terminal of the carboxyl group of the acrylic acid. The fluorinated alkyl alcohol is preferably bonded to the 5th or 6th position of the norbornyl group.

The structural unit (a21') may use either one type of structural unit, or a mixture of two or more types.

The amount of the structural unit (a21') within the resin (A2'), based on the combined total of all the structural units that constitute the resin (A2'), is preferably within a range from 10 to 90 mol %, more preferably from 20 to 90 mol %, still more preferably from 40 to 90 mol %, and most preferably from 45 to 85 mol %. Making this amount at least as large as the lower limit of the above-mentioned range ensures that the effects obtained by including the structural unit (a21') are achieved satisfactorily, whereas by ensuring that the amount is not more than the upper limit of the above-mentioned range, a good balance can be achieved with the other structural units.

Structural Unit (a22')

In addition to the structural unit (a21'), the resin (A2') preferably also includes a structural unit (a22') derived from an acrylate ester containing a hydroxyl group-containing aliphatic cyclic group.

When a resin (A2') that includes the structural unit (a22') is blended into the negative resist composition, the hydroxyl group (the alcoholic hydroxyl group) of this structural unit (a22') reacts with the component (C') under the action of the acid generated from the component (B'), and this reaction causes the resin (A2') to change from a state that is soluble in an alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those exemplified above in relation to the structural unit (a21').

As the aliphatic cyclic group of the structural unit (a22'), of the groups described above, a cyclohexyl group, adamantyl group, norbornyl group and tetracyclododecanyl group are readily available commercially, and are consequently preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a22'), the hydroxyl group-containing aliphatic cyclic group is preferably bonded to the ester group (—C(O)—O—) of the acrylate ester.

In such cases, in the structural unit (a22'), another substituent may be bonded to the α-position (the α-position carbon atom) of the acrylate ester instead of a hydrogen atom. Examples of preferred substituents include an alkyl group or a halogenated alkyl group.

Examples of these substituents are as described for R' in general formula (1) of the structural unit (a21') described above. Of the various moieties that can be bonded to the α-position, a hydrogen atom or an alkyl group is preferred, a hydrogen atom or a methyl group is more preferred, and a hydrogen atom is the most desirable.

As specific examples of the structural unit (a22'), structural units represented by general formula (2) shown below are preferred.

[Chemical Formula 43]

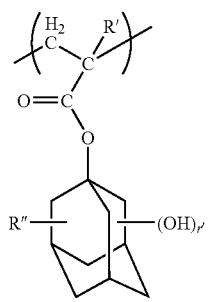

(2)

wherein R' is as defined above, R" represents a hydrogen atom, an alkyl group or an alkoxy group of 1 to 5 carbon atoms, and r' represents an integer of 1 to 3.

In formula (2), R' is as defined above for R' in general formula (1).

The alkyl group for R" is as defined for the alkyl group for R'.

In general formula (2), R' and R" are both most preferably hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a22') may use either one type of structural unit, or a mixture of two or more types.

The amount of the structural unit (a22') within the resin (A2'), based on the combined total of all the structural units that constitute the resin (A2'), is preferably within a range from 10 to 70 mol %, more preferably from 10 to 50 mol %, and still more preferably from 20 to 40 mol %. Making this amount at least as large as the lower limit of the above-mentioned range ensures that the effects obtained by including the structural unit (a22') are achieved satisfactorily, whereas by ensuring that the amount is not more than the upper limit of the above-mentioned range, a good balance can be achieved with the other structural units.

Structural Unit (a23')

In addition to the structural unit (a21'), or in addition to both the structural unit (a21') and the structural unit (a22'), the resin (A2') preferably also includes a structural unit (a23') derived from an acrylic acid that has no cyclic structure and has an alcoholic hydroxyl group on a side chain.

When a resin (A2') that includes the structural unit (a23') is blended into the negative resist composition, the alcoholic hydroxyl group of this structural unit (a23') reacts with the component (C'), together with the hydroxyl group of the structural unit (a22'), under the action of the acid generated from the component (B'). Accordingly, the resin (A2') changes more readily from a state that is soluble in an alkali developing solution to a state that is insoluble, which has the effect of improving the lithography properties such as the resolution. Further, thickness loss can also be suppressed. Furthermore, the controllability of the cross-linking reaction that occurs during pattern formation improves. Moreover, the film density also tends to increase. As a result, the heat resistance tends to improve. Moreover, the etching resistance also improves.

In the structural unit (a23'), the expression "has no cyclic structure" means that the structural unit includes no aliphatic cyclic group or aromatic group.

The structural unit (a23') is readily distinguishable from the structural unit (a22') as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a21').

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a23'), the hydroxyalkyl group preferably exists at either one, or both of these locations.

In those cases where the hydroxyalkyl group is not bonded to the α-position, the hydrogen atom at the α-position carbon atom may be replaced with an alkyl group or a halogenated alkyl group. These substituents are as defined above for R' within general formula (1).

As the structural unit (a23'), structural units represented by general formula (3) shown below are preferred.

[Chemical Formula 44]

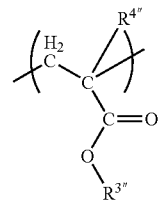

(3)

wherein $R^{4''}$ represents a hydrogen atom, an alkyl group, a halogenated alkyl group or a hydroxyalkyl group, and $R^{3''}$ represents a hydrogen atom, an alkyl group or a hydroxyalkyl group, provided that at least one of $R^{4''}$ and $R^{3''}$ represents a hydroxyalkyl group.

The hydroxyalkyl group for $R^{4''}$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or a hydroxyethyl group.

There are no particular limitations on the number of hydroxyl groups or the bonding positions of those groups, although one hydroxyl group is typical, and the hydroxyl group is preferably bonded to the terminal of the alkyl group.

The alkyl group for $R^{4''}$ is preferably an alkyl group of not more than 10 carbon atoms, more preferably an alkyl group of 2 to 8 carbon atoms, and most preferably an ethyl group or a methyl group.

The halogenated alkyl group for $R^{4''}$ is preferably a lower alkyl group of not more than 5 carbon atoms (most preferably an ethyl group or methyl group) in which some or all of the hydrogen atoms have been substituted with halogen atoms. Examples of the halogen atom include a fluorine atom, chlorine atom, bromine atom or iodine atom, and a fluorine atom is particularly desirable.

As the alkyl group and hydroxyalkyl group for $R^{3''}$, the same groups as the alkyl group and hydroxyalkyl group for $R^{4''}$ can be exemplified.

Specific examples of the structural units represented by general formula (3) include structural units derived from (α-hydroxyalkyl) acrylic acids (but not including structural units derived from acrylate esters), structural units derived from alkyl α-hydroxyalkyl) acrylate esters, and structural units derived from hydroxyalkyl (α-alkyl) acrylate esters.

Of these, including a structural unit derived from an alkyl (α-hydroxyalkyl) acrylate ester as the structural unit (a23') is preferred in terms of improving the film density, and of such units, structural units derived from ethyl (α-hydroxymethyl) acrylate or methyl (α-hydroxymethyl) acrylate are particularly desirable.

Furthermore, including a structural unit derived from a hydroxyalkyl (α-alkyl) acrylate ester as the structural unit (a23') is preferred in terms of improving the cross-linking efficiency. Of such units, structural units derived from hydroxyethyl α-methyl-acrylate or hydroxymethyl α-methyl-acrylate are particularly desirable.

The structural unit (a23') may use either one type of structural unit, or a mixture of two or more types.

The amount of the structural unit (a23') within the resin (A2'), based on the combined total of all the structural units that constitute the resin (A2'), is preferably within a range from 5 to 50 mol %, more preferably from 5 to 40 mol %, still more preferably from 5 to 30 mol %, and most preferably from 10 to 25 mol %. Making this amount at least as large as the lower limit of the above-mentioned range ensures that the effects obtained by including the structural unit (a23') are achieved satisfactorily, whereas by ensuring that the amount is not more than the upper limit of the above-mentioned range, a good balance can be achieved with the other structural units.
Other Structural Units Besides each of the structural units (a21') to (a23') described above, the resin (A2') may also include other copolymerizable structural units.

As such structural units, any of the structural units used in known resin components of conventional chemically amplified resist compositions can be used. An example is a structural unit (a24') derived from an acrylate ester that includes a lactone-containing monocyclic or polycyclic group.

Examples of the structural unit (a24') include the same structural units as those exemplified above for the structural unit (a2) in the component (A) of the above-mentioned positive resist composition.

The structural unit (a24') may use either one type of structural unit, or a mixture of two or more types.

If the structural unit (a24') is included in the resin (A2'), then the amount of the structural unit (a24') within the resin (A2'), based on the combined total of all the structural units that constitute the resin (A2'), is preferably within a range from 10 to 70 mol %, more preferably from 10 to 40 mol %, and most preferably from 10 to 25 mol %. Making this amount at least as large as the lower limit of the above-mentioned range ensures that the effects obtained by including the structural unit (a24') are achieved satisfactorily, whereas by ensuring that the amount is not more than the upper limit of the above-mentioned range, a good balance can be achieved with the other structural units.

The resin (A2') is preferably a resin in which the structural units (a21') to (a23') represent the main components.

Here, the term "main components" means that the combined amount of the structural units (a21') to (a23') represents at least 50 mol %, preferably at least 70 mol %, and more preferably 80 mol % or more, of all the structural units. Resins (A2') in which this proportion is 100 mol %, namely resins (A2') composed solely of the structural unit (a21'), the structural unit (a22') and the structural unit (a23'), are the most desirable.

The weight average molecular weight (Mw, the polystyrene equivalent weight average molecular weight determined by gel permeation chromatography) of the resin (A2') is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the dispersity (Mw/Mn) is preferably within a range from 1.0 to 5.0, and more preferably from 1.0 to 2.5.

In those cases where the resin (A2') is used within the component (A'), either a single type of the resin (A2') may be used, or a mixture of two or more types may be used.

If the resin (A2') is used, then the amount of the resin (A2') within the component (A') is preferably at least 50% by weight, more preferably at least 70% by weight, still more preferably 80% by weight or greater, and is most preferably 100% by weight.

The component (A'), such as the resin (A1') or resin (A2'), can be synthesized, for example, by a method in which the monomers that give rise to each of the structural units are subjected to a radical polymerization using normal methods, such as the method disclosed in International Patent Publication 2004/076495 pamphlet.

Besides the resin (A1') and the resin (A2'), the component (A') may also use other polymer compounds typically used within conventional negative resist compositions (such as hydroxystyrene resins, novolak resins or acrylic resins or the like).

The amount of the component (A') within the negative resist composition may be adjusted in accordance with the resist film thickness that is to be formed.
[Component (B')]

There are no particular limitations on the component (B'), which may be selected appropriately from the numerous known materials used as acid generators in conventional chemically amplified resists.

Examples of the component (B') include the same acid generators as those exemplified above for the component (B) of the positive resist composition.

As the component (B'), either a single type of acid generator may be used alone, or a combination of two or more types may be used.

The amount used of the component (B') is typically within a range from 0.5 to 50 parts by weight, and preferably from 1 to 40 parts by weight, per 100 parts by weight of the component (A'). Ensuring an amount within this range is preferable, as it results in satisfactory pattern formation, enables a uniform solution to be obtained, and means favorable storage stability can be achieved.

[Optional Components]

The positive resist composition of the present invention may include a nitrogen-containing organic compound (D) (hereafter referred to as "component (D)") as an optional component.

[Component (C')]

There are no particular limitations on the component (C'), which may be selected appropriately from the various cross-linkers used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, and compounds that use glycoluril are referred to as glycoluril-based cross-linkers.

As the component (C'), at least one type of cross-linker selected from the group consisting of melamine-based cross-linkers, urea-based cross-linkers, alkylene urea-based cross-linkers and glycoluril-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino groups with hydroxymethyl groups, and compounds obtained by reacting melamine with formaldehyde and a lower alcohol, thereby substituting the hydrogen atoms of the amino groups with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino groups with hydroxymethyl groups, and compounds obtained by reacting urea with formaldehyde and a lower alcohol, thereby substituting the hydrogen atoms of the amino groups with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (c1'-1) shown below.

[Chemical Formula 45]

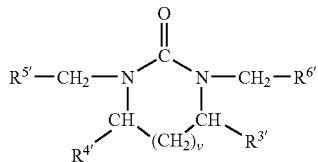

(c1'-1)

wherein $R^{5'}$ and $R^{6'}$ each independently represents a hydroxyl group or a lower alkoxy group, $R^{3'}$ and $R^{4'}$ each independently represents a hydrogen atom, a hydroxyl group or a lower alkoxy group, and v represents 0 or an integer of 1 to 2.

The lower alkoxy group for $R^{5'}$ and $R^{6'}$ may be either a linear or branched group, and is preferably an alkoxy group of 1 to 4 carbon atoms. $R^{5'}$ and $R^{6'}$ may be either the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be either the same or different, and are preferably the same.

v is either 0 or an integer from 1 to 2, and is preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (c1'-1) can be obtained by a condensation reaction between an alkylene urea and formalin, or by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, or by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

As the component (C'), one type of cross-linker may be used alone, or two or more types may be used in combination.

The amount of the component (C') is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A'). By ensuring that the amount of the component (C') is at least as large as the lower limit of the above-mentioned range, the formation of cross-linking is able to proceed satisfactorily, and a favorable resist pattern with minimal swelling is obtained. On the other hand, by ensuring that the amount is not more than the upper limit of the above-mentioned range, the storage stability of the resist coating liquid improves, and deterioration over time in the sensitivity can be suppressed.

[Optional Components]

The negative resist composition of the present invention may include a nitrogen-containing organic compound (D') (hereafter referred to as "component (D')") as an optional component.

Examples of the component (D') include the same compounds as those exemplified above in connection with the description of the component (D) of the positive resist composition.

As the component (D'), one compound may be used alone, or two or more different compounds may be used in combination.

The component (D') is typically used in an amount within a range from 0.01 to 5.0 parts by weight, relative to 100 parts by weight of the component (A'). Using an amount within this range improves the resist pattern shape and the post exposure stability of the latent image formed by the pattern-wise exposure of the resist layer.

Furthermore, in order to prevent any deterioration in sensitivity, and improve the resist pattern shape and the post exposure stability of the latent image formed by the pattern-wise exposure of the resist layer, at least one compound (E') (hereafter referred to as "component (E')") selected from the group consisting of organic carboxylic acids, phosphorus oxo acids and derivatives thereof may be added to the negative resist composition.

Examples of the component (E') include the same compounds as those exemplified above in connection with the description of the component (E) of the positive resist composition.

As the component (E'), one compound may be used alone, or two or more compounds may be used in combination.

The component (E') is typically used in an amount within a range from 0.01 to 5.0 parts by weight, relative to 100 parts by weight of the component (A').

If desired, other miscible additives may also be added to the negative resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S')]

Examples of the component (S') include the same compounds as those exemplified above in the description of the component (S) of the positive resist composition.

In the present invention, the component (S') preferably includes an organic solvent (hereafter referred to as "component ($S_2$')") which, in addition to dissolving the components of the negative resist composition, does not dissolve the first resist film.

Including the component ($S_2$') in the component (S') means that when the second chemically amplified resist composition is applied to the support with the first resist film formed thereon, the pattern shape of the first resist can be favorably maintained, enabling the second resist pattern to be formed with good stability.

In other words, in a double patterning process where a first resist pattern is formed using a positive chemically amplified resist composition, and a second chemically amplified resist composition is then coated directly onto the first resist pattern to form a second resist film, there is a possibility that the first resist pattern may be damaged when the second chemically amplified resist composition is applied. For example, the effect of the organic solvent contained within the second chemically amplified resist composition may cause a change in the shape of the resist pattern (such as a decrease in the pattern height (thickness loss)) formed in the first resist film (namely, the first resist pattern), a decrease in the width of a line pattern or dot pattern (pattern thinning), or even destruction of the first resist pattern. These problems become increasingly likely as the thickness of the first resist film is reduced, and as the dimensions of the resist pattern to be formed in the first resist film are reduced. However, by using the component ($S_2$'), any damage to the first resist pattern during the second patterning step can be avoided, and the first resist pattern shape can be favorably maintained.

The expression "does not dissolve the first resist film" means that when the first chemically amplified resist composition is applied to a support and dried under conditions at 23° C. to form a resist film having a film thickness of 0.2 µm, and this resist film is then immersed in the organic solvent, then even after 60 minutes, the resist film does not disappear, and no substantial change is observed in the film thickness (preferably, the film thickness of the resist film does not fall below 0.16 µm).

As this type of component ($S_2$'), a solvent that does not dissolve the first resist film but dissolves each of the components of the negative resist composition is preferred, and specific examples of such solvents include alcohol-based solvents, fluorine-based solvents, and ether-based organic solvents having no hydroxyl group. These solvents may be used either alone, or in mixtures of two or more different solvents. From the viewpoints of the coating properties and ensuring favorable dissolution of the materials such as the resin components, an alcohol-based solvent is preferred.

Here, an "alcohol-based solvent" describes a compound in which at least one hydrogen atom of an aliphatic hydrocarbon has been substituted with a hydroxyl group, and which is a liquid under normal temperature and normal pressure conditions.

A "fluorine-based solvent" describes a compound containing a fluorine atom that is a liquid under normal temperature and normal pressure conditions.

An "ether-based organic solvent having no hydroxyl group" describes a compound that has an ether linkage (C—O—C) within the structure, contains no hydroxyl group, and is a liquid under normal temperature and normal pressure conditions. The ether-based organic solvent having no hydroxyl group preferably not only contains no hydroxyl group, but also contains no carboxyl group.

As the alcohol-based solvent, monohydric alcohols are particularly preferred, and of these, although dependent on the number of carbon atoms, primary or secondary monohydric alcohols are preferred, and primary monohydric alcohols are the most desirable.

Here, the term "monohydric alcohol" describes a compound in which the number of hydroxyl groups incorporated within the alcohol molecule is 1, and does not include dihydric alcohols, trihydric alcohols, or derivatives thereof.

The boiling point of the alcohol-based solvent is preferably within a range from 80 to 160° C., and more preferably from 90 to 150° C., and from the viewpoints of the coating properties, the stability of the composition upon storage, and the heating temperature required in the PAB step and/or PEB step, a boiling point within a range from 100 to 135° C. is the most desirable.

Specific examples of the alcohol-based solvent include n-pentyl alcohol (boiling point: 138.0° C.), s-pentyl alcohol (boiling point: 119.3° C.), t-pentyl alcohol (boiling point: 101.8° C.), isopentyl alcohol (boiling point: 130.8° C.), isobutanol (also called isobutyl alcohol or 2-methyl-1-propanol) (boiling point: 107.9° C.), isopropyl alcohol (boiling point: 82.3° C.), 2-ethylbutanol (boiling point: 147° C.), neo-pentyl alcohol (boiling point: 114° C.), n-butanol (boiling point: 117.7° C.), s-butanol (boiling point: 99.5° C.), t-butanol (boiling point: 82.5° C.), 1-propanol (boiling point: 97.2° C.), n-hexanol (boiling point: 157.1° C.), 2-heptanol (boiling point: 160.4° C.), 3-heptanol (boiling point: 156.2° C.), 2-methyl-1-butanol (boiling point: 128.0° C.), 2-methyl-2-butanol (boiling point: 112.0° C.), and 4-methyl-2-pentanol (boiling point: 131.8° C.). Of these, isobutanol (2-methyl-1-propanol), 4-methyl-2-pentanol, and n-butanol are preferred as they yield superior effects upon addition as the component ($S^{2\prime}$). Of these, isobutanol and n-butanol are particularly desirable, and isobutanol is the most preferred.

An example of a fluorine-based solvent is perfluoro-2-butyltetrahydrofuran.

As the ether-based organic solvent having no hydroxyl group, compounds represented by general formula (s1'-1) shown below are preferred.

$$R^{40}\text{—O—}R^{41} \quad (s1\text{'-}1)$$

wherein $R^{40}$ and $R^{41}$ each independently represents a hydrocarbon group. Alternatively, $R^{40}$ and $R^{41}$ may be bonded together to form a ring. —O— represents an ether linkage.

In the above formula, examples of the hydrocarbon groups for $R^{40}$ and $R^{41}$ include alkyl groups and aryl groups, and alkyl groups are preferred. Of the various possibilities, compounds in which $R^{40}$ and $R^{41}$ are both alkyl groups are preferred, and compounds in which $R^{40}$ and $R^{41}$ represent the same alkyl group are particularly desirable.

There are no particular limitations on the alkyl groups for $R^{40}$ and $R^{41}$, and examples thereof include linear, branched or cyclic alkyl groups of 1 to 20 carbon atoms. In these alkyl groups, some or all of the hydrogen atoms may or may not be substituted with halogen atoms.

In terms of achieving favorable coating properties for the negative resist composition, the alkyl groups preferably contain from 1 to 15 carbon atoms, and more preferably 1 to 10 carbon atoms. Specific examples thereof include an ethyl group, propyl group, isopropyl group, n-butyl group, isobutyl group, n-pentyl group, isopentyl group, cyclopentyl group or hexyl group, and of these, an n-butyl group or isopentyl group is particularly preferred.

As the halogen atom that may be used for substitution of a hydrogen atom of the alkyl group, a fluorine atom is preferred.

There are no particular limitations on the aryl groups for $R^{40}$ and $R^{41}$, and examples thereof include aryl groups of 6 to 12 carbon atoms, wherein some or all of the hydrogen atoms of these aryl groups may or may not be substituted with alkyl groups, alkoxy groups or halogen atoms or the like.

In terms of enabling low-cost synthesis, an aryl group of 6 to 10 carbon atoms is preferred. Specific examples thereof include a phenyl group, benzyl group or naphthyl group.

As the alkyl group that may be used for substitution of a hydrogen atom of the aryl group, an alkyl group of 1 to 5 carbon atoms is preferred, and a methyl group, ethyl group, propyl group, n-butyl group or tert-butyl group is particularly desirable.

As the alkoxy group that may be used for substitution of a hydrogen atom of the aryl group, an alkoxy group of 1 to 5 carbon atoms is preferred, and a methoxy group or ethoxy group is particularly desirable.

As the halogen atom that may be used for substitution of a hydrogen atom of the aryl group, a fluorine atom is preferred.

Further, in the above formula, $R^{40}$ and $R^{41}$ may be bonded together to form a ring. In such a case, $R^{40}$ and $R^{41}$ each independently represents a linear or branched alkylene group (and preferably an alkylene group of 1 to 10 carbon atoms), and $R^{40}$ and $R^{41}$ are bonded together to form a ring. Further, a carbon atom within the alkylene chain may be substituted with an oxygen atom.

Specific examples of this type of ether-based organic solvent include 1,8-cineole, tetrahydrofuran and dioxane.

Furthermore, the boiling point (under normal pressure) of the ether-based organic solvent having no hydroxyl group is preferably within a range from 30 to 300° C., more preferably from 100 to 200° C., and still more preferably from 140 to 180° C. Ensuring that the boiling point is at least as high as the lower limit of the above-mentioned temperature range means the component (S') is less likely to evaporate during the spin coating used for applying the negative resist composition, thereby suppressing coating irregularities and improving the coating properties. On the other hand, by ensuring that the boiling point is not more than the upper limit of the above-mentioned range, the component (S') can be satisfactorily removed from the applied resist film during the prebake, thus improving the formability of the second resist film. Moreover, a boiling point within the above range also reduces thickness loss for the resist pattern, and improves the stability of the composition during storage. Furthermore, a boiling point within the above range is also preferred from the viewpoints of the heating temperature required within the PAB and PEB steps.

Specific examples of the ether-based organic solvent having no hydroxyl group include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethyl benzyl ether (boiling point: 189° C.), diphenyl ether (boiling point: 259° C.), dibenzyl ether (boiling point: 297° C.), phenetole (boiling point: 170° C.), butyl phenyl ether, tetrahydrofuran (boiling point: 66° C.), ethyl propyl ether (boiling point: 63° C.), diisopropyl ether (boiling point: 69° C.), dihexyl ether (boiling point: 226° C.), and dipropyl ether (boiling point: 91° C.).

As the ether-based organic solvent having no hydroxyl group, a cyclic or chain-like ether-based solvent is preferred in terms of achieving a favorable effect in reducing thickness loss of the resist pattern, and of such solvents, at least one solvent selected from the group consisting of 1,8-cineole, dibutyl ether and diisopentyl ether is particularly preferred.

As the component (S'), either a single type of solvent may be used alone, or two or more types may be used in combination.

There are no particular limitations on the amount used of the component (S'), and an amount that yields a liquid negative resist composition having a concentration that is suitable for application to the support having the first resist pattern formed thereon is normally used.

<Method of Selecting First Chemically Amplified Resist Composition and Second Chemically Amplified Resist Composition>

The first chemically amplified resist composition used in the method of forming a resist pattern according to the present invention is a positive resist composition, whereas the second chemically amplified resist composition is a negative resist composition. These compositions can be selected appropriately from the conventional chemically amplified resist compositions described above, so that the lithography conditions (such as the PEB temperature and exposure dose and the like) during the first patterning step and the second patterning step satisfy the conditions outlined above.

As described above, in the present invention, the first chemically amplified resist composition and/or the second chemically amplified resist composition are preferably selected so as to lower the value of $T_{min1}$ for the first chemically amplified resist composition or raise the value of $T_{min2}$ for the second chemically amplified resist composition, or so that $T_{min1} \leq T_{min2}$.

For example, the values of $T_{min1}$ and $T_{min2}$ required to execute the method of forming a resist pattern according to the present invention can be achieved by altering the makeup of the first chemically amplified resist composition and the second chemically amplified resist composition.

Furthermore, in the present invention, $T_{min2}$ is preferably set in accordance with the setting of $T_{min1}$, and also set so that the value of $R_{min}$ that occurs during patterning of the second resist film does not fall to 0.5 nm/second or lower.

Here, the expression "$R_{min}$ that occurs during patterning of the second resist film" describes the minimum value for the dissolution rate within an alkali developing solution of the exposed portions of the second resist film following exposure and the PEB treatment. A smaller value of $R_{min}$ indicates a lower solubility of the resist film within the alkali developing solution.

The limiting value for $R_{min}$ is dependent on the film thickness of those portions of the second resist film formed from the second chemically amplified resist composition that exist above patterned regions of the first resist pattern when the second chemically amplified resist composition is coated onto the first resist pattern formed from the first chemically amplified resist composition, and is also dependent on the resist developing method used during the second resist patterning.

To further describe the limiting value for $R_{min}$, the $R_{min}$ value for the exposed portions of a typical negative resist composition is preferably as small as possible, but in the present invention, because those portions of the second resist film that overlap the underlying first resist pattern must dissolve even in the exposed portions, the negative resist composition that forms the second resist film preferably retains a $R_{min}$ value of a certain level (the limiting value).

In the present invention, examples of the method used for measuring $R_{min}$ include the two techniques described below.
(1) Measurement method using a resist developing analyzer RDA-800, manufactured by Litho Tech Japan Corporation.

An 8-inch silicon wafer is subjected to a hydrophobic treatment by performing an HMDS treatment using a treatment temperature of 90° C. and a treatment time of 36 seconds. The resist composition is then applied to the silicon wafer using a spinner, subsequently subjected to a predetermined prebake (PAB) treatment on a hotplate, and then dried, thus forming a resist film of a certain film thickness.

Next, this first resist film is subjected to open frame exposure (exposure without using a photomask) using an ArF exposure apparatus NSR-S302 (manufactured by Nikon Corporation, NA (numerical aperture)=0.60, σ=0.60), with the exposure dose varied within a range from 0 to 100 mJ/cm$^2$.

Subsequently, a predetermined PEB treatment is performed. For the resist film on the treated wafer, the developing rate (nm/s) in a 2.38% by weight aqueous solution of tetramethylammonium hydroxide (TMAH) is determined using a resist developing analyzer RDA-800, manufactured by Litho Tech Japan Corporation.
(2) Measurement method using QCM (Quartz Microbalance)

Measurement of the developing dissolution rate of a resist film having a film thickness of several tens of nm is performed via a dissolution rate measurement using a QCM method. The resist composition is applied with a spinner to a quartz sheet having a diameter of 2 inches, is subsequently subjected to a predetermined prebake (PAB) treatment on a hotplate, and is then dried, thus forming a resist film of a certain film thickness.

Next, this first resist film is subjected to open frame exposure (exposure without using a photomask) using an ArF laser exposure apparatus VUVES-4500 (manufactured by Litho Tech Japan Corporation), with the exposure dose varied within a range from 0 to 100 mJ/cm$^2$. A predetermined PEB treatment is then performed. For the resist film on the quartz sheet, the developing rate (nm/s) in a 2.38% by weight aqueous solution of tetramethylammonium hydroxide (TMAH) is determined using a resist developing analyzer RDA-QZ3, manufactured by Litho Tech Japan Corporation.

Examples of the setting method used to ensure that $R_{min}$ does not fall to 0.5 nm/second or lower include a method in which during design of the polymer (for example, the component (A') described above) contained within the negative resist composition, the structure that is responsible for the cross-linking reaction and the structure that realizes solubility within the developing solution are set separately, and the ratio between these two structures is altered during the polymerization process, and a method in which the blend ratios of the acid generator and the cross-linker within the resist are used to regulate the solubility rate of the polymer following cross-linking.

In a specific example of altering the makeup of the first chemically amplified resist composition and the second chemically amplified resist composition in order to alter the values of $T_{min1}$ and $T_{min2}$ respectively, in the case where the positive resist composition used as the first chemically amplified resist composition includes a compound containing acid-dissociable, dissolution-inhibiting groups (for example, an aforementioned component (A) having a structural unit (a1)), and the negative resist composition used as the second chemically amplified resist composition includes compounds that exhibit cross-linking reactivity (for example, the aforementioned component (A') and component (C')), the above-mentioned acid-dissociable, dissolution-inhibiting group is selected so that the energy required for dissociation (the deprotection energy) is lower than the heat energy required for the cross-linking reaction of the negative resist composition.

This ensures that, during the second patterning step, the first resist pattern undergoes a more ready change in solubility within the alkali developing solution upon exposure than the second resist film, meaning $T_{min1}$ is lower than $T_{min2}$.

Using the structural unit (a1) as an example, the deprotection energy for the acid-dissociable, dissolution-inhibiting group in the structural unit (a1) varies depending on the structure of the acid-dissociable, dissolution-inhibiting group, and the structure by which the acid-dissociable, dissolution-inhibiting group is bonded to the side chain portion of the structural unit (a1).

Below is a description of specific structures of the acid-dissociable, dissolution-inhibiting group and the structural unit (a1), and whether or not those structures are suited to use within the first chemically amplified resist composition. However, the present invention is in no way limited by the examples presented below.

(1) A tertiary alkyl ester-type acid-dissociable, dissolution-inhibiting group that has a tertiary carbon atom within the ring structure of a polycyclic aliphatic cyclic group, and is bonded to the carboxyl group of an acrylic acid to form a tertiary alkyl ester.

Specific examples of this type of group include groups such as those shown above in formulas (1-1) and (1-3) to (1-9), wherein an alkyl group ($R^{14}$ in formulas (1-1) and (1-3) to (1-9)) is bonded to a carbon atom that constitutes part of the ring structure of the polycyclic aliphatic cyclic group, resulting in that particular carbon atom becoming a tertiary carbon atom.

This type of acid-dissociable, dissolution-inhibiting group has a comparatively high deprotection energy, and is relatively difficult to dissociate. However, this type of material is suitable for the first chemically amplified resist in those cases where, at the PEB temperature required to effect a deprotection reaction within a first chemically amplified resist formed using the material, the second chemically amplified resist exhibits an $R_{min}$ value that is sufficient to execute the process of the present invention.

(2) A tertiary alkyl ester-type acid-dissociable, dissolution-inhibiting group that has a tertiary carbon atom within the ring structure of a monocyclic aliphatic cyclic group, and is bonded to the carboxyl group of an acrylic acid to form a tertiary alkyl ester.

Specific examples of this type of group include groups such as those shown above in formula (1-2), wherein an alkyl group is bonded to a carbon atom that constitutes part of the ring structure of the monocyclic aliphatic cyclic group, resulting in that particular carbon atom becoming a tertiary carbon atom.

This type of acid-dissociable, dissolution-inhibiting group has a comparatively low deprotection energy, and dissociates relatively readily. For example, when g is 2 and $R^{14}$ represents an ethyl group in formula (1-2), the deprotection energy for the ethylcyclohexyl group is 8.1 [kcal/mol]. Accordingly, this type of acid-dissociable, dissolution-inhibiting group, and particularly groups in which the alkyl group bonded to the tertiary carbon atom is an alkyl group of 2 or more carbon atoms, is suitable for the first chemically amplified resist.

(3) A tertiary alkyl ester-type acid-dissociable, dissolution-inhibiting group that has an aliphatic cyclic group and a branched alkylene group having a tertiary carbon atom bonded to the aliphatic cyclic group, and is bonded to the carboxyl group of an acrylic acid to form a tertiary alkyl ester.

Specific examples of this type of group include groups represented by the above formulas (2-1) to (2-6).

This type of acid-dissociable, dissolution-inhibiting group has a comparatively high deprotection energy, and is relatively difficult to dissociate. However, this type of material is suitable for the first chemically amplified resist in those cases where, at the PEB temperature required to effect a deprotection reaction within a first chemically amplified resist formed using the material, the second chemically amplified resist exhibits an $R_{min}$ value that is sufficient to execute the process of the present invention.

(4) A tertiary alkyl ester-type acid-dissociable, dissolution-inhibiting group that is not bonded directly to the carboxyl group of an acrylic acid, bit is rather bonded via a linking group that includes an etheric oxygen atom.

Specific examples of this type of group include X' in the above formula (a1-3).

In those cases where the linking group within this type of acid-dissociable, dissolution-inhibiting group includes an etheric oxygen atom (for example, cases where $Y^2$ in formula (a1-3) is a group represented by A—O—B or a group represented by -A-C(=O)—O—B—), the deprotection energy is comparatively low, and the group dissociates relatively readily. Accordingly, this type of acid-dissociable, dissolution-inhibiting group is suitable for the first chemically amplified resist.

(5) An aliphatic branched tertiary alkyl ester-type acid-dissociable, dissolution-inhibiting group.

Specific examples of this type of group include aliphatic branched acid-dissociable, dissolution-inhibiting groups such as those represented by the above-mentioned formula —C($R^{71}$)($R^{72}$)($R^{73}$).

This type of acid-dissociable, dissolution-inhibiting group has a comparatively high deprotection energy, and is relatively difficult to dissociate. However, this type of material is suitable for the first chemically amplified resist in those cases where, at the PEB temperature required to effect a deprotection reaction within a first chemically amplified resist formed using the material, the second chemically amplified resist exhibits an $R_{min}$ value that is sufficient to execute the process of the present invention.

(6) An acetal-type acid-dissociable, dissolution-inhibiting group.

Acetal-type acid-dissociable, dissolution-inhibiting group have a comparatively low deprotection energy, and dissociate relatively readily.

For example, the deprotection energy for an adamantoxymethyl group is 8.4 [kcal/mol]. Accordingly, this type of acid-dissociable, dissolution-inhibiting group is suitable for the first chemically amplified resist.

(7) A polyfunctional acid-dissociable, dissolution-inhibiting group.

Examples of polyfunctional acid-dissociable, dissolution-inhibiting groups include the groups disclosed in Japanese Unexamined Patent Application, First Publication No. 2005-325325 (namely, groups represented by a general formula: R—[O—CH$_2$]$_n$—, wherein R represents an organic group of not more than 20 carbon atoms having a valency of n or higher, and n represents an integer of 2 to 5).

Polyfunctional acid-dissociable, dissolution-inhibiting groups have a comparatively low deprotection energy, and dissociate relatively readily. Accordingly, they are suitable for the first chemically amplified resist.

The deprotection energy of an acid-dissociable, dissolution-inhibiting group can be determined from the results of an analytical method including steps 1 to 4 listed below.

Step 1: Prepare the resist composition using a polymer containing the specified introduced protective groups.

Step 2: Form a resist film using the resist composition prepared in step 1, and conduct full surface exposure. Set the exposure dose to the same value as the optimum exposure dose (Eop) during resist patterning.

Step 3: Perform an analysis of the deprotection reaction within the exposed resist film using a deprotection reaction analyzer (PAGA-100) manufactured by Litho Tech Japan Corporation (this analyzer is able to confirm structural changes within the resist composition during the PEB treatment by acquiring IR spectra of the resist film while the PEB treatment is being conducted).

Step 4: Collect data for a plurality of different PEB temperatures, and perform analysis.

Furthermore, the value of $T_{min2}$ can also be set at a level equal to, or higher than, $T_{min1}$ by using an acid generator that generates a comparatively weak acid as the acid generator component of the first chemically amplified resist composition, and using an acid generator that generates a comparatively strong acid as the acid generator component of the second chemically amplified resist composition.

A description of what type of acid generator is suited to use within the first chemically amplified resist composition and the second chemically amplified resist composition is presented below, using the examples of onium salt-based acid generators. However, the effect of the acid generator on the effective PEB temperature is less than the effect imparted by the acid-dissociable, dissolution-inhibiting group, and therefore the present invention is not limited to the examples presented below.

(1) An onium salt-based acid generator having an anion moiety represented by the above formula $R^{4''}$—$SO_3$—, wherein a fluorine atom is bonded to the carbon atom adjacent to the sulfur atom of $SO_3$— (for example, an acid generator in which $R^{4''}$ represents a perfluoroalkyl group).

This type of acid generator generates a comparatively strong acid, and is therefore suited to use within the second chemically amplified resist.

However, this type of acid generator may also be used in the first chemically amplified resist. In particular, onium salt-based acid generators having an anion moiety represented by formulas (b1) to (b7) are also suitable for use within the first chemically amplified resist.

(2) An onium salt-based acid generator having an anion moiety represented by the above formula $R^{4''}$—$SO_3$, wherein $R^{4''}$ includes a fluorine atom, but a fluorine atom is not bonded to the carbon atom adjacent to the sulfur atom of $SO_3$—.

(3) An onium salt-based acid generator having an anion moiety represented by the above formula $R^{4''}$—$SO_3$—, wherein $R^{4''}$ is an alkyl group.

(4) An onium salt-based acid generator having an anion moiety represented by the above formula (b-3) or (b-4).

These types of acid generators can be used in either of the chemically amplified resists.

EXAMPLES

The present invention is described below using a series of examples, although the scope of the present invention is in no way limited by these examples.

Preparation Examples of First Chemically Amplified Resist Compositions

Positive Resist Compositions

The components listed below in Table 1 were mixed together and dissolved, thereby preparing a series of first chemically amplified resist compositions (positive resist compositions).

The abbreviations used in Table 1 have the meanings shown below. The numerical values within the brackets [ ] represent blend amounts (parts by weight).

(A)-1: A copolymer represented by a chemical formula (A)-1 shown below, having a weight average molecular weight (Mw) of 7,000 and a dispersity of 1.7. In the formula, the symbol to the bottom right of the parentheses indicates the proportion (mol %) of that particular structural unit within the copolymer, wherein a1:a2:a3=45:35:20.

(A)-2: A copolymer represented by a chemical formula (A)-2 shown below, having a weight average molecular weight (Mw) of 7,000 and a dispersity of 1.7. In the formula, the symbol to the bottom right of the parentheses indicates the proportion (mol %) of that particular structural unit within the copolymer, wherein a1:a2:a3=35:45:20.

(A)-3: A copolymer represented by a chemical formula (A)-3 shown below, having a weight average molecular weight (Mw) of 7,000 and a dispersity of 1.7. In the formula, the symbol to the bottom right of the parentheses indicates the proportion (mol %) of that particular structural unit within the copolymer, wherein a1:a2:a3=40:40:20.

(B)-1: (4-methylphenyl)diphenylsulfonium nonafluoro-n-butanesulfonate
(D)-1: tri-n-pentylamine
(E)-1: salicylic acid
(S)-1: γ-butyrolactone
(S)-2: a mixed solvent of PGMEA and PGME (PGMEA:PGME=6:4 (weight ratio))

[Chemical Formula 46]

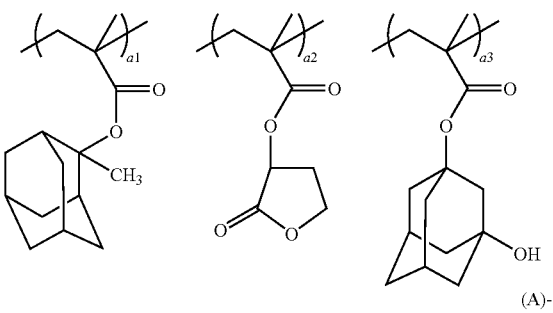

(A)-1

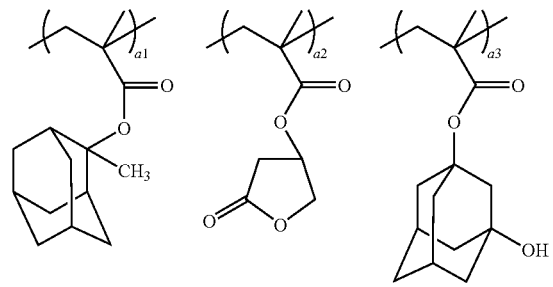

(A)-2

TABLE 1

| First chemically amplified resist composition | Component (A) | Component (B) | Component (D) | Component (E) | Component (S) | |
|---|---|---|---|---|---|---|
| 1-1 | (A)-1 [100] | (B)-1 [8.0] | (D)-1 [1.20] | (E)-1 [1.32] | (S)-1 [10] | (S)-2 [3900] |
| 1-2 | (A)-2 [100] | (B)-1 [8.0] | (D)-1 [1.20] | (E)-1 [1.40] | (S)-1 [10] | (S)-2 [3900] |
| 1-3 | (A)-3 [100] | (B)-1 [8.0] | (D)-1 [1.20] | (E)-1 [1.35] | (S)-1 [10] | (S)-2 [3900] |

-continued

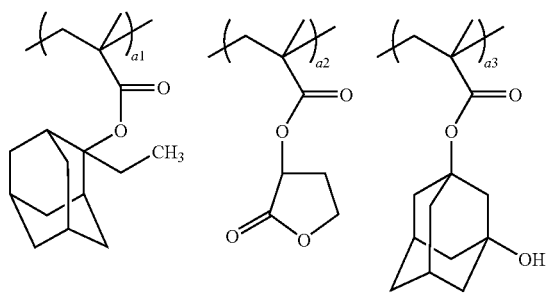

(A)-3 exhibited sufficient solubility to enable the resist to be dissolved and removed by a developing treatment in a 2.38% by weight aqueous solution of TMAH (23° C.).

In a similar manner, confirmation of the temperatures at which the first chemically amplified resist compositions [1-2] and [1-3] exhibited sufficient solubility to enable dissolution and removal of the resist revealed a result of 100° C. or higher for the first chemically amplified resist composition [1-2], and a result of 80° C. or higher for the first chemically amplified resist composition [1-3].

Preparation Examples of Second Chemically Amplified Resist Compositions

The components listed below in Table 2 were mixed together and dissolved, thereby preparing a series of second chemically amplified resist compositions.

TABLE 2

| Second chemically amplified resist composition | Component (A) | Component (B) | Component (C) | Component (D) | Component (E) | Component (S) |
| --- | --- | --- | --- | --- | --- | --- |
| Negative composition 2-1 | (A')-1 [100] | (B')-1 [21.0] | (C')-1 [11.0] | (D')-1 [0.40] | (E')-1 [0.10] | (S)-3 [3000] |
| (comparative) positive composition 2-1 | (A)-4 [100] | (B)-2 [15.0] | — | (D)-2 [0.35] | — | (S)-3 [3000] |

Test Example 1

Using the first chemically amplified resist composition [1-1] described above, the following evaluations were performed.

An 8-inch silicon wafer was subjected to a hydrophobic treatment by performing an HMDS treatment using a treatment temperature of 90° C. and a treatment time of 36 seconds.

The above first chemically amplified resist composition [1-1] was then applied to the silicon wafer using a spinner, was subsequently subjected to a prebake (PAB) treatment at 110° C. for 60 seconds on a hotplate, and was then dried, thus forming a resist film (first resist film) having a film thickness of 100 nm.

Next, this first resist film was subjected to open frame exposure (exposure without using a photomask) using an ArF exposure apparatus NSR-S302 (manufactured by Nikon Corporation, NA (numerical aperture)=0.60, σ=0.60), with the exposure dose varied within a range from 0 to 100 mJ/cm².

Subsequently, a PEB treatment was performed at a predetermined PEB temperature (85° C., 90° C., 95° C., 100° C. or 110° C.) for a period of 60 seconds. For the resulting resist film on the treated wafer, the dissolution rate (nm/s) in a 2.38% by weight aqueous solution of tetramethylammonium hydroxide (TMAH) at 23° C. was determined using a resist developing analyzer RDA-800, manufactured by Litho Tech Japan Corporation.

Then, with the exposure dose plotted along the horizontal axis and the dissolution rate plotted along the vertical axis, a dissolution rate curve for the first resist film within the developing solution was prepared for the PEB treatment at each of the PEB temperatures. The results are shown in FIG. 4.

Figure 4:
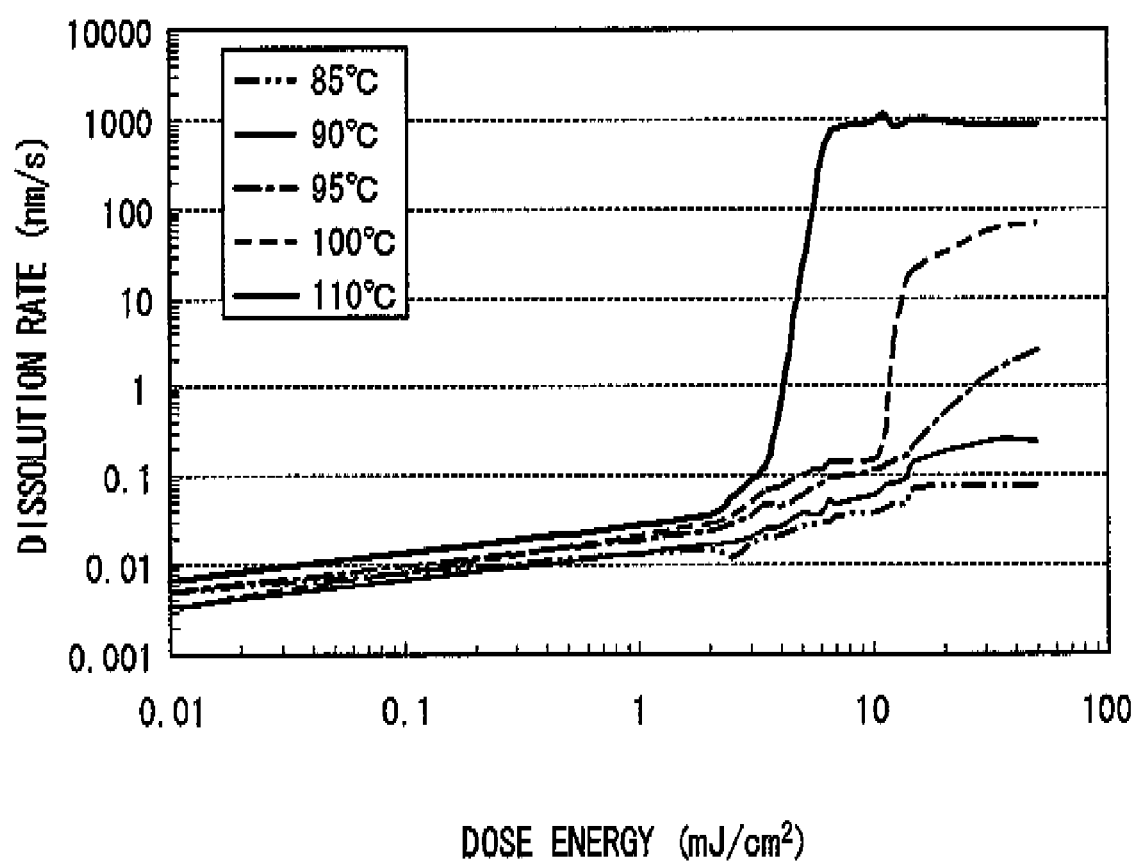
FIG. 4 is a graph illustrating the results of a test example 1.
Figure 5A:
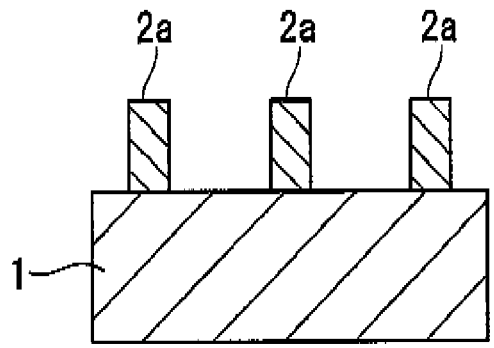
FIG. 5A through FIG. 5D are schematic process diagrams describing a second patterning step in a comparative example 2.
Figure 5B:
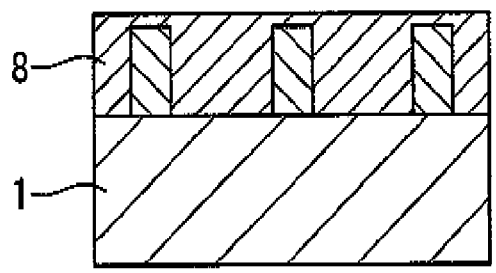
Figure 5C:
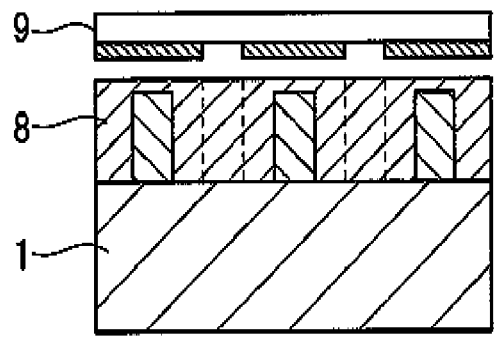
Figure 5D:
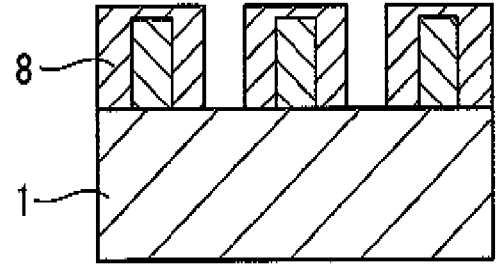

The results in FIG. 4 confirmed that for PEB temperatures of 90° C. or lower, the positive resist composition [1-1] exhibited little increase in the dissolution rate even when the exposure dose was increased, with the dissolution rate becoming saturated at a value lower than 1 nm/s. On the other hand, when the PEB temperature was 100° C. or higher, a dramatic increase in the dissolution rate was observed when the exposure dose exceeded a certain value.

From these results it was evident that in the case of the first chemically amplified resist composition [1-1], provided the PEB temperature was 100° C. or higher, the first resist film The abbreviations used in Table 2 have the meanings shown below. The numerical values within the brackets [ ] represent blend amounts (parts by weight).

(A')-1: A copolymer represented by a chemical formula (A')-1 shown below [Mw: 4,700, dispersity: 1.48, manufactured by Promerus, LLC]. In the formula, the numerical value to the bottom right of the parentheses indicates the proportion (mol %) of that particular structural unit within the copolymer.

(A)-4: A copolymer represented by a chemical formula (A)-4 shown below [Mw: 7,000, dispersity: 1.5]. In the formula, the numerical value to the bottom right of the parentheses indicates the proportion (mol %) of that particular structural unit within the copolymer.

(B')-1: triphenylsulfonium heptafluoro-n-propanesulfonate (B)-2: a compound represented by formula (B)-2 shown below.

(C')-1: tetraethoxymethylated glycoluril E-9401 (a product name, manufactured by Sanwa Chemical Co., Ltd.)

(D')-1: triisopropanolamine (D)-2: triethanolamine (E')-1: malonic acid (S)-3: isobutanol

[Chemical Formula 47]

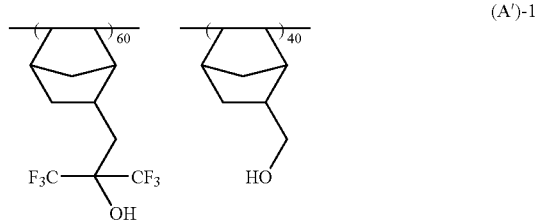

(A')-1

-continued

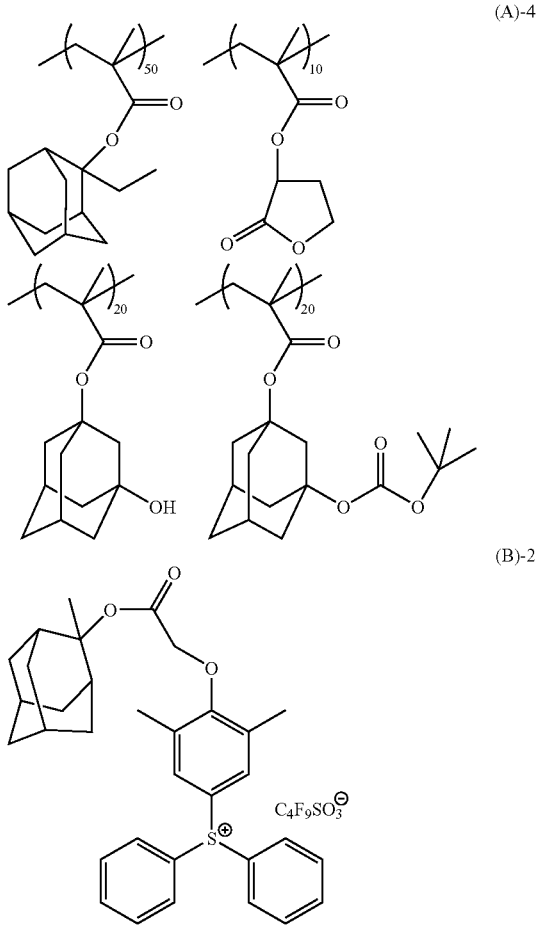

Example 1

First, an organic antireflective film composition ARC29 (a product name, manufactured by Brewer Science Ltd.) was applied onto an 8-inch silicon wafer using a spinner, and the composition was then baked and dried on a hotplate at 205° C. for 60 seconds, thereby forming an organic antireflective film having a film thickness of 82 nm.

The above-mentioned first chemically amplified resist composition [1-1] was applied onto the antireflective film using a spinner, and was then subjected to a prebake (PAB) treatment and drying on a hotplate at 110° C. for 60 seconds, thereby forming a resist film (the first resist film) having a film thickness of 100 nm. Thereafter, using an ArF exposure apparatus NSR-S306C (manufactured by Nikon Corporation, NA=0.78), the first resist film was selectively exposed with an ArF excimer laser (193 nm) through a mask pattern. A post exposure bake (PEB) treatment was then conducted under the conditions detailed in Table 3, the first resist film was subjected to alkali developing for 30 seconds at 23° C. in a 2.38% by weight aqueous solution of tetramethylammonium hydroxide (TMAH), and the resist film was then rinsed for 30 seconds with pure water and shaken dry. This completed formation of a line and space (1:3) resist pattern having a line width of 60 nm and a pitch of 240 nm (hereafter a line and space resist pattern is frequently referred to as an "L/pattern").

Subsequently, a spinner was used to apply the above-mentioned second chemically amplified resist composition [negative composition 2-1] to the support having the above L/S pattern formed thereon, and the composition was then subjected to a prebake (PAB) treatment and drying on a hotplate at 80° C. for 60 seconds, thereby forming a resist film (the second resist film) having a film thickness of 80 nm. Thereafter, using an ArF exposure apparatus NSR-S306C (manufactured by Nikon Corporation, NA=0.78), the second resist film was selectively exposed with an ArF excimer laser (193 nm) through a mask pattern that targeted the formation of a space and line (1:3) resist pattern having a space width of 60 nm and a pitch of 240 nm. A PEB treatment was then conducted under the conditions detailed in Table 3, developing was conducted for 30 seconds at 23° C. in a 2.38% by weight aqueous solution of tetramethylammonium hydroxide (TMAH), and the structure was then rinsed for 30 seconds with pure water and shaken dry.

As a result of the above method of forming a resist pattern employing double patterning and a pattern inversion technique, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine space and line (1:1) resist pattern having a space width of approximately 60 nm and a pitch of approximately 120 nm (hereafter a space and line resist pattern is frequently referred to as an "S/L pattern") was formed on the support.

Example 2

With the exception of altering the PEB conditions for the second resist film to the conditions detailed in Table 3, operations were performed in the same manner as example 1.

As a result, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine S/L pattern having a space width of approximately 60 nm and a pitch of approximately 120 nm was formed on the support.

Example 3

With the exception of altering the first chemically amplified resist composition to the composition [1-2], operations were performed in the same manner as example 1.

As a result, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine S/L pattern having a space width of approximately 60 nm and a pitch of approximately 120 nm was formed on the support.

Example 4

With the exceptions of altering the first chemically amplified resist composition to the composition [1-2], and altering the PEB conditions for the second resist film to the conditions detailed in Table 3, operations were performed in the same manner as example 1.

As a result, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine S/L pattern having a space width of approximately 60 nm and a pitch of approximately 120 nm was formed on the support.

Example 5

With the exceptions of altering the first chemically amplified resist composition to the composition [1-3], and altering the PEB conditions for the second resist film to the conditions detailed in Table 3, operations were performed in the same manner as example 1.

As a result, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine S/L pattern having a space width of approximately 60 nm and a pitch of approximately 120 nm was formed on the support.

Example 6

With the exception of altering the PEB conditions to the conditions detailed in Table 3, operations were performed in the same manner as example 5.

As a result, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine S/L pattern having a space width of approximately 60 nm and a pitch of approximately 120 nm was formed on the support.

Example 7

With the exception of altering the PEB conditions to the conditions detailed in Table 3, operations were performed in the same manner as example 5.

As a result, spaces (width: 60 nm) derived from the second resist film were formed between the lines of the L/S pattern formed in the first resist film, while the L/S pattern formed in the first resist film was dissolved as a result of the exposure and developing performed on the second resist film, meaning that finally, a very fine S/L pattern having a space width of approximately 60 nm and a pitch of approximately 120 nm was formed on the support.

Example 8

Formation of Isolated Space Pattern

First, an organic antireflective film composition ARC29 (a product name, manufactured by Brewer Science Ltd.) was applied onto an 8-inch silicon wafer using a spinner, and the composition was then baked and dried on a hotplate at 205° C. for 60 seconds, thereby forming an organic antireflective film having a film thickness of 82 nm.

The above-mentioned first chemically amplified resist composition [1-1] used for forming the first resist film was applied onto the antireflective film using a spinner, and was then subjected to a prebake (PAB) treatment and drying on a hotplate at 110° C. for 60 seconds, thereby forming a resist film (the first resist film) having a film thickness of 100 nm. Thereafter, using an ArF exposure apparatus NSR-S306C (manufactured by Nikon Corporation, NA=0.78), the first resist film was selectively exposed with an ArF excimer laser (193 nm) through a mask pattern. A post exposure bake (PEB) treatment was then conducted under the conditions detailed in Table 3, the first resist film was subjected to alkali developing for 30 seconds at 30° C. in a 2.38% by weight aqueous solution of tetramethylammonium hydroxide (TMAH), and the resist film was then rinsed for 30 seconds with pure water and shaken dry. This completed formation of a line and space (1:7) resist pattern having a line width of 60 nm and a pitch of 480 nm (hereafter referred to as "the L/pattern").

Subsequently, a spinner was used to apply the above-mentioned second chemically amplified resist composition [negative composition 2-1] to the support having the above L/S pattern formed thereon, and the composition was then subjected to a prebake (PAB) treatment and drying on a hotplate at 80° C. for 60 seconds, thereby forming a resist film (the second resist film) having a film thickness of 80 nm. Thereafter, using an ArF exposure apparatus NSR-S306C (manufactured by Nikon Corporation, NA=0.78), the second resist film was subjected to full surface exposure with an ArF excimer laser (193 nm) through a mask pattern. A PEB treatment was then conducted under the conditions detailed in Table 3, developing was conducted for 30 seconds at 23° C. in a 2.38% by weight aqueous solution of tetramethylammonium hydroxide (TMAH), and the structure was then rinsed for 30 seconds with pure water and shaken dry.

As a result, the lines of the L/S pattern formed in the first resist film were dissolved as a result of the exposure and developing performed on the second resist film, meaning that finally, an isolated space pattern having a space width of approximately 60 nm and a pitch of approximately 480 nm was formed on the support.

Example 9

Formation of Isolated Hole Pattern

With the exception of forming a dot pattern (1:9) having a dot diameter of 100 nm and a pitch of 1,000 nm in the first resist film formed using the above-mentioned first chemically amplified resist composition [1-1], operations were performed in the same manner as example 8.

As a result, the dot pattern formed in the first resist film was dissolved as a result of the exposure and developing performed on the second resist film, meaning that finally, an isolated hole pattern having a hole diameter of 100 nm and a pitch of 1,000 nm was formed on the support.

Comparative Example 1

Positive/Positive

With the exceptions of using the composition [positive composition 2-1] as the second chemically amplified resist composition, and altering the PEB conditions to the conditions detailed in Table 3, operations were performed in the same manner as example 1.

As a result, at a PEB temperature of 110° C., once developing of the second resist film was completed, the L/S pattern formed in the first resist film had disappeared, meaning that the final pattern formed on the support was composed only of the L/S pattern (1:3) having a line width of 60 nm and a pitch of 240 nm formed in the second resist film.

Comparative Example 2

Positive/Positive

With the exceptions of using the composition [positive composition 2-1] as the second chemically amplified resist composition, altering the PEB conditions to the conditions detailed in Table 3, altering the targeted resist pattern for formation within the first resist film to an L/S pattern (1:3) having a line width of 80 nm and a pitch of 320 nm, and altering the targeted resist pattern for formation within the second resist film to an S/L pattern (1:3) having a space width of 80 nm and a pitch of 320 nm, an L/S pattern was obtained in the same manner as example 1.

As a result, the final pattern formed on the support was composed only of the S/L pattern (1:3) having a space width of 80 nm and a pitch of 320 nm derived from the second resist film.

In other words, as illustrated in FIG. 5, in those cases where the above type of pattern formation is conducted using a positive resist composition as the second chemically amplified resist composition, during the second patterning step, a second resist film 8 is subjected to exposure through a photomask 9 to form a space pattern, but at this time, the portions of the second resist film 8 that overlap the first resist pattern 2a correspond with unexposed portions, meaning no light energy is irradiated onto the first resist pattern 2a. Accordingly, the first resist pattern 2a does not develop solubility in the developing solution, and even when developing is performed, a space pattern generated by image inversion of the first resist pattern 2a is not formed.

Comparative Example 3

Positive/Negative

With the exceptions of altering the PEB conditions for the second resist film to the conditions detailed in Table 3, operations were performed in the same manner as example 1.

As a result, although spaces (width: 60 nm) derived from the second resist film were formed between the lines of the L/S pattern formed in the first resist film, the L/S pattern formed in the first resist film did not dissolve, meaning the targeted S/L pattern having a space width of approximately 60 nm and a pitch of approximately 120 nm was not formed (the final pattern was an S/L pattern having a space width of approximately 60 nm and a pitch of approximately 240 nm).

TABLE 3

| | | First resist pattern formation | | | | Second resist pattern formation | | | |
|---|---|---|---|---|---|---|---|---|---|
| | | | Eop | PEB | | | Eop | PEB | |
| | Resist | | (mJ/cm$^2$) | (° C.) | (seconds) | Resist | (mJ/cm$^2$) | (° C.) | (seconds) |
| Example 1 | 1-1 | | 35.0 | 110 | 60 | Negative 2-1 | 31.0 | 110 | 60 |
| Example 2 | 1-1 | | 35.0 | 110 | 60 | Negative 2-1 | 37.0 | 100 | 60 |
| Example 3 | 1-2 | | 32.5 | 110 | 60 | Negative 2-1 | 31.0 | 110 | 60 |
| Example 4 | 1-2 | | 32.5 | 110 | 60 | Negative 2-1 | 37.0 | 100 | 60 |
| Example 5 | 1-3 | | 36.0 | 90 | 60 | Negative 2-1 | 31.0 | 110 | 60 |
| Example 6 | 1-3 | | 36.0 | 90 | 60 | Negative 2-1 | 37.0 | 100 | 60 |
| Example 7 | 1-3 | | 36.0 | 90 | 60 | Negative 2-1 | 45.0 | 90 | 60 |
| Example 8 | 1-1 | | 32.5 | 110 | 60 | Negative 2-1 | 31.0 | 110 | 60 |
| Example 9 | 1-1 | | 26.0 | 110 | 60 | Negative 2-1 | 31.0 | 110 | 60 |
| Comparative example 1 | 1-1 | | 35.0 | 110 | 60 | Positive 2-1 | 25.0 | 110 | 60 |
| Comparative example 2 | 1-1 | | 35.0 | 110 | 60 | Positive 2-1 | 25.0 | 110 | 60 |
| Comparative example 3 | 1-1 | | 35.0 | 110 | 60 | Negative 2-1 | 31.0 | 80 | 60 |

What is claimed is:

1. A method of forming a resist pattern, comprising:
applying a positive chemically amplified resist composition to a support to form a first resist film, exposing a region on a portion of said first resist film, performing a post exposure bake treatment, and then performing developing to form a first resist pattern, and
applying a negative chemically amplified resist composition to said support having said first resist pattern formed thereon, thereby forming a second resist film, exposing a region of said second resist film that includes a position in which said first resist pattern has been formed, performing a post exposure bake treatment at a bake temperature that increases solubility of said first resist film in an alkali developing solution and decreases solubility of said second resist film in an alkali developing solution, and then performing developing to simultaneously remove unexposed portions of the second resist film and the first resist pattern within the exposed portions of the second resist film to form a resist pattern.

2. A method of forming a resist pattern according to claim 1, wherein said first resist pattern comprises a line pattern and/or a dot pattern.

3. A method of forming a resist pattern according to claim 1, wherein said negative chemically amplified resist composition comprises an organic solvent that does not dissolve said first resist film.

4. A method of forming a resist pattern according to claim 3, wherein said organic solvent that does not dissolve said first resist film is at least one solvent selected from the group consisting of alcohol-based solvents, fluorine-based solvents, and ether-based organic solvents having no hydroxyl group.

* * * * *